United States Patent
Nagasaka et al.

(10) Patent No.: US 9,411,247 B2
(45) Date of Patent: Aug. 9, 2016

(54) EXPOSURE APPARATUS, EXPOSURE METHOD, AND METHOD FOR PRODUCING DEVICE

(71) Applicant: NIKON CORPORATION, Tokyo (JP)

(72) Inventors: Hiroyuki Nagasaka, Kumagaya (JP); Minoru Onda, Ageo (JP)

(73) Assignee: NIKON CORPORATION, Tokyo (JP)

( * ) Notice: Subject to any disclaimer, the term of this patent is extended or adjusted under 35 U.S.C. 154(b) by 104 days.

(21) Appl. No.: 14/057,627

(22) Filed: Oct. 18, 2013

(65) Prior Publication Data
US 2014/0043593 A1 Feb. 13, 2014

Related U.S. Application Data

(62) Division of application No. 11/628,607, filed as application No. PCT/JP2005/010484 on Jun. 8, 2005, now abandoned.

(30) Foreign Application Priority Data

Jun. 10, 2004 (JP) ................................. 2004-172568

(51) Int. Cl.
G03B 27/52 (2006.01)
G03B 27/68 (2006.01)
(Continued)

(52) U.S. Cl.
CPC ........ *G03F 7/70341* (2013.01); *G03F 7/70916* (2013.01)

(58) Field of Classification Search
CPC ............ G03F 7/20341; G03F 7/70341; G03F 7/70916; G03F 7/70825; G03F 7/70833

USPC .......... 355/30, 52, 53, 55, 62–71, 72, 73, 77; 250/492.1, 492.2, 492.22, 493.1, 548; 430/5, 8, 22, 30, 311, 312
See application file for complete search history.

(56) References Cited

U.S. PATENT DOCUMENTS 3,648,587 A 3/1972 Stevens
4,346,164 A 8/1982 Tabarelli et al.
(Continued)

FOREIGN PATENT DOCUMENTS

CN 1501175 A 6/2004
DE DD 221 563 A1 4/1985
(Continued)

OTHER PUBLICATIONS

English translation of DD 221563, published Apr. 24, 1985.*
(Continued)

*Primary Examiner* — Christina Riddle
(74) *Attorney, Agent, or Firm* — Oliff PLC

(57) ABSTRACT

A liquid immersion exposure apparatus includes a nozzle member having a recovery port and an opening via which an exposure beam passes. A projection system includes a first element closest to an image surface and a second element which is second closest to the image surface. The first element has a first surface facing the image surface, a second surface facing a lower surface of the second element, an inclined outer surface extending upwardly and radially outwardly from the first surface and facing an inner surface of the nozzle member, and a flange portion provided above the inclined outer surface. A support member supports the flange portion of the first element. A substrate stage has a holder for holding a substrate to be exposed and moves the substrate below and relative to the nozzle member and the projection system.

29 Claims, 15 Drawing Sheets

(51) Int. Cl.
*G03B 27/54* (2006.01)
*G03F 7/20* (2006.01)
*G03B 27/42* (2006.01)

(56) References Cited

U.S. PATENT DOCUMENTS

| | | | |
|---|---|---|---|
| 4,480,910 | A | 11/1984 | Takanashi et al. |
| 5,528,118 | A | 6/1996 | Lee |
| 5,610,683 | A | 3/1997 | Takahashi |
| 5,623,853 | A | 4/1997 | Novak et al. |
| 5,715,039 | A | 2/1998 | Fukuda et al. |
| 5,825,043 | A | 10/1998 | Suwa |
| 5,874,820 | A | 2/1999 | Lee |
| 5,969,441 | A | 10/1999 | Loopstra et al. |
| 6,208,407 | B1 | 3/2001 | Loopstra |
| 6,341,007 | B1 | 1/2002 | Nishi et al. |
| 6,400,441 | B1 | 6/2002 | Nishi et al. |
| 6,549,269 | B1 | 4/2003 | Nishi et al. |
| 6,590,634 | B1 | 7/2003 | Nishi et al. |
| 6,674,510 | B1 | 1/2004 | Jasper et al. |
| 6,778,257 | B2 | 8/2004 | Bleeker et al. |
| 6,809,794 | B1 | 10/2004 | Sewell |
| 7,053,983 | B2 | 5/2006 | Tokita |
| 7,199,858 | B2 | 4/2007 | Lof et al. |
| 7,593,092 | B2 | 9/2009 | Lof et al. |
| 2003/0169407 | A1 | 9/2003 | Hasegawa et al. |
| 2003/0174408 | A1* | 9/2003 | Rostalski ............ G02B 13/143 359/642 |
| 2004/0075895 | A1 | 4/2004 | Lin |
| 2004/0109237 | A1* | 6/2004 | Epple ................ G03F 7/70258 359/649 |
| 2004/0114117 | A1 | 6/2004 | Bleeker |
| 2004/0125351 | A1 | 7/2004 | Krautschik |
| 2004/0165159 | A1 | 8/2004 | Lof et al. |
| 2004/0207824 | A1 | 10/2004 | Lof et al. |
| 2005/0068499 | A1 | 3/2005 | Dodoc et al. |
| 2005/0094116 | A1 | 5/2005 | Flagello et al. |
| 2005/0094119 | A1 | 5/2005 | Loopstra et al. |
| 2005/0110973 | A1 | 5/2005 | Streefkerk et al. |
| 2005/0151942 | A1 | 7/2005 | Kawashima |
| 2005/0200815 | A1 | 9/2005 | Akamatsu |
| 2005/0213066 | A1 | 9/2005 | Sumiyoshi |
| 2005/0237501 | A1 | 10/2005 | Furukawa et al. |
| 2005/0280791 | A1 | 12/2005 | Nagasaka et al. |
| 2005/0286030 | A1 | 12/2005 | Shih et al. |
| 2006/0023183 | A1 | 2/2006 | Novak et al. |
| 2006/0038968 | A1 | 2/2006 | Kemper et al. |
| 2006/0103817 | A1 | 5/2006 | Ten Kate et al. |
| 2006/0164616 | A1 | 7/2006 | Okada |
| 2006/0176456 | A1 | 8/2006 | Nagasaka et al. |
| 2006/0209278 | A1* | 9/2006 | Kiuchi .................. G02B 7/021 355/53 |
| 2006/0231206 | A1 | 10/2006 | Nagasaka et al. |
| 2006/0291060 | A1 | 12/2006 | Shirai et al. |
| 2007/0103661 | A1 | 5/2007 | Nishii |
| 2007/0216889 | A1 | 9/2007 | Nishii |
| 2007/0222959 | A1 | 9/2007 | Nagasaka et al. |

FOREIGN PATENT DOCUMENTS

| | | |
|---|---|---|
| DE | DD 224 448 A1 | 7/1985 |
| EP | 1 041 357 A1 | 10/2000 |
| EP | 1 420 298 A2 | 5/2004 |
| EP | 1 420 302 A1 | 5/2004 |
| EP | 1 429 188 A2 | 6/2004 |
| EP | 1 703 548 A1 | 9/2006 |
| JP | A-57-117238 | 7/1982 |
| JP | A 58-202448 | 11/1983 |
| JP | A 59-19912 | 2/1984 |
| JP | A 62-65326 | 3/1987 |
| JP | A 63-157419 | 6/1988 |
| JP | A-4-65603 | 3/1992 |
| JP | A 4-305915 | 10/1992 |
| JP | A 4-305917 | 10/1992 |
| JP | A 5-62877 | 3/1993 |
| JP | A-6-53120 | 2/1994 |
| JP | A 6-124873 | 5/1994 |
| JP | A-6-188169 | 7/1994 |
| JP | A-7-176468 | 7/1995 |
| JP | A 7-220990 | 8/1995 |
| JP | A-8-166475 | 6/1996 |
| JP | A 8-316125 | 11/1996 |
| JP | A-8-330224 | 12/1996 |
| JP | A-10-163099 | 6/1998 |
| JP | A-10-214783 | 8/1998 |
| JP | A 10-303114 | 11/1998 |
| JP | A 10-340846 | 12/1998 |
| JP | A-11-16816 | 1/1999 |
| JP | A 11-176727 | 7/1999 |
| JP | A 11-260686 | 9/1999 |
| JP | A 2000-58436 | 2/2000 |
| JP | A-2000-505958 | 5/2000 |
| JP | A-2002-14005 | 1/2002 |
| JP | A 2004-289127 | 10/2004 |
| JP | A 2005-93997 | 4/2005 |
| JP | A 2005-191381 | 7/2005 |
| WO | WO 99/49504 | 9/1999 |
| WO | WO 01/35168 A1 | 5/2001 |
| WO | WO 2004/019128 A2 | 3/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/086468 A1 | 10/2004 |
| WO | WO 2004/090634 A2 | 10/2004 |
| WO | WO 2004/092833 A2 | 10/2004 |
| WO | WO 2005/006415 A1 | 1/2005 |
| WO | WO 2005006417 A1 * | 1/2005 ............ G02B 7/021 |
| WO | WO 2005/020298 A1 | 3/2005 |
| WO | WO 2005/024517 A2 | 3/2005 |
| WO | WO 2005/029559 A1 | 3/2005 |
| WO | WO 2005/031823 A1 | 4/2005 |
| WO | WO 2005/067013 A1 | 7/2005 |

OTHER PUBLICATIONS

Sep. 18, 2009 Office Action in U.S. Appl. No. 11/628,507.
Oct. 4, 2005 International Search Report in Application No. PCT/JP2005/010484 (with translation).
Dec. 10, 2007 Supplementary European Search Report in European Application No. 05748985.8.
Mar. 14, 2008 Office Action in European Application No. 05748985.8.
Mar. 17, 2008 Written Opinion in Singapore Application No. 200608522-9.
Nov. 18, 2008 Office Action in Singapore Application No. 200608522-9.
Jun. 17, 2010 Office Action issued in U.S. Appl. No. 11/628,507.
Aug. 25, 2010 Israeli Office Action from Israeli Application No. 179936, with translation.
Jun. 27, 2008 Office Action issued in Chinese Patent Application No. 2005800231607 with English translation.
Jun. 19, 2009 Office Action issued in Chinese Patent Application No. 2005800231607 with English translation.
Mar. 2, 2011 Office Action in Chinese Application No. 200910207128.4, with translation.
May 31, 2011 Office Action in Japanese Application No. 2005-168692, with translation.
Aug. 4, 2011 Office Action issued in U.S. Appl. No. 11/628,507.
Sep. 22, 2011 Written Opinion issued in Singapore Application No. 200903982-7.
Aug. 23, 2011 Office Action issued in Korean Patent Application No. 2006-7026607 (with English translation).
Oct. 28, 2011 Office Action issued in EP Application No. 05748985.8.
Dec. 23, 2009 Office Action issued in EP Application No. 05748985.8.
Apr. 26, 2012 Office Action issued in U.S. Appl. No. 11/628,507.
Jul. 17, 2012 Office Action issued in Japanese Application No. 2005-168692 (with English translation).
Jun. 20, 2012 Office Action issued in Korean Application No. 2012-7004814 (with English translation).

(56) References Cited

OTHER PUBLICATIONS

Aug. 8, 2012 Office Action issued in Korean Application No. 2006-7026607 (with English translation).
Nov. 14, 2012 Office Action issued in Indian Application No. 3790/kolnp/2006.
Oct. 8, 2012 Office Action issued in Singaporean Application No. 200903982-7.
Mar. 4, 2013 Preliminary Examination Report issued in Taiwanese Patent Application No. 094119275 (with translation).
Aug. 4, 2009 Office Action issued in U.S. Appl. No. 11/802,062.
Apr. 12, 2010 Office Action issued in U.S. Appl. No. 11/802,062.
Aug. 8, 2012 Office Action issued in U.S. Appl. No. 11/802,062.
Apr. 13, 2011 Notice of Allowance issued in U.S. Appl. No. 11/628,507.
Apr. 19, 2013 Office Action issued in U.S. Appl. No. 11/628,507.
May 1, 2013 Office Action issued in Korean Application No. 2013-7003364.
May 2, 2013 Office Action issued in European Application No. 05748985.8.
Aug. 4, 2015 Office Action issued in Korean Application No. 2014-7024616.
Oct. 2, 2015 Office Action issued in European Application No. 05748985.8.
Mar. 8, 2016 Office Action issued in Korean Patent Application No. 2015-7009089.

\* cited by examiner (a)

(b)

(a)

(b)

EXPOSURE APPARATUS, EXPOSURE METHOD, AND METHOD FOR PRODUCING DEVICE

This is a Division of U.S. patent application Ser. No. 11/628,507 filed Dec. 5, 2006 (now abandoned), which is the U.S. National Phase of PCT/JP2005/010484 filed Jun. 8, 2005. The disclosure of each of the prior applications is hereby incorporated by reference herein in its entirety.

TECHNICAL FIELD

The present invention relates to an exposure apparatus for exposing a substrate through a liquid, an exposure method, and a method for producing a device.

BACKGROUND ART

Semiconductor devices and liquid crystal display devices are produced by means of the so-called photolithography technique in which a pattern formed on a mask is transferred onto a photosensitive substrate. The exposure apparatus, which is used in the photolithography step, includes a mask stage for supporting the mask and a substrate stage for supporting the substrate. The pattern on the mask is transferred onto the substrate via a projection optical system while successively moving the mask stage and the substrate stage. In recent years, it is demanded to realize the higher resolution of the projection optical system in order to respond to the further advance of the higher integration of the device pattern. As the exposure wavelength to be used is shorter, the resolution of the projection optical system becomes higher. As the numerical aperture of the projection optical system is larger, the resolution of the projection optical system becomes higher. Therefore, the exposure wavelength, which is used for the exposure apparatus, is shortened year by year, and the numerical aperture of the projection optical system is increased as well. The exposure wavelength, which is dominantly used at present, is 248 nm of the KrF excimer laser. However, the exposure wavelength of 193 nm of the ArF excimer laser, which is shorter than the above, is also practically used in some situations. When the exposure is performed, the depth of focus (DOF) is also important in the same manner as the resolution. The resolution R and the depth of focus δ are represented by the following expressions respectively.

$$R = k_1 \cdot \lambda / NA \quad (1)$$

$$\delta = \pm k_2 \cdot \lambda / NA^2 \quad (2)$$

In the expressions, $\lambda$ represents the exposure wavelength, NA represents the numerical aperture of the projection optical system, and $k_1$ and $k_2$ represent the process coefficients. According to the expressions (1) and (2), the following fact is appreciated. That is, when the exposure wavelength $\lambda$ is shortened and the numerical aperture NA is increased in order to enhance the resolution R, then the depth of focus δ is narrowed.

If the depth of focus δ is too narrowed, it is difficult to match the substrate surface with respect to the image plane of the projection optical system. It is feared that the focus margin is insufficient during the exposure operation. Accordingly, the liquid immersion method has been suggested, which is disclosed, for example, in International Publication No. 99/49504 as a method for substantially shortening the exposure wavelength and widening the depth of focus. In this liquid immersion method, the space between the lower surface of the projection optical system and the substrate surface is filled with a liquid such as water or any organic solvent to form a liquid immersion area so that the resolution is improved and the depth of focus is magnified about n times by utilizing the fact that the wavelength of the exposure light beam in the liquid is 1/n as compared with that in the air (n represents the refractive index of the liquid, which is about 1.2 to 1.6 in ordinary cases).

In the case of the liquid immersion exposure apparatus as disclosed in International Publication No. 99/49504 described above, the liquid in the liquid immersion area formed on the substrate makes contact with the optical element which is arranged most closely to the image plane among a plurality of elements (optical elements) for constructing the projection optical system. In such a situation, the following possibility arises. That is, if the liquid in the liquid immersion area is mixed with any impurity or the like generated, for example, from the surface of the substrate, and the liquid in the liquid immersion area is contaminated therewith, then the optical element, which is arranged most closely to the image plane, may be polluted with the contaminated liquid in the liquid immersion area. If the optical element is polluted, any inconvenience arises, for example, such that the light transmittance of the optical element is lowered and/or any distribution appears in the light transmittance. As a result, there is such a possibility that the exposure accuracy and the measurement accuracy, which are obtained via the projection optical system, are deteriorated.

A scanning type exposure apparatus, which exposes the substrate with the pattern formed on the mask while synchronously moving the mask and the substrate in the scanning direction, is also disclosed in International Publication No. 99/49504 described above. In the case of the scanning type exposure apparatus, it is required to realize the high speed for the scanning velocity (scanning speed) in order to improve, for example, the productivity of the device. However, if the high scanning velocity is realized, the following possibility arises. That is, it is difficult to maintain the liquid immersion area to have a desired size.

DISCLOSURE OF THE INVENTION

Problem to be Solved by the Invention

The present invention has been made taking the foregoing circumstances into consideration, an object of which is to provide an exposure apparatus with which it is possible to avoid the deterioration of the exposure accuracy and the measurement accuracy caused by the pollution of the element (optical element), and a method for producing a device using the exposure apparatus. Another object of the present invention is to provide an exposure apparatus and an exposure method in which the liquid immersion area is maintained to be in a desired state, and a method for producing a device using the exposure apparatus.

Means for Solving the Problem and Effect of the Invention

In order to achieve the objects as described above, the present invention adopts the following constructions.

According to a first aspect of the present invention, there is provided an exposure apparatus which exposes a substrate by radiating an exposure light beam onto the substrate through a liquid; the exposure apparatus comprising a projection optical system which has a plurality of elements including a first element closest to an image plane and a second element which is second closest to the image plane with respect to the first element; wherein the first element has a first surface which is arranged opposite to a surface of the substrate and through which the exposure light beam passes, and a second surface which is arranged opposite to the second element and through which the exposure light beam passes; the first element and the second element are supported in a substantially stationary state with respect to an optical axis of the projection optical system; a space between the second element and the second surface of the first element is filled with a second liquid so that only a partial area, which includes an area of the second surface of the first element through which the exposure light beam passes, serves as a liquid immersion area; and the exposure light beam is radiated onto the substrate to expose the substrate through a first liquid on a side of the first surface of the first element and the second liquid on a side of the second surface.

According to the present invention, the space between the substrate and the first surface of the first element is filled with the first liquid, and the space between the second element and the second surface of the first element is filled with the second liquid. Accordingly, the substrate can be exposed satisfactorily in a state in which the large image side numerical aperture of the projection optical system PL is secured. On the other hand, when the first liquid, which is on the side of the first surface, makes contact with the substrate, there is such a high possibility that the side of the first surface of the first element may be polluted. However, the first element can be constructed to be easily exchangeable, because each of the side of the first surface of the first element and the side of the second surface of the first element is filled with the liquid. Therefore, only the polluted first element can be exchanged with another clean element. The exposure and the measurement can be performed satisfactorily via the liquids and the projection optical system provided with the clean first element. The second liquid locally forms the liquid immersion area in only the partial area, including the area through which the exposure light beam passes, of the second surface of the first element. Accordingly, the second liquid can be prevented from any leakage from the circumference of the second surface of the first element. Therefore, it is possible to avoid the deterioration of any mechanical part or the like disposed around the first element, which would be otherwise caused by the leaked second liquid. Further, it is possible to avoid the inflow of the liquid, for example, into the support section for supporting the first element, by locally forming the liquid immersion area of the second liquid on the second surface of the first element. It is possible to avoid the deterioration of the support section. The second liquid makes no contact, for example, with the support section for supporting the element, because the second liquid locally forms the liquid immersion area on the second surface. Therefore, it is possible to avoid the inconvenience which would be otherwise caused, for example, such that the second liquid for forming the liquid immersion area is mixed with any impurity generated from the support section or the like. Therefore, the exposure process and the measurement process can be performed satisfactorily in a state in which the cleanness of the second liquid is maintained.

The first element, which is referred to in the present invention, may be a transparent member having no refractive power (for example, a parallel flat plate or plane parallel plate). For example, even when the transparent member, which is arranged most closely to the image plane, does not contribute to the image formation performance of the projection optical system at all, the transparent member is regarded as the first element. The first element and the second element, which are referred to in the present invention, are supported in the substantially stationary state with respect to the optical axis (exposure light beam) of the projection optical system. However, even when at least one of the first element and the second element is supported finely movably in order to adjust the posture and the position thereof, it is regarded that the element is "supported in the substantially stationary state".

According to a second aspect of the present invention, there is provided an exposure apparatus which exposes a substrate by radiating an exposure light beam onto the substrate through a liquid; the exposure apparatus comprising a projection optical system which has a plurality of elements including a first element closest to an image plane and a second element which is second closest to the image plane with respect to the first element; wherein the first element has a first surface which is arranged opposite to a surface of the substrate and through which the exposure light beam passes, and a second surface which is arranged opposite to the second element and through which the exposure light beam passes; an outer diameter of a surface of the second element opposed to the first element is smaller than an outer diameter of the second surface of the first element; the first element and the second element are supported in a substantially stationary state with respect to an optical axis of the projection optical system; and the exposure light beam is radiated onto the substrate to expose the substrate through a first liquid on a side of the first surface of the first element and a second liquid on a side of the second surface.

According to the present invention, the outer diameter of the opposing surface of the second element opposed to the first element is smaller than the outer diameter of the second surface of the first element. Accordingly, the liquid immersion area, which has the size corresponding to the surface of the second element, can be formed locally on the second surface of the first element, while covering the opposing surface with the second liquid. Therefore, the second liquid can be prevented from any leakage from the circumference of the second surface of the first element. It is possible to avoid the deterioration of any mechanical part or the like disposed around the first element, which would be otherwise caused by the leaked second liquid. Further, it is possible to avoid the inflow of the liquid, for example, into the support section for supporting the first element, by locally forming the liquid immersion area of the second liquid on the second surface of the first element. It is possible to avoid the deterioration of the support section. The second liquid makes no contact, for example, with the support section for supporting the element, because the second liquid locally forms the liquid immersion area on the second surface. Therefore, it is possible to avoid the inconvenience which would be otherwise caused, for example, such that the second liquid for forming the liquid immersion area is mixed with any impurity generated from the support section or the like. Therefore, it is possible to maintain the cleanness of the second liquid. When the exposure light beam is radiated onto the substrate via the second liquid of the liquid immersion area formed locally on the second surface and the first liquid of the liquid immersion area formed on the side of the first surface, the substrate can be exposed satisfactorily in the state in which the large image side numerical aperture of the projection optical system is secured. Each of the side of the first surface of the first element and the side of the second surface of the first element is filled with the liquid. Accordingly, the first element can be constructed to be easily exchangeable. Therefore, only the polluted first element can be exchanged with another clean element. The exposure and the measurement can be performed satisfactorily via the liquids and the projection optical system provided with the clean first element.

The first element, which is referred to in the present invention, may be a transparent member having no refractive power (for example, a parallel flat plate or plane parallel plate). For example, even when the transparent member, which is arranged most closely to the image plane, does not contribute to the image formation performance of the projection optical system at all, the transparent member is regarded as the first element and as a part of the projection optical system. The first element and the second element, which are referred to in the present invention, are supported in the substantially stationary state with respect to the optical axis (exposure light beam) of the projection optical system. However, even when at least one of the first element and the second element is supported finely movably in order to adjust the posture and the position thereof, it is regarded that the element is "supported in the substantially stationary state".

According to a third aspect of the present invention, there is provided an exposure apparatus which exposes a substrate by radiating an exposure light beam onto the substrate through a first liquid; the exposure apparatus comprising a projection optical system which includes a plurality of elements and which has a first element closest to an image plane and a second element which is second closest to the image plane with respect to the first element; and a first liquid immersion mechanism which supplies the first liquid; wherein the first element has a first surface which is arranged opposite to a surface of the substrate and through which the exposure light beam passes, and a second surface which is arranged opposite to the second element and which is substantially in parallel to the first surface; an outer diameter of the second surface of the first element is greater than an outer diameter of the first surface of the first element; and the exposure light beam is radiated onto the substrate to expose the substrate through the first liquid between the first element and the substrate.

According to the present invention, the outer diameter of the second surface of the first element is greater than the outer diameter of the first surface. Accordingly, when the first element is supported by a support section, the support section, which supports the first element, can be provided at a position (end portion of the second surface) away from the optical axis of the first element. Therefore, it is possible to avoid the interference between the support section and any member or equipment or the like arranged around the first element, and it is possible to improve the degree of freedom of the design and the degree of freedom of the arrangement of the member or the equipment or the like. Further, it is possible to decrease the size of the liquid immersion area formed between the first surface and the substrate by the first liquid immersion mechanism, because the outer diameter of the first surface of the first element is sufficiently smaller than that of the second surface.

The first element, which is referred to in the present invention, may be a transparent member having no refractive power (for example, a parallel flat plate or plane parallel plate). For example, even when the transparent member, which is arranged most closely to the image plane, does not contribute to the image formation performance of the projection optical system at all, the transparent member is regarded as the first element and as a part of the projection optical system.

According to a fourth aspect of the present invention, there is provided an exposure apparatus which exposes a substrate by radiating an exposure light beam onto the substrate through a first liquid; the exposure apparatus comprising a first liquid immersion mechanism which provides the first liquid onto the substrate; and a projection optical system which has a plurality of elements including a first element closest to an image plane and a second element which is second closest to the image plane with respect to the first element; wherein the first element is arranged so that a first surface of the first element is opposed to a surface of the substrate, and a second surface of the first element is opposed to the second element; a distance between the first surface and the second surface of the first element on an optical axis of the projection optical system is not less than 15 mm; and the exposure light beam is radiated onto the substrate to expose the substrate through the first liquid on a side of the first surface of the first element.

According to the present invention, the distance between the first surface and the second surface of the first element, i.e., the thickness of the first element is not less than 15 mm, and thus the first element is thick. Therefore, the degree of freedom of the position is increased for the member and the equipment or the like arranged around the first element. Accordingly, it is possible to avoid the interference between the support section and the member or equipment or the like arranged around the first element. As a result, it is possible to improve the degree of freedom of the design of the member or the equipment or the like. Accordingly, the support section, which supports the first element, can be provided at a position away from the optical axis of the first element. In particular, it is noted that the size of the liquid immersion area of the first liquid can be decreased by improving the degree of freedom of the design and the arrangement of the liquid immersion mechanism for forming the liquid immersion area of the first liquid. Further, the second liquid may be supplied also to the space between the first element and the second element without being limited to the first liquid supplied to the space between the first element and the substrate. When the exposure light beam is radiated onto the substrate through the first liquid and the second liquid, the substrate can be exposed satisfactorily in the state in which the large image side numerical aperture of the projection optical system is secured. The first element can be constructed to be easily exchangeable, because each of the side of the first surface of the first element and the side of the second surface of the first element is filled with the liquid. Therefore, only the polluted first element can be exchanged with another clean element. The exposure and the measurement can be performed satisfactorily via the liquid and the projection optical system provided with the clean first element. When the first element is not less than 15 mm, the change of the shape of the first element, which would be otherwise caused by the force received from the liquid, can be suppressed. Therefore, it is possible to maintain the high image formation performance of the projection optical system.

The first element, which is referred to in the present invention, may be a transparent member having no refractive power (for example, a parallel flat plate or plane parallel plate). For example, even when the transparent member, which is arranged most closely to the image plane, does not contribute to the image formation performance of the projection optical system at all, the transparent member is regarded as the first element and as a part of the projection optical system.

According to a fifth aspect of the present invention, there is provided an exposure apparatus which exposes a substrate by radiating an exposure light beam onto the substrate through a first liquid; the exposure apparatus comprising a first liquid immersion mechanism which provides the first liquid onto the substrate; and a projection optical system which has a plurality of elements including a first element closest to an image plane and a second element which is second closest to the image plane with respect to the first element; wherein the first element has a first surface which is arranged opposite to a surface of the substrate and through which the exposure light beam passes, and a second surface which is arranged opposite to the second element and through which the exposure light beam passes; a distance between the first surface and the second surface of the first element on an optical axis of the projection optical system is greater than a distance between the first surface of the first element and the surface of the substrate on the optical axis of the projection optical system; and the exposure light beam is radiated onto the substrate to expose the substrate through the first liquid between the substrate and the first element and a second liquid between the second element and the first element.

According to the present invention, the substrate can be exposed satisfactorily in a state in which the large image side numerical aperture of the projection optical system is secured, by radiating the exposure light beam onto the substrate through the first liquid and the second liquid. The first element is thick, and thus the support section, which supports the first element, can be provided at a position away from the optical axis. The degree of freedom is increased, for example, for the arrangement of the member and the equipment arranged around the first element. Further, it is possible to suppress the change of the shape of the first element, which would be otherwise caused by the force received from the liquid. Therefore, it is possible to maintain the high image formation performance of the projection optical system.

According to a sixth aspect of the present invention, there is provided an exposure apparatus which exposes a substrate by radiating an exposure light beam onto the substrate through a first liquid; the exposure apparatus comprising a first liquid immersion mechanism which provides the first liquid onto the substrate to form a liquid immersion area of the first liquid on a part of the substrate; and a projection optical system which has a plurality of elements including a first element closest to an image plane and a second element which is second closest to the image plane with respect to the first element; wherein the first element has a first surface which is arranged opposite to a surface of the substrate and through which the exposure light beam passes, and a second surface which is arranged opposite to the second element and through which the exposure light beam passes; the first liquid immersion mechanism has a flat liquid contact surface which is arranged opposite to the surface of the substrate, the liquid contact surface being arranged to surround an optical path for the exposure light beam between the substrate and the first surface of the first element; and the exposure light beam is radiated onto the substrate to expose the substrate through the first liquid between the substrate and the first element and the second liquid between the second element and the first element.

According to the present invention, the substrate can be exposed satisfactorily in a state in which the large image side numerical aperture of the projection optical system is secured, by radiating the exposure light beam onto the substrate through the first liquid and the second liquid. The flat liquid contact surface is arranged opposite to the surface of the substrate around the optical path for the exposure light beam, between the first element and the substrate. Therefore, it is possible to continuously fill the optical path between the first element and the substrate with the first liquid.

According to a seventh aspect of the present invention, there is provided an exposure method for exposing a substrate by radiating an exposure light beam onto the substrate via a liquid and a projection optical system including a first element closest to an image plane and a second element which is second closest to the image plane with respect to the first element; wherein a first surface of the first element, which is opposed to the substrate, is smaller than a second surface of the first element which is opposed to the second element; and a surface of the second element, which is opposed to the first element, is smaller than the second surface of the first element; the exposure method comprising providing a first liquid to a space between the substrate and the first element; providing a second liquid to a space between the first element and the second element; and exposing the substrate by radiating the exposure light beam onto the substrate through the first liquid and the second liquid. According to the exposure method of the present invention, the space between the first element and the second element can be reliably filled with the second liquid. The exposure light beam is radiated onto the substrate through the first liquid and the second liquid, and thus the substrate can be satisfactorily exposed in a state in which the large image side numerical aperture of the projection optical system is secured.

According to still another aspect of the present invention, there is provided a method for producing a device, comprising using the exposure apparatus or the exposure method described above. According to the present invention, it is possible to satisfactorily maintain the exposure accuracy and the measurement accuracy. Therefore, it is possible to produce the device having the desired performance.

BEST MODE FOR CARRYING OUT THE INVENTION

The present invention will be explained below with reference to the drawings. However, the present invention is not limited thereto.

Figure 1:
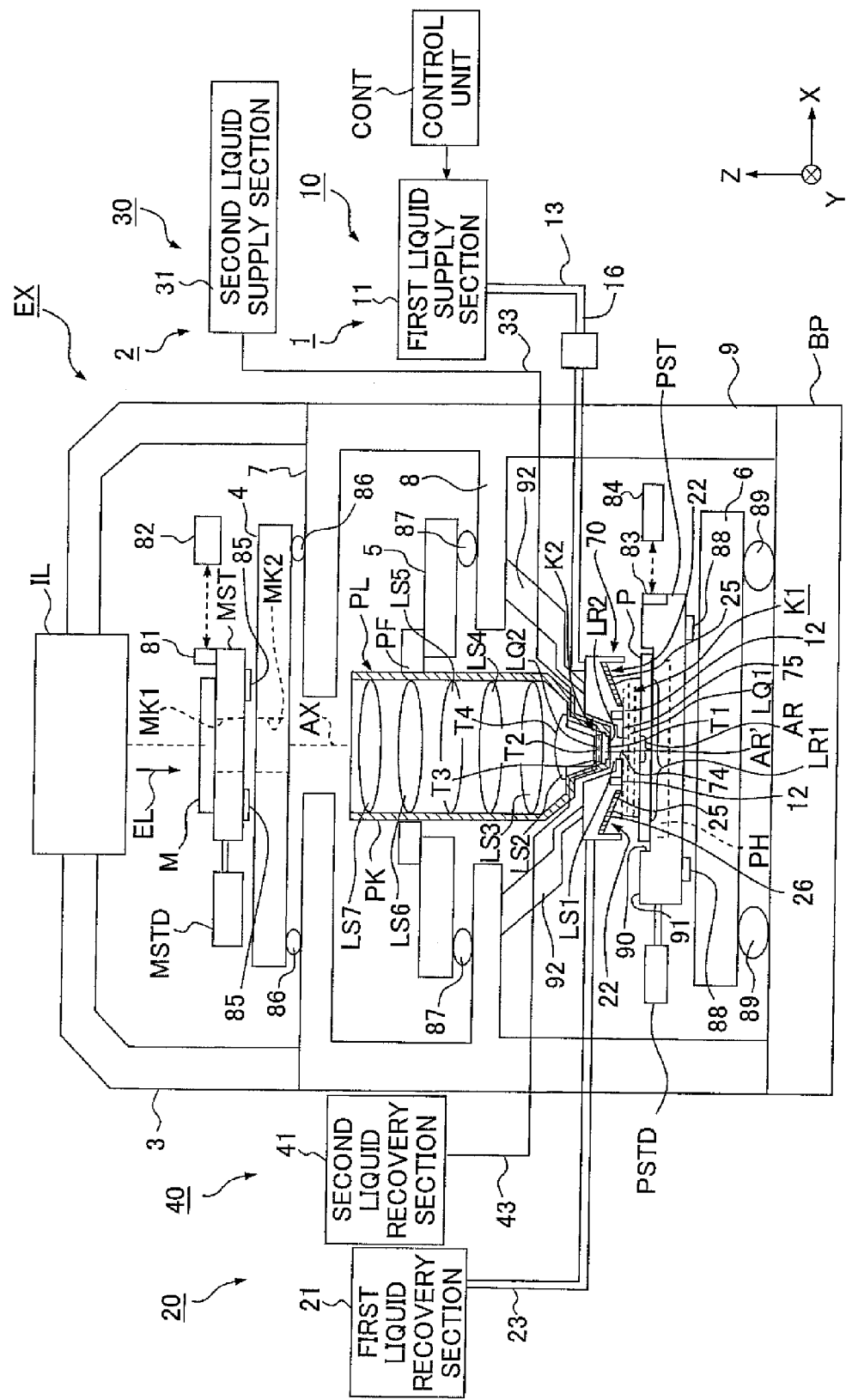
FIG. 1 shows a schematic arrangement illustrating an exposure apparatus according to an embodiment of the present invention.

FIG. 1 shows a schematic arrangement illustrating an exposure apparatus according to an embodiment of the present invention. With reference to FIG. 1, the exposure apparatus EX includes a mask stage MST which is movable while holding a mask M, a substrate stage PST which is movable while holding a substrate P, an illumination optical system IL which illuminates, with an exposure light beam EL, the mask M held by the mask stage MST, a projection optical system PL which performs the projection exposure for the substrate P held by the substrate stage PST with an image of a pattern of the mask M illuminated with the exposure light beam EL, and a control unit CONT which integrally controls the operation of the entire exposure apparatus EX.

The exposure apparatus EX of the embodiment of the present invention is a liquid immersion exposure apparatus to which the liquid immersion method is applied in order that the exposure wavelength is substantially shortened to improve the resolution and the depth of focus is substantially widened. The exposure apparatus EX includes a first liquid immersion mechanism 1 which fills, with the first liquid LQ1, the space between the substrate P and a lower surface T1 of a first optical element LS1 closest to the image plane of the projection optical system PL, among a plurality of optical elements LS1 to LS7 for constructing the projection optical system PL. The substrate P is provided on the side of the image plane of the projection optical system PL. The lower surface T1 of the first optical element LS1 is arranged opposite to the surface of the substrate P. The first liquid immersion mechanism 1 includes a first liquid supply mechanism 10 which supplies the first liquid LQ1 to the space between the substrate P and the lower surface T1 of the first optical element LS1, and a first liquid recovery mechanism 20 which recovers the first liquid LQ1 supplied by the first liquid supply mechanism 10. The operation of the first liquid immersion mechanism 1 is controlled by the control unit CONT.

The exposure apparatus EX includes a second liquid immersion mechanism 2 which fills, with the second liquid LQ2, the space between the first optical element LS1 and the second optical element LS2 which is the next closest to the image plane of the projection optical system PL with respect to the first optical element LS1. The second optical element LS2 is arranged over (above) the first optical element LS1. That is, the second optical element LS2 is arranged on the side of the light-incident surface of the first optical element LS1. The upper surface T2 of the first optical element LS1 is arranged opposite to the lower surface T3 of the second optical element LS2. The second liquid immersion mechanism 2 includes a second liquid supply mechanism 30 which supplies the second liquid LQ2 to the space between the first optical element LS1 and the second optical element LS2, and a second liquid recovery mechanism 40 which recovers the second liquid LQ2 supplied by the second liquid supply mechanism 30. The operation of the second liquid immersion mechanism 2 is controlled by the control unit CONT.

In this embodiment, the first optical element LS1 is a parallel flat plate having no refractive power through which the exposure light beam EL is transmissive. The lower surface T1 and the upper surface T2 of the first optical element LS1 are substantially in parallel to each other. The image formation characteristics including, for example, the aberration are set within predetermined allowable ranges for the projection optical system PL including the first optical element LS1.

In this embodiment, the space (first space) K1 between the first optical element LS1 and the substrate P and the space (second space) K2 between the first optical element LS1 and the second optical element LS2 are spaces which are independent from each other. The control unit CONT can independently perform the supply operation and the recovery operation for the first liquid LQ1 with respect to the first space K1 by the first liquid immersion mechanism 1 and the supply operation and the recovery operation for the second liquid LQ2 with respect to the second space K2 by the second liquid immersion mechanism 2. The liquid (LQ1, LQ2) neither comes in nor goes out from one to the other of the first space K1 and the second space K2.

The exposure apparatus EX is operated as follows at least during the period in which the image of the pattern of the mask M is projected onto the substrate P. That is, the space between the first optical element LS1 and the substrate P arranged on the image plane side thereof is filled with the first liquid LQ1 by using the first liquid immersion mechanism 1 to form the first liquid immersion area LR1, and the space between the first optical element LS1 and the second optical element LS2 is filled with the second liquid LQ2 by using the second liquid immersion mechanism 2 to form the second liquid immersion area LR2. In this embodiment, the exposure apparatus EX adopts the local liquid immersion system wherein the first liquid immersion area LR1, which is greater than the projection area AR and which is smaller than the substrate P, is locally formed on a part of the substrate P, the part including the projection area AR of the projection optical system PL. In this embodiment, the exposure apparatus EX locally forms the second liquid immersion area LR2 of the second liquid LQ2 in only a partial area, including the area AR', of the upper surface T2 of the first optical element LS1 through which the exposure light beam EL passes. The exposure apparatus EX performs the projection exposure for the substrate P with the pattern of the mask M such that the exposure light beam EL, which has passed through the mask M, is radiated onto the substrate P via the projection optical system PL, the second liquid LQ2 in the second liquid immersion area LR2, and the first liquid LQ1 in the first liquid immersion area LR1.

A nozzle member 70, which will be described in detail later on, is arranged in the vicinity of the image plane of the projection optical system PL, specifically in the vicinity of the optical element LS1 disposed at the end on the image plane side of the projection optical system PL. The nozzle member 70 is an annular member which is provided to surround the end portion of the projection optical system PL over (above) the substrate P (substrate stage PST). In this embodiment, the nozzle member 70 constructs a part of the first liquid immersion mechanism 1.

The embodiment of the present invention will be explained as exemplified by a case of the use of the scanning type exposure apparatus (so-called scanning stepper) as the exposure apparatus EX in which the substrate P is exposed with the pattern formed on the mask M while synchronously moving the mask M and the substrate P in mutually different directions (opposite directions) in the scanning directions. In the following explanation, the Z axis direction is the direction which is coincident with the optical axis AX of the projection optical system PL, the X axis direction is the synchronous movement direction (scanning direction) for the mask M and the substrate P in the plane perpendicular to the Z axis direction, and the Y axis direction is the direction (non-scanning direction) perpendicular to the Z axis direction and the X axis direction. The directions of rotation (inclination) about the X axis, the Y axis, and the Z axis are designated as θX, θY, and θZ directions respectively.

The exposure apparatus EX includes a base BP which is provided on the floor surface, and a main column 9 which is installed on the base BP. The main column 9 is formed with an upper step 7 and a lower step 8 which protrude inwardly. The illumination optical system IL illuminates, with the exposure light beam EL, the mask M supported by the mask stage MST. The illumination optical system IL is supported by a support frame 3 which is fixed to the upper portion of the main column 9.

The illumination optical system IL includes, for example, an exposure light source which radiates the exposure light beam EL, an optical integrator which uniformizes the illuminance of the exposure light beam EL radiated from the exposure light source, a condenser lens which collects the exposure light beam EL emitted from the optical integrator, a relay lens system, and a variable field diaphragm which sets the illumination area on the mask M formed by the exposure light beam EL to be slit-shaped. The predetermined illumination area on the mask M is illuminated with the exposure light beam EL having a uniform illuminance distribution by the illumination optical system IL. Those usable as the exposure light beam EL radiated from the exposure light source include, for example, emission lines (g-ray, h-ray, i-ray) radiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). In this embodiment, the ArF excimer laser beam is used.

In this embodiment, pure water is used for the first liquid LQ1 to be supplied from the first liquid supply mechanism 10 and the second liquid LQ2 to be supplied from the second liquid supply mechanism 30. That is, in this embodiment, the first liquid LQ1 and the second liquid LQ2 are the same liquid. Those capable of being transmitted through pure water are not limited to the ArF excimer laser beam, and also include the emission line (g-ray, h-ray, i-ray) radiated, for example, from a mercury lamp and the far ultraviolet light beam (DUV light beam) such as the KrF excimer laser beam (wavelength: 248 nm).

The mask stage MST is movable while holding the mask M. The mask stage MST holds the mask M by the vacuum attraction (or the electrostatic attraction). A plurality of gas bearings (air bearings) 85, which are non-contact bearings, are provided on the lower surface of the mask stage MST. The mask stage MST is supported in a non-contact manner by the air bearings 85 with respect to the upper surface (guide surface) of a mask surface plate (mask base plate) 4. Openings MK1, MK2, through which the image of the pattern of the mask M passes, are formed at central positions of the mask stage MST and the mask surface plate 4 respectively. The mask surface plate 4 is supported by the upper step 7 of the main column 9 via an anti-vibration unit 86. That is, in this arrangement, the mask stage MST is supported by the main column 9 (upper step 7) via the anti-vibration unit 86 and the mask surface plate 4. The mask surface plate 4 and the main column 9 are isolated from each other in terms of the vibration by the anti-vibration unit 86 so that the vibration of the main column 9 is not transmitted to the mask surface plate 4 which supports the mask stage MST.

The mask stage MST is movable two-dimensionally in the plane perpendicular to the optical axis AX of the projection optical system PL, i.e., in the XY plane, and it is finely rotatable in the θZ direction on the mask surface plate 4 in a state in which the mask M is held in accordance with the driving of the mask stage-driving unit MSTD including a linear motor or the like controlled by the control unit CONT. The mask stage MST is movable at a designated scanning velocity in the X axis direction. The mask stage MST has a movement stroke in the X axis direction to such an extent that the entire surface of the mask M can traverse at least the optical axis AX of the projection optical system PL.

A movement mirror 81, which is movable together with the mask stage MST, is provided on the mask stage MST. A laser interferometer 82 is provided at a position opposed to the movement mirror 81. The position in the two-dimensional direction and the angle of rotation in the θZ direction (including the angles of rotation in the θX and θY directions in some cases) of the mask M on the mask stage MST are measured in real-time by the laser interferometer 82. The result of the measurement performed by the laser interferometer 82 is outputted to the control unit CONT. The control unit CONT drives the mask stage-driving unit MSTD on the basis of the result of the measurement obtained by the laser interferometer 82 to thereby control the position of the mask M held by the mask stage MST.

The projection optical system PL projects the pattern on the mask M onto the substrate P at a predetermined projection magnification β to perform the exposure. The projection optical system PL is constructed of the plurality of optical elements LS1 to LS7 including the first optical element LS1 which is provided at the end portion on the side of the substrate P. The plurality of optical elements LS1 to LS7 are supported by the barrel PK. In this embodiment, the projection optical system PL is the reduction system in which the projection magnification β is, for example, ¼, ⅕, or ⅛. The projection optical system PL may be any one of the 1× magnification system and the magnifying system. The projection optical system PL may be any one of the cata-dioptric system including dioptric and catoptric elements, the dioptric system including no catoptric element, and the catoptric system including no dioptric element. The exposure light beam EL, which is radiated from the illumination optical system IL, comes into the projection optical system PL from the side of the object plane, and the exposure light beam passes through the plurality of optical elements LS7 to LS1. After that, the exposure light beam EL outgoes from the side of the image plane of the projection optical system PL, and the exposure light beam EL arrives at the surface of the substrate P. Specifically, the exposure light beam EL passes through the plurality of optical elements LS7 to LS3 respectively, and then the exposure light beam EL passes through the predetermined area of the upper surface T4 of the second optical element LS2. Then, the exposure light beam EL passes through the predetermined area of the lower surface T3 of the second optical element LS2, and then the exposure light beam EL comes into the second liquid immersion area LR2. The exposure light beam EL, which has passed through the second liquid immersion area LR2, passes through the predetermined area of the upper surface T2 of the first optical element LS1, and then the exposure light beam EL passes through the predetermined area of the lower surface T1 of the first optical element LS1. Then, the exposure light beam EL comes into the first liquid immersion area LR1, and then the exposure light beam EL arrives at the surface of the substrate P.

A flange PF is provided at the outer circumference of the barrel PK which holds the projection optical system PL. The projection optical system PL is supported by a barrel surface plate (barrel base plate) 5 via the flange PF. The barrel surface plate 5 is supported by the lower step 8 of the main column 9 via an anti-vibration unit 87. That is, in this arrangement, the projection optical system PL is supported by the main column 9 (lower step 8) via the anti-vibration unit 87 and the barrel surface plate 5. The barrel surface plate 5 and the main column 9 are isolated from each other in terms of the vibration by the anti-vibration unit 87 so that the vibration of the main column 9 is not transmitted to the barrel surface plate 5 which supports the projection optical system PL.

The substrate stage PST is movable while supporting a substrate holder PH which holds the substrate P. The substrate holder PH holds the substrate P by, for example, the vacuum attraction. A plurality of gas bearings (air bearings) 88, which are non-contact bearings, are provided on the lower surface of the substrate stage PST. The substrate stage PST is supported in a non-contact manner with respect to the upper surface (guide surface) of a substrate surface plate (substrate base plate) 6 by the air bearings 88. The substrate surface plate 6 is supported on the base BP via an anti-vibration unit 89. The substrate surface plate 6, the main column 9, and the base BP (floor surface) are isolated from one another in terms of the vibration by the anti-vibration unit 89 so that the vibration of the base BP (floor surface) and/or the main column 9 is not transmitted to the substrate surface plate 6 which supports the substrate stage PST.

The substrate stage PST is movable two-dimensionally in the XY plane, and it is finely rotatable in the θZ direction on the substrate surface plate 6 in a state in which the substrate P is held via the substrate holder PH in accordance with the driving of the substrate stage-driving unit PSTD including, for example, a linear motor controlled by the control unit CONT. Further, the substrate stage PST is also movable in the Z axis direction, the θX direction, and the θY direction.

A movement mirror 83, which is movable together with the substrate stage PST with respect to the projection optical system PL, is provided on the substrate stage PST. A laser interferometer 84 is provided at a position opposed to the movement mirror 83. The angle of rotation and the position in the two-dimensional direction of the substrate P on the substrate stage PST are measured in real-time by the laser interferometer 84. Although not shown, the exposure apparatus EX is provided with a focus/leveling detecting system which detects the information about the position of the surface of the substrate P supported by the substrate stage PST. Those adoptable as the focus/leveling detecting system include, for example, the oblique incidence system in which the detecting light beam is radiated in an oblique direction onto the surface of the substrate P, and the system in which the capacitance type sensor is used. The focus/leveling detecting system detects the information about the position in the Z axis direction of the surface of the substrate P and the information about the inclination in the θX and θY directions of the substrate P through or not through the first liquid LQ1. In the case of the focus/leveling detecting system which detects the surface information about the surface of the substrate P through or not through the liquid LQ1, the surface information about the surface of the substrate P may be detected at any position away from the projection optical system PL. An exposure apparatus, which detects the surface information about the surface of the substrate P at any position away from the projection optical system PL, is disclosed, for example, in U.S. Pat. No. 6,674,510, contents of which are incorporated herein by reference within a range of permission of the domestic laws and ordinances of the state designated or selected in this international application.

The result of the measurement performed by the laser interferometer 84 is outputted to the control unit CONT. The result of the detection performed by the focus/leveling detecting system is also outputted to the control unit CONT. The control unit CONT drives the substrate stage-driving unit PSTD on the basis of the result of the detection performed by the focus/leveling detecting system to control the focus position and the angle of inclination of the substrate P so that the surface of the substrate P is adjusted to match the image plane of the projection optical system PL. Further, the substrate P is subjected to the position control in the X axis direction and the Y axis direction on the basis of the result of the measurement performed by the laser interferometer 84.

A recess 90 is provided on the substrate stage PST. The substrate holder PH for holding the substrate P is arranged in the recess 90. The upper surface 91 of the substrate stage PST except for the recess 90 is a flat surface (flat portion) which has substantially the same height as that of (is flush with) the surface of the substrate P held by the substrate holder PH. In this embodiment, the upper surface of the movement mirror 83 is also provided to be substantially flush with the upper surface 91 of the substrate stage PST.

Substantially no difference in height appears outside the edge portion of the substrate P even when the edge area of the substrate P is subjected to the liquid immersion exposure, because the upper surface 91, which is substantially flush with the surface of the substrate P, is provided around the substrate P. Therefore, the liquid immersion area LR1 can be satisfactorily formed by retaining the liquid LQ on the image plane side of the projection optical system PL. It is also allowable that any difference in height is present between the surface of the substrate P and the upper surface 91 of the substrate stage PST provided that the liquid immersion area LR1 can be maintained. A gap of about 0.1 to 2 mm is provided between the edge portion of the substrate P and the flat surface (upper surface) 91 provided around the substrate P. However, the liquid LQ scarcely flows into the gap owing to the surface tension of the liquid LQ. Even when the exposure is performed for the portion in the vicinity of the circumferential edge of the substrate P, it is possible to retain the liquid LQ under the projection optical system PL by the aid of the upper surface 91.

The first liquid supply mechanism 10 of the first liquid immersion mechanism 1 is provided to supply the first liquid LQ1 to the first space K1 between the substrate P and the first optical element LS1 of the projection optical system PL. The first liquid supply mechanism 10 includes a first liquid supply section 11 which is capable of feeding the first liquid LQ1, and a first supply tube 13 which has one end connected to the first liquid supply section 11. The other end of the first supply tube 13 is connected to the nozzle member 70. In this embodiment, the first liquid supply mechanism 10 supplies pure water. The first liquid supply section 11 includes, for example, a pure water-producing unit, and a temperature-adjusting unit which adjusts the temperature of the first liquid (pure water) LQ1 to be supplied. It is also allowable to use a pure water-producing unit (utility power or power usage) of a factory in which the exposure apparatus EX is installed, instead of providing any pure water-producing unit for the exposure apparatus EX, provided that a predetermined quality condition is satisfied. The operation of the first liquid supply mechanism 10 (first liquid supply section 11) is controlled by the control unit CONT. In order to form the first liquid immersion area LR1 on the substrate P, the first liquid supply mechanism 10 supplies a predetermined amount of the first liquid LQ1 onto the substrate P arranged on the side of the image plane of the projection optical system PL under the control of the control unit CONT.

A flow rate controller 16 called "mass flow controller", which controls the liquid amount per unit time to be fed from the first liquid supply section 11 and supplied to the image plane side of the projection optical system PL, is provided at an intermediate position of the first supply tube 13. The control of the liquid supply amount by the flow rate controller 16 is performed in accordance with the instruction signal supplied from the control unit CONT.

The first liquid recovery mechanism 20 of the first liquid immersion mechanism 1 recovers the first liquid LQ1 from the side of the image plane of the projection optical system PL. The first liquid recovery mechanism 20 includes a first liquid recovery section 21 which is capable of recovering the first liquid LQ1, and a first recovery tube 23 which has one end connected to the first liquid recovery section 21. The other end of the first recovery tube 23 is connected to the nozzle member 70. The first liquid recovery section 21 includes, for example, a vacuum system (suction unit) such as a vacuum pump, and a gas/liquid separator which separates the recovered first liquid LQ1 from the gas. It is also allowable that all of the components including, for example, the vacuum system and the gas/liquid separator are not provided for the exposure apparatus EX but to use the equipment of a factory or the like in which the exposure apparatus EX is arranged, in place of at least a part or parts of the components as described above. The operation of the first liquid recovery mechanism 20 (first liquid recovery section 21) is controlled by the control unit CONT. In order to form the first liquid immersion area LR1 on the substrate P, the first liquid recovery mechanism 20 recovers a predetermined amount of the first liquid LQ1 from the surface of the substrate P supplied from the first liquid supply mechanism 10 in accordance with the control of the control unit CONT.

The second liquid supply mechanism 30 of the second liquid immersion mechanism 2 supplies the second liquid LQ2 to the second space K2 between the second optical element LS2 and the first optical element LS1 of the projection optical system PL. The second liquid supply mechanism 30 includes a second liquid supply section 31 which is capable of feeding the second liquid LQ2, and a second supply tube 33 which has one end connected to the second liquid supply section 31. The other end of the second supply tube 33 is connected to the second space K2 disposed between the first optical element LS1 and the second optical element LS2, for example, via the supply flow passage (34) as described later on. The second liquid supply mechanism 30 supplies pure water in the same manner as the first liquid supply mechanism 10. The second liquid supply section 31 includes, for example, a pure water-producing unit, and a temperature-adjusting unit which adjusts the temperature of the second liquid (pure water) LQ2 to be supplied. It is also allowable to use a pure water-producing unit (utility power or power usage) of a factory in which the exposure apparatus EX is installed, instead of providing any pure water-producing unit for the exposure apparatus EX. The operation of the second liquid supply mechanism 30 (second liquid supply section 31) is controlled by the control unit CONT. In order to form the second liquid immersion area LR2 on the upper surface T2 of the first optical element LS1, the second liquid supply mechanism 30 supplies a predetermined amount of the second liquid LQ2 onto the upper surface T2 of the first optical element LS1 in accordance with the control of the control unit CONT.

The pure water-producing unit may be used commonly for both of the first liquid immersion mechanism 1 and the second liquid immersion mechanism.

A mass flow controller, which controls the liquid amount per unit time fed from the second liquid supply section 31 and supplied to the second space K2, may be also provided at an intermediate position of the second supply tube 33.

The second liquid recovery mechanism 40 of the second liquid immersion mechanism 2 recovers the second liquid LQ2 from the second space K2 disposed between the second optical element LS2 and the first optical element LS1 of the projection optical system PL. The second liquid recovery mechanism 40 includes a second liquid recovery section 41 which is capable of recovering the second liquid LQ2, and a second recovery tube 43 which has one end connected to the second liquid recovery section 41. The other end of the second recovery tube 43 is connected to the second space K2 disposed between the first optical element LS1 and the second optical element LS2, for example, via the recovery flow passage (44) as described later on. The second liquid recovery section 41 includes, for example, a vacuum system (suction unit) such as a vacuum pump, and a gas/liquid separator which separates the recovered second liquid LQ2 from the gas. It is also allowable that all of the components including, for example, the vacuum system and the gas/liquid separator are not provided for the exposure apparatus EX, but to use the equipment (utility power or power usage) of a factory or the like in which the exposure apparatus EX is arranged, in place of at least a part or parts of the components as described above. The operation of the second liquid recovery mechanism 40 (second liquid recovery section 41) is controlled by the control unit CONT. The second liquid recovery mechanism 40 recovers the second liquid LQ2, from the upper surface T2 of the first optical element LS1, supplied from the second liquid supply mechanism 30 in accordance with the control of the control unit CONT.

The nozzle member 70 is held by a nozzle holder 92, and the nozzle holder 92 is connected to the lower step 8 of the main column 9. The main column 9, which supports the nozzle member 70 via the nozzle holder 92, is isolated via the anti-vibration unit 87 in terms of the vibration, from the barrel surface plate 5 which supports the barrel PK of the projection optical system PL via the flange PF. Therefore, the projection optical system PL is prevented from any transmission of the vibration generated by the nozzle member 70. Further, the main column 9, which supports the nozzle member 70 via the nozzle holder 92, is isolated via the anti-vibration unit 89 in terms of the vibration, from the substrate surface plate 6 which supports the substrate stage PST. Therefore, the substrate stage PST is prevented from any transmission of the vibration generated by the nozzle member 70 via the main column 9 and the base BP. Further, the main column 9, which supports the nozzle member 70 via the nozzle holder 92, is isolated via the anti-vibration unit 86 in terms of the vibration, from the mask surface plate 4 which supports the mask stage MST. Therefore, the mask stage MST is prevented from any transmission of the vibration generated by the nozzle member 70 via the main column 9.

Figure 2:
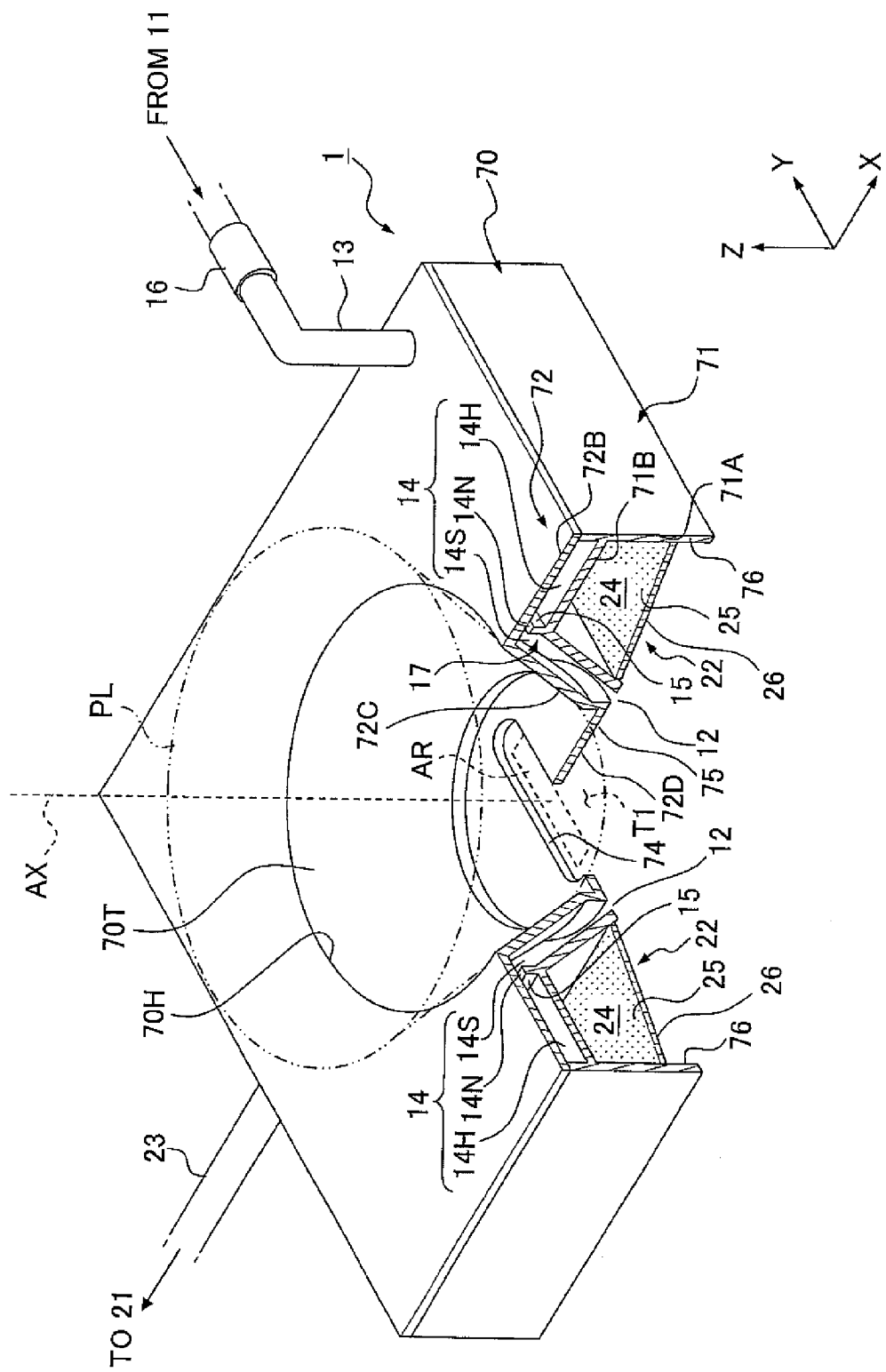
FIG. 2 shows a schematic perspective view illustrating those disposed in the vicinity of a nozzle member.
Figure 3:
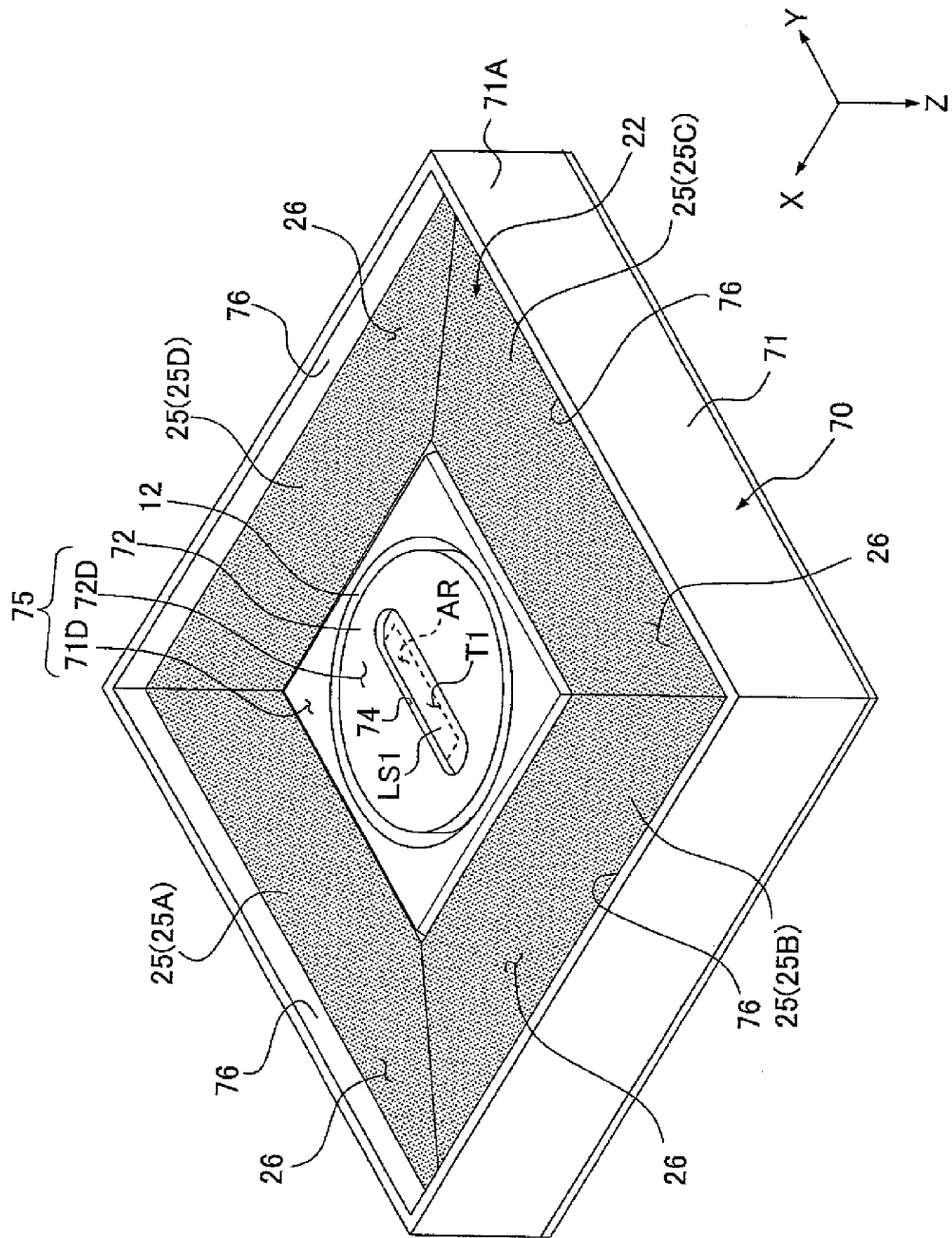
FIG. 3 shows a perspective view illustrating the nozzle member as viewed from a lower position.
Figure 4:
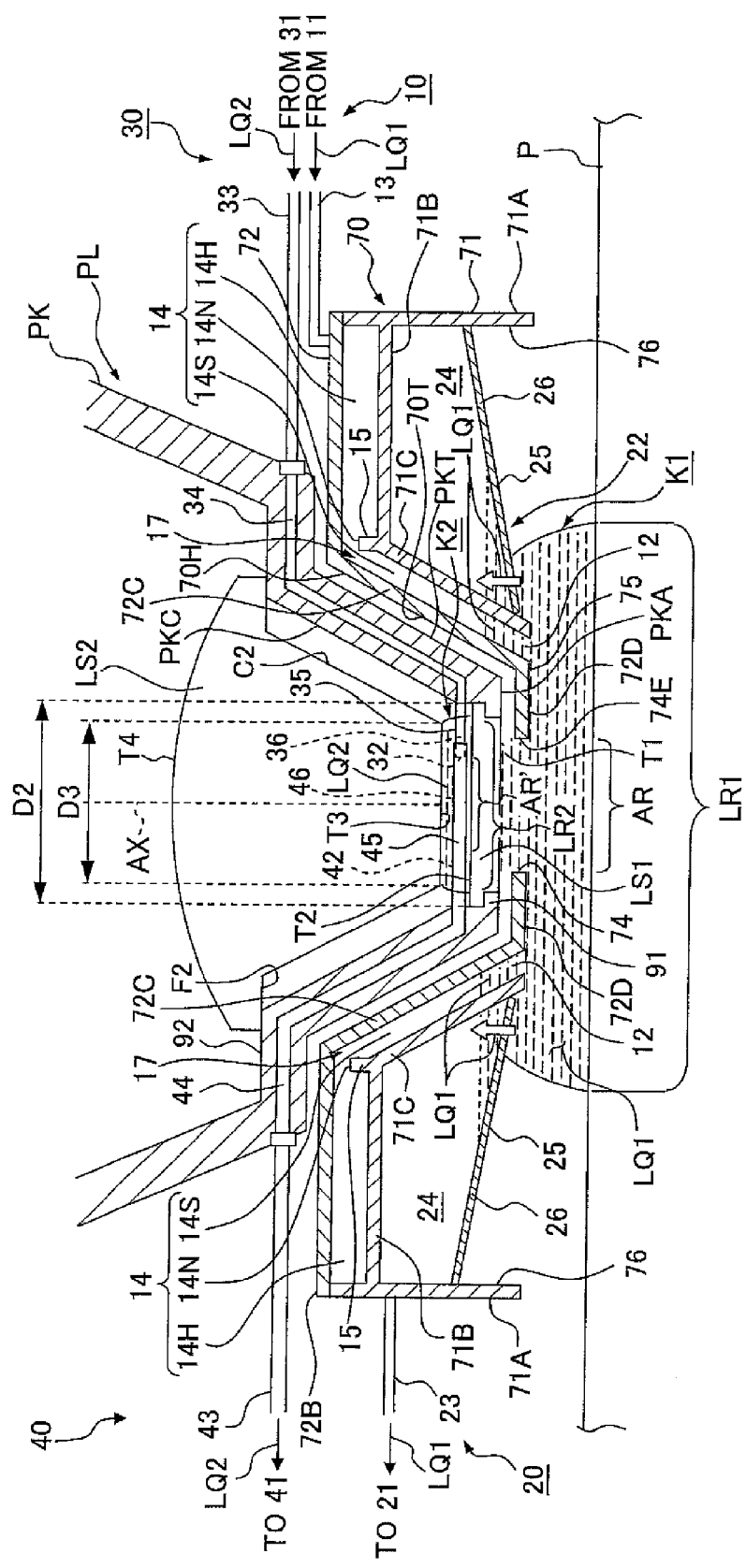
FIG. 4 shows a side sectional view illustrating those disposed in the vicinity of the nozzle member.

Next, the first liquid immersion mechanism 1 and the nozzle member 70 will be explained with reference to FIGS. 2, 3, and 4. FIG. 2 shows, with partial cutout, a schematic perspective view illustrating those disposed in the vicinity of the nozzle member 70. FIG. 3 shows a perspective view illustrating the nozzle member 70 as viewed from a lower position. FIG. 4 shows a side sectional view.

The nozzle member 70 is arranged in the vicinity of the end portion on the image plane side of the projection optical system PL. The nozzle member 70 is an annular member which is provided to surround the circumference of the projection optical system PL over the substrate P (substrate stage PST). In this embodiment, the nozzle member 70 constructs a part of the first liquid immersion mechanism 1. The nozzle member 70 has a hole 70H disposed at the central portion thereof in which the projection optical system PL can be arranged. As shown in FIG. 4, the first optical element LS1 and the second optical element LS2 are supported by the same barrel (support member) PK. In this embodiment, an inner side surface 70T of the hole 70H of the nozzle member 70 is provided opposite to a side surface PKT of the barrel PK. A gap is provided between the inner side surface 70T of the hole 70H of the nozzle member 70 and the side surface PKT of the barrel PK of the projection optical system PL. The gap is provided in order to isolate the projection optical system PL from the nozzle member 70 in terms of the vibration. Accordingly, the vibration, which is generated in the nozzle member 70, is prevented from being directly transmitted to the projection optical system PL.

The inner side surface of the hole 70H of the nozzle member 70 is lyophobic or liquid-repellent (water-repellent) with respect to the liquid LQ. This suppresses any inflow of the liquid LQ into the gap between the side surface of the projection optical system PL and the inner side surface of the nozzle member 70.

Those formed on the lower surface of the nozzle member 70 include a liquid supply port 12 for supplying the first liquid LQ1, and a liquid recovery port 22 for recovering the first liquid LQ1. In the following description, the liquid supply port 12 of the first liquid immersion mechanism 1 is appropriately referred to as "first supply port 12", and the liquid recovery port 22 of the first liquid immersion mechanism 1 is appropriately referred to as "first recovery port 22".

Those formed in the nozzle member 70 include a first supply flow passage 14 which is connected to the first supply port 12, and a first recovery flow passage 24 which is connected to the first recovery port 22. The other end of the first supply tube 13 is connected to the first supply flow passage 14. The other end of the first recovery tube 23 is connected to the first recovery flow passage 24. The first supply port 12, the first supply flow passage 14, and the first supply tube 13 construct parts of the first liquid supply mechanism 10 (first liquid immersion mechanism 1). The first recovery port 22, the first recovery flow passage 24, and the first recovery tube 23 construct parts of the first liquid recovery mechanism (first liquid immersion mechanism 1).

The first supply port 12 is provided, over the substrate P supported by the substrate stage PST, so as to oppose to the surface of the substrate P. The first supply port 12 is separated or away from the surface of the substrate P by a predetermined distance. The first supply port 12 is arranged to surround the projection area AR of the projection optical system PL onto which the exposure light beam EL is radiated. In this embodiment, the first supply port 12 is formed to have an annular slit-shaped configuration at the lower surface of the nozzle member 70 to surround the projection area AR as shown in FIG. 3. In this embodiment, the projection area AR is set to have a rectangular shape in which the Y axis direction (non-scanning direction) is the longitudinal direction.

The first supply flow passage 14 is provided with a buffer flow passage portion 14H which has a portion connected to the other end of the first supply port 13, and an inclined flow passage portion 14S which has an upper end connected to the buffer flow passage portion 14H and which has a lower end connected to the first supply port 12. The inclined flow passage portion 14S has a shape corresponding to the first supply port 12, and its cross section taken along the XY plane is formed to have an annular slit-shaped configuration to surround the first optical element LS1. The inclined flow passage portion 14S has an angle of inclination corresponding to the side surface of the first optical element LS1 arranged inside. As appreciated from FIG. 4, the inclined flow passage portion 14S is formed such that the spacing distance with respect to the surface of the substrate P is increased at positions away farther from the optical axis AX of the projection optical system PL as viewed in a side sectional view.

The buffer flow passage portion 14H is a space which is provided outside of the inclined flow passage portion 14S to surround the upper end portion of the inclined flow passage portion 14S and which is formed to expand in the XY direction (horizontal direction). The inner side of the buffer flow passage portion 14H (side on the optical axis AX) is connected to the upper end of the inclined flow passage portion 14S. The connecting section thereof is an angular corner portion 17. A bank portion 15, which is formed to surround the upper end of the inclined flow passage portion 14S, is provided in the vicinity of the connecting section (angular corner section) 17, specifically in the inner area (on the side of the optical axis AX) of the buffer flow passage portion 14H. The bank portion 15 is provided to protrude in the +Z direction from the bottom surface of the buffer flow passage portion 14H. A narrow flow passage portion 14N, which is narrower than the buffer flow passage portion 14H, is defined between the bank portion 15 and the upper surface (top plate portion 72B described later on) of the nozzle member.

In this embodiment, the nozzle member 70 is formed by combining a first member 71 and a second member 72. Each of the first and second members 71, 72 can be formed of, for example, aluminum, titanium, stainless steel, duralumin, or any alloy containing at least two of them.

The first member 71 has a side plate portion 71A, a top plate portion 71B which has its outer end connected at an upper predetermined position of the side plate portion 71A, an inclined plate portion 71C which has its upper end connected to an inner end of the top plate portion 71B, and a bottom plate portion 71D (see FIG. 3) which is connected to a lower end of the inclined plate portion 71C. The respective plate portions are joined to one another and integrated as one body. The second member 72 has a top plate portion 72B which has its outer end connected to an upper end of the first member 71, an inclined plate portion 72C which has its upper end connected to an inner end of the top plate portion 72B, and a bottom plate portion (plate portion) 72D which is connected to a lower end of the inclined plate portion 72C. The respective plate portions are joined to one another and integrated as one body. The bottom surface of the buffer flow passage portion 14H is formed by the top plate portion 71B of the first member 71. The ceiling surface of the buffer flow passage portion 14H is formed by the lower surface of the top plate portion 72B of the second member 72. The bottom surface of the inclined flow passage portion 14S is formed by the upper surface of the inclined plate portion 71C of the first member 71 (surface directed in the direction toward the projection optical system PL). The ceiling surface of the inclined flow passage portion 14S is formed by the lower surface of the inclined plate portion 72C of the second member 72 (surface directed in the direction opposite to the projection optical system PL). Each of the inclined plate portion 71C of the first member 71 and the inclined plate portion 72C of the second member 72 is formed to be mortar-shaped. The slit-shaped supply flow passage 14 is formed by combining the first and second members 71, 72. The outer portion of the buffer flow passage portion 14H is closed by the upper area of the side plate portion 71A of the first member 71. The upper surface of the inclined plate portion 72C of the second member 72 (i.e., the inner side surface 70T of the nozzle member 70) is opposed to the side surface PKT of the barrel PK of the projection optical system PL.

The first recovery port 22 is provided so that the first recovery port 22 is opposed to the surface of the substrate P over (above) the substrate P supported by the substrate stage PST. The first recovery port 22 is away from the surface of the substrate P by predetermined distances. The first recovery port 22 is provided outside the first supply port 12 separately farther from the projection area AR of the projection optical system PL as compared with the first supply port 12. The first recovery port 22 is formed to surround the first supply port 12 and the projection area AR onto which the exposure light beam EL is radiated. Specifically, a space 24, which is open downwardly, is formed by the side plate portion 71A, the top plate portion 71B, and the inclined plate portion 71C of the first member 71. The first recovery port 22 is formed by the opening of the space 24. The first recovery flow passage 24 is formed by the space 24. The other end of the first recovery tube 23 is connected to a part of the first recovery flow passage (space) 24.

A porous member or perforated member 25, which has a plurality of pores, is arranged in the first recovery port 22 so that the first recovery port 22 is covered therewith. The porous member 25 is formed of a mesh member having a plurality of pores. The porous member 25 can be constructed, for example, with a mesh member formed with a honeycomb pattern composed of a plurality of substantially hexagonal pores. The porous member 25 is formed to be thin plate-shaped, which has, for example, a thickness of about 100 μm.

The porous member 25 can be formed by performing a perforating processing to a plate member which is to serve as a base member for the porous member formed of, for example, stainless steel (for example, SUS 316). A plurality of thin plate-shaped porous members 25 can be laminated and arranged in the first recovery port 22 as well. The porous member 25 may be subjected to a surface treatment to suppress the elution of any impurity to the first liquid LQ1 or a surface treatment to enhance the lyophilic or liquid-attracting property. Such a surface treatment includes a treatment in which chromium oxide is adhered to the porous member 25, including, for example, the "GOLDEP WHITE" treatment or the "GOLDEP" treatment provided by Kobelco Eco-Solutions Co., Ltd. When the surface treatment as described above is performed, it is possible to avoid the inconvenience which would be otherwise caused, for example, such that any impurity is eluted from the porous member 25 to the first liquid LQ1. The surface treatment as described above may be also performed to the nozzle member 70 (first and second members 71, 72). The porous member 25 may be formed by using a material (for example, titanium) with which any impurity is hardly eluted to the first liquid LQ1.

The nozzle member 70 has a rectangular shape as viewed in a plan view. As shown in FIG. 3, the first recovery port 22 is formed to be frame-shaped (having a shape of "□" (polygon)) as viewed in a plan view to surround the projection area AR and the first supply port 12 on the lower surface of the nozzle member 70. The thin plate-shaped porous member 25 is arranged in the first recovery port 22. The bottom plate portion 71D of the first member 71 is arranged between the first recovery port 22 (porous member 25) and the first supply port 12. The first supply port 12 is formed to be annular slit-shaped as viewed in a plan view between the bottom plate portion 71D of the first member 71 and the bottom plate portion 72D of the second member 72.

The surfaces (lower surfaces) of the bottom plate portions 71D, 72D of the nozzle member 70, which are opposed to the substrate P respectively, are flat surfaces which are parallel to the XY plane. That is, the nozzle member 70 is provided with the bottom plate portions 71D, 72D having the lower surfaces which are formed to be opposed to the surface of the substrate P (XY plane) supported by the substrate stage PST, and substantially in parallel to the surface of the substrate P. In this embodiment, the lower surface of the bottom plate portion 71D is substantially flush with the lower surface of the bottom plate portion 72D. At this portion, the gap is the smallest with respect to the surface of the substrate P placed on the substrate stage PST. Accordingly, the first liquid LQ1 can be satisfactorily retained between the substrate P and the bottom surfaces of the bottom plate portions 71D, 72D to form the first liquid immersion area LR1. In the following description, the lower surfaces (flat portions) of the bottom plate portions 71D, 72D, which are formed to be opposed to the surface of the substrate P supported by the substrate stage PST, and substantially in parallel to the surface of the substrate P (XY plane), are appropriately referred to as "land surface 75" in combination.

The land surface 75 is the surface which is included in the nozzle member 70 and which is arranged at the position nearest to the substrate P supported by the substrate stage PST. In this embodiment, the lower surface of the bottom plate portion 71D and the lower surface of the bottom plate portion 72D are collectively designated as the land surface 75, because the lower surface of the bottom plate portion 71D is substantially flush with the lower surface of the bottom plate portion 72D. However, the porous member 25 may be also arranged on the lower surface of the bottom plate portion 71D to provide a part of the first recovery port 22. In this arrangement, only the lower surface of the bottom plate portion 72D is the land surface 75.

The porous member 25 has a lower surface 26 which is opposed to the substrate P supported by the substrate stage PST. The porous member 25 is provided in the first recovery port 22 so that the lower surface 26 is inclined with respect to the surface of the substrate P supported by the substrate stage PST (i.e., the XY plane). That is, the porous member 25, which is provided in the first recovery port 22, has the inclined surface (lower surface) 26 which is opposed to the surface of the substrate P supported by the substrate stage PST. The first liquid LQ1 is recovered via the inclined surface 26 of the porous member 25 arranged in the first recovery port 22. That is, in this arrangement, the first recovery port 22 is formed on the inclined surface 26. The first recovery port 22 is formed to surround the projection area AR onto which the exposure light beam EL is radiated. Therefore, in this arrangement, the inclined surface 26 of the porous member 25 arranged in the first recovery port 22 is formed to surround the projection area AR onto which the exposure light beam EL is radiated.

The inclined surface 26 of the porous member 25 opposed to the substrate P is formed such that the spacing distance with respect to the surface of the substrate P is increased at positions separated farther from the optical axis AX of the projection optical system PL (exposure light beam EL). As shown in FIG. 3, the first recovery port 22 is formed to have a shape of "□" (polygon) as viewed in a plan view in this embodiment. Four porous members 25A to 25D are combined and arranged in the first recovery port 22. In particular, the porous members 25A, 250, which are arranged on the both sides in the X axis direction (scanning direction) with respect to the projection area AR respectively, are arranged so that the spacing distances with respect to the surface of the substrate P are increased at positions separated farther from the optical axis AX, with the surfaces thereof crossing at right angles with respect to the XZ plane. The porous members 25B, 25D, which are arranged on the both sides in the Y axis direction with respect to the projection area AR respectively, are arranged so that the spacing distances with respect to the surface of the substrate P are increased at positions separated farther from the optical axis AX, with the surfaces thereof crossing at right angles with respect to the YZ plane.

The lower surface of the bottom plate portion 71D connected to the lower end of the inclined plate portion 71C of the first member 71 and the lower end of the side plate portion 71A are provided to have approximately the same position (height) in the Z axis direction. The porous member 25 is attached to the first recovery port 22 of the nozzle member 70 so that the inner edge of the inclined surface 26 has approximately the same height as that of the lower surface (land surface 75) of the bottom plate portion 71D, and the inner edge of the inclined surface 26 is continuous to the lower surface (land surface 75) of the bottom plate portion 71D. That is, the land surface 75 is formed continuously to the inclined surface 26 of the porous member 25. The porous member 25 is arranged so that the spacing distances are increased with respect to the surface of the substrate P at positions separated farther from the optical axis AX. A wall portion 76, which is formed by a partial area of the lower portion of the side plate portion 71A, is provided outside the outer edge of the inclined surface 26 (porous member 25). The wall portion 76 is provided at the circumferential edge of the porous member 25 (inclined surface 26) to surround the porous member 25. The wall portion 76 is provided outside the first recovery port 22 with respect to the projection area AR in order to suppress the leakage of the first liquid LQ1.

A part of the bottom plate portion 72D for forming the land surface 75 is arranged between the substrate P and the lower surface T1 of the first optical element LS1 of the projection optical system PL in relation to the Z axis direction. That is, a part of the bottom plate portion 72D for forming the land surface 75 is provided under the lower surface T1 of the optical element LS1 of the projection optical system PL. An opening 74, through which the exposure light beam EL passes, is formed at a central portion of the bottom plate portion 72D which forms the land surface 75. The opening 74 has a shape corresponding to the projection area AR. In this embodiment, the opening 74 is formed to have an elliptical shape in which the Y axis direction (non-scanning direction) is the longitudinal direction. The opening 74 is formed to be larger or greater than the projection area AR. The exposure light beam EL, which has passed through the projection optical system PL, can arrive at the surface of the substrate P without being blocked or shielded by the bottom plate portion 72D. That is, the bottom plate portion 72D, which forms the land surface 75, is arranged so that the bottom plate portion 72D is provided under the lower surface T1 of the first optical element LS1 to surround the optical path for the exposure light beam EL at the position at which the optical path for the exposure light beam EL is not disturbed. In other words, the land surface 75 is arranged to surround the projection area AR between the substrate P and the lower surface T1 of the first optical element LS1. The bottom plate portion 72D is arranged opposite to the surface of the substrate P with the lower surface thereof being the land surface 75. The bottom plate portion 72D is provided to make no contact with the substrate P and the lower surface T1 of the first optical element LS1. An edge portion 74E of the opening 74 may be formed to be right-angled, acute-angled, or circular arc-shaped.

In this arrangement, the land surface 75 is arranged between the projection area AR onto which the exposure light beam EL is radiated and the inclined surface 26 of the porous member 25 which is arranged in the first recovery port 22. In this arrangement, the first recovery port 22 is arranged to surround the land surface 75 in the outside of the land surface 75 with respect to the projection area AR. In this arrangement, the first supply port 12 is arranged outside the land surface 75 (bottom plate portion 72D) with respect to the projection area AR. In this arrangement, the first supply port 12 is provided between the first recovery port 22 and the projection area AR of the projection optical system PL. The first liquid LQ1 for forming the first liquid immersion area LR1 is supplied, via the first supply port 12, between the first recovery port 22 and the projection area AR of the projection optical system PL.

This embodiment adopts such an arrangement that the first recovery port 22 is formed to have a shape of "☐" (polygon) to surround the land surface 75. However, the first recovery port 22 may be arranged such that the first recovery port 22 does not surround the land surface 75, provided that the first recovery port 22 is disposed outside the land surface 75 with respect to the projection area AR. For example, the first recovery port 22 may be arranged in a divided manner in predetermined areas, of the lower surface of the nozzle member 70, which are disposed outside the land surface 75 on the both sides in the scanning direction (X axis direction) with respect to the projection area AR. Alternatively, the first recovery port 22 may be arranged in a divided manner in predetermined areas, of the lower surface of the nozzle member 70, which are disposed outside the land surface 75 on the both sides in the non-scanning direction (Y axis direction) with respect to the projection area AR. On the other hand, when the first recovery port 22 is arranged to surround the land surface 75, it is possible to recover the first liquid LQ1 via the first recovery port 22 more reliably.

As described above, the land surface 75 is arranged between the substrate P and the lower surface T1 of the first optical element LS1. The distance between the surface of the substrate P and the lower surface T1 of the first optical element LS1 is longer than the distance between the land surface 75 and the surface of the substrate P. That is, the lower surface T1 of the first optical element LS1 is formed at the position higher than that of the land surface 75 (to be far from the substrate P).

At least a part of the first recovery port 22 including the inclined surface 26 formed continuously to the land surface 75 is arranged opposite to the surface of the substrate P between the substrate P and the lower surface T1 of the first optical element LS1 in relation to the Z axis direction. That is, at least a part of the first recovery port 22 is provided at the position lower than that of the lower surface T1 of the first optical element LS1 (to be near to the substrate P). In this arrangement, the first recovery port 22 including the inclined surface 26 is arranged around the lower surface T1 of the first optical element LS1.

In this embodiment, the distance between the lower surface T1 of the first optical element LS1 and the upper surface T2 of the first optical element LS1 is about 4 mm. The distance between the substrate P and the lower surface T1 of the first optical element LS1, i.e., the thickness of the liquid LQ1 in the optical path for the exposure light beam EL is about 3 mm. The distance between the land surface 75 and the substrate P is about 1 mm. The first liquid LQ1 of the first liquid immersion area LR1 makes contact with the land surface 75. The first liquid LQ1 of the first liquid immersion area LR1 also makes contact with the lower surface T1 of the first optical element LS1. That is, the land surface 75 and the lower surface T1 of the first optical element LS1 serve as the liquid contact surfaces to make contact with the first liquid LQ1 of the first liquid immersion area LR1.

The distance between the lower surface T1 of the first optical element LS1 and the upper surface T2 of the first optical element LS1 is not limited to 4 mm as described above, and can be set within a range of 3 to 10 mm. The distance between the substrate P and the lower surface T1 of the first optical element LS1 is not limited to 3 mm as described above, and can be set within a range of 1 to 5 mm, considering the absorption of the exposure light beam EL by the liquid LQ1 and the flow of the liquid LQ1 in the first space K1. Further, the distance between the land surface 75 and the substrate P is not limited to 1 mm as described above as well, and can be set within a range of 0.5 to 1 mm.

The lower surface (liquid contact surface) T1 of the first optical element LS1 of the projection optical system PL has the liquid-attracting (hydrophilic) property. In this embodiment, the liquid-attracting treatment is performed to the lower surface T1. The lower surface T1 of the first optical element LS1 is liquid-attractive by the aid of the liquid-attracting treatment. The liquid-attracting treatment is also performed to the land surface 75 to have the liquid-attracting property. The liquid-repelling treatment may be performed to a part of the land surface 75 to have the liquid-repelling property.

The liquid-attracting treatment, which is applied in order to make a predetermined member such as the lower surface T1 of the first optical element LS1 to be liquid-attractive, includes, for example, a treatment for adhering a liquid-attracting material such as $MgF_2$, $Al_2O_3$, and $SiO_2$. Alternatively, as for the liquid-attracting treatment (water-attracting treatment), the liquid-attracting property (hydrophilic property) can be also performed, for example, by forming a thin film with a substance such as alcohol having a molecular structure with large polarity provided with the OH group, because the liquid LQ is water having large polarity in this embodiment. Further, when the first optical element LS1 is formed of calcium fluoride or silica glass, it is possible to obtain the satisfactory liquid-attracting property even when no liquid-attracting treatment is performed, because calcium fluorite or silica glass has the high affinity for water. It is possible to allow the first liquid LQ1 to make tight contact with the substantially entire surface of the lower surface T1 of the first optical element LS1. A part of the land surface 75 (for example, the lower surface of the bottom plate portion 71D) may be liquid-repellent with respect to the first liquid LQ1.

The liquid-repelling treatment, which is adopted in order to make a part of the land surface 75 to be liquid-repellent, includes, for example, a treatment to adhere a liquid-repelling material including, for example, fluorine-based materials such as polytetrafluoroethylene (Teflon (trade name)), acrylic resin materials, and silicon-based resin materials. When the upper surface 91 of the substrate stage PST is made to be liquid-repellent, then it is possible to suppress the outflow of the first liquid LQ1 to the outside of the substrate P (outside of the upper surface 91) during the liquid immersion exposure, it is possible to smoothly recover the liquid LQ1 after the liquid immersion exposure as well, and it is possible to avoid the inconvenience which would be otherwise caused such that the first liquid LQ1 remains on the upper surface 91.

In order to supply the first liquid LQ1 onto the substrate P, the control unit CONT drives the first liquid supply section 11 to feed the first liquid LQ1 from the first liquid supply section 11. The first liquid LQ1, which is fed from the first liquid supply section 11, flows through the first supply tube 13, and then the first liquid LQ1 flows into the buffer flow passage portion 14H of the first supply flow passage 14 of the nozzle member 70. The buffer flow passage portion 14H is the space which is expanded in the horizontal direction. The first liquid LQ1, which has flown into the buffer flow passage portion 14H, flows to expand in the horizontal direction. The bank portion 15 is formed in the inner area (on the side of the optical axis AX) as the downstream side of the flow passage of the buffer flow passage portion 14H. Therefore, the first liquid LQ1 is expanded over the entire region of the buffer flow passage portion 14H, and then the first liquid LQ1 is once pooled. After the first liquid LQ1 is pooled in an amount not less than a predetermined amount in the buffer flow passage portion 14H (after the liquid level of the first liquid LQ1 is not less than the height of the bank portion 15), the first liquid LQ1 flow into the inclined flow passage portion 14S via the narrow flow passage portion 14N. The first liquid LQ1, which has flown into the inclined flow passage portion 14S, flows downwardly along the inclined flow passage portion 14S. The first liquid LQ1 is supplied from the first supply port 12 onto the substrate P arranged on the image plane side of the projection optical system PL. The first supply port 12 supplies the first liquid LQ1 onto the substrate P from the position over the substrate P.

Owing to the provision of the bank portion 15 as described above, the first liquid LQ1, which has flown out from the buffer flow passage portion 14H, is supplied onto the substrate P substantially uniformly from the entire region of the first supply port 12 formed annularly to surround the projection area AR. That is, if the bank portion 15 (narrow flow passage portion 14N) is not formed, the flow rate of the first liquid LQ1 allowed to flow through the inclined flow passage portion 14S is greater in the area disposed in the vicinity of the connecting section between the first supply tube 13 and the buffer flow passage portion 14H than in the other areas. Therefore, the liquid supply amount for the surface of the substrate P is sometimes nonuniform at respective positions of the first supply port 12 which is formed annularly. However, the buffer flow passage portion 14H is formed to be provided with the narrow flow passage portion 14N, and the liquid supply to the first supply port 12 is started after the first liquid LQ1 of the amount not less than the predetermined amount is pooled in the buffer flow passage portion 14H. Therefore, the first liquid LQ1 can be supplied onto the substrate P in the state in which the flow rate distribution and the flow velocity distribution are uniformized at the respective positions of the first supply port 12. Any bubble tends to remain, for example, upon the start of the supply in the vicinity of the angular corner portion 17 of the first supply flow passage 14. However, the narrow flow passage portion 14N is formed by narrowing the first supply flow passage 14 in the vicinity of the angular corner portion 17. Accordingly, the high velocity is obtained for the flow rate of the first liquid LQ1 flowing through the narrow flow passage portion 14N. The bubble can be discharged to the outside of the first supply flow passage 14 via the first supply port 12 in accordance with the flow of the first liquid LQ1 having the high velocity. When the liquid immersion exposure operation is executed after discharging the bubble, the exposure process can be performed in the state in which any bubble is absent in the first liquid immersion area LR1. The bank portion 15 may be provided to protrude in the −Z direction from the ceiling surface of the buffer flow passage portion 14H. In principle, it is enough that the narrow flow passage portion 14N, which is narrower than the buffer flow passage portion 14H, is provided on the downstream side of the flow passage as compared with the buffer flow passage portion 14H.

The height of the bank portion 15 may be partially lowered (raised). When the bank portion 15 is provided with the area which partially has any different height, the supply of the first liquid LQ1 from the first supply port 12 can be started at any partially different timing. Therefore, it is possible to avoid the remaining of the gas (bubble) in the liquid for forming the liquid immersion area AR2 when the supply of first liquid LQ1 is started. Alternatively, the buffer flow passage portion 14H may be divided into a plurality of flow passages to successfully supply the liquid LQ in different amounts depending on the positions of the slit-shaped liquid supply port 12.

In order to recover the liquid LQ1 from the surface of the substrate P, the control unit CONT drives the first liquid recovery section 21. When the first liquid recovery section 21, which has the vacuum system, is driven, the liquid LQ1, which is disposed on the substrate P, is allowed to flow into the first recovery flow passage 24 via the first recovery port 22 arranged with the porous member 25. When the first liquid LQ1 in the first liquid immersion area LR1 is recovered, the lower surface (inclined surface) 26 of the porous member 25 makes contact with the first liquid LQ1. The first recovery port 22 (porous member 25) is provided over (above) the substrate P to oppose to the substrate P. Therefore, the first recovery port 22 (porous member 25) recovers the first liquid LQ1 from the surface of the substrate P from the position thereover. The first liquid LQ1, which has flown into the first recovery flow passage 24, flows through the first recovery tube 23, and then the first liquid LQ1 is recovered by the first liquid recovery section 21.

Next, the second liquid immersion mechanism 2 will be explained with reference to FIGS. 4, 5, 6, and 7.

With reference to FIG. 4, the first optical element LS1 and the second optical element LS2 are supported by the same barrel (support member) PK, and they are supported in the substantially stationary state with respect to the optical path for the exposure light beam EL. The first optical element LS1 is supported by a first support section 91 which is provided at the lower end of the barrel PK. The second optical element LS2 is supported by a second support section 92 which is provided over (above) the first support section 91 in the barrel PK. A flange portion F2, which serves as a support objective portion, is provided at an upper portion of the second optical element LS2. The second support section 92 supports the second optical element LS2 by supporting the flange portion F2. The first optical element LS1 is easily attachable/detachable with respect to the first support section 91 of the barrel PK. That is, the first optical element LS1 is provided exchangeably. It is also allowable that the first support section 91, which supports the first optical element LS1, may be attachable/detachable with respect to the second support section 92, and the first support section 91 and the first optical element LS1 may be exchanged together.

The first optical element LS1 is a parallel flat plate, in which the lower surface T1 and the upper surface T2 are in parallel to one another. The lower surface T1 and the upper surface T2 are substantially in parallel to the XY plane. The surface of the substrate P supported by the substrate stage PST is substantially in parallel to the XY plane. Therefore, the lower surface T1 and the upper surface T2 are substantially in parallel to the surface of the substrate P supported by the substrate stage PST. The lower surface T1 of the first optical element LS1 supported by the first support section 91 is substantially flush with the lower surface PKA of the barrel PK. The bottom plate portion 72D, which forms the land surface 75, extends under the lower surface T1 of the first optical element LS1 and the lower surface PKA of the barrel PK.

The lower surface T3 of the second optical element LS2 is formed to be flat surface-shaped. The lower surface T3 of the second optical element LS2 supported by the second support section 92 is substantially in parallel to the upper surface T2 of the first optical element LS1 supported by the first support section 91. On the other hand, the upper surface T4 of the second optical element LS2 is formed to be convex toward the object plane (toward the mask M), and has a positive refractive power. Accordingly, the reflection loss of the light beam (exposure light beam EL) allowed to come into the upper surface T4 is reduced. Consequently, the large image side numerical aperture of the projection optical system PL is secured. The second optical element LS2, which has the refractive power (lens function), is supported by the second support section 92 of the barrel PK in the state of being positioned satisfactorily.

In this embodiment, the outer diameter D3 of the lower surface T3 of the second optical element LS2 opposed to the first optical element LS1 is formed to be smaller than the outer diameter D2 of the upper surface T2 of the first optical element LS1.

As described above, the exposure light beam EL passes through the respective predetermined areas of the upper surface T4 and the lower surface T3 of the second optical element LS2. Further, the exposure light beam EL passes through the respective predetermined areas of the upper surface T2 and the lower surface T1 of the first optical element LS1.

For example, the connecting portion between the barrel PK and the first optical element LS1 is sealed. That is, the first space K1 disposed on the side of the lower surface T1 of the first optical element LS1 and the second space K2 disposed on the side of the upper surface T2 of the first optical element LS1 are the spaces which are independent from each other. The flow of the liquid is prohibited between the first space K1 and the second space K2. As described above, the first space K1 is the space between the first optical element LS1 and the substrate P. The first liquid immersion area LR1 of the first liquid LQ1 is formed in the first space K1. On the other hand, the second space K2 is a part of the internal space of the barrel PK. The second space K2 is the space disposed between the upper surface T2 of the first optical element LS1 and the lower surface T3 of the second optical element LS2 arranged thereover. The second liquid immersion area LR2 of the second liquid LQ2 is formed in the second space K2. A gap is provided between the side surface C2 of the second optical element LS2 and the inner side surface PKC of the barrel PK.

As shown in FIG. 4, the other end of a second supply tube 33 is connected to one end of a second supply flow passage 34 formed in the barrel PK. On the other hand, the other end of the second supply flow passage 34 of the barrel PK is connected to a supply member 35 arranged inside (in the internal space of) the barrel PK. The supply member 35, which is arranged inside the barrel PK, has a liquid supply port 32 for supplying the second liquid LQ2 to the second space K2. A supply flow passage 36, through which the second liquid LQ2 flows, is formed in the supply member 35. The connecting portion of the second supply flow passage 34 with respect to the supply member 35 (supply flow passage 36) is provided in the vicinity of the second space K2 on the inner side surface PKC of the barrel PK.

The other end of the second recovery tube 43 is connected to one end of a second recovery flow passage 44 formed in the barrel PK. On the other hand, the other end of the second recovery flow passage 44 of the barrel PK is connected to a recovery member 45 arranged inside (in the internal space of) the barrel PK. The recovery member 45, which is arranged inside the barrel PK, has liquid recovery ports 42 for recovering the second liquid LQ2 from the second space K2. A recovery flow passage 46, through which the second liquid LQ2 flows, is formed in the recovery member 45. The connecting portion of the second recovery flow passage 44 with respect to the recovery member 45 (recovery flow passage 46) is provided in the vicinity of the second space K2 on the inner side surface PKC of the barrel PK.

The liquid supply port 32, the supply member 35 (supply flow passage 36), the second supply flow passage 34, and the second supply tube 33 construct a part of the second liquid supply mechanism 30 (second liquid immersion mechanism 2). The liquid recovery ports 42, the recovery member 45 (recovery flow passage 46), the second recovery flow passage 44, and the second recovery tube 43 construct a part of the second liquid recovery mechanism 40 (second liquid immersion mechanism 2). In the following description, the liquid supply port 32 of the second liquid immersion mechanism 2 is appropriately referred to as "second supply port 32", and the liquid recovery port 42 of the second liquid immersion mechanism 2 is appropriately referred to as "second recovery port 42".

Figure 5:
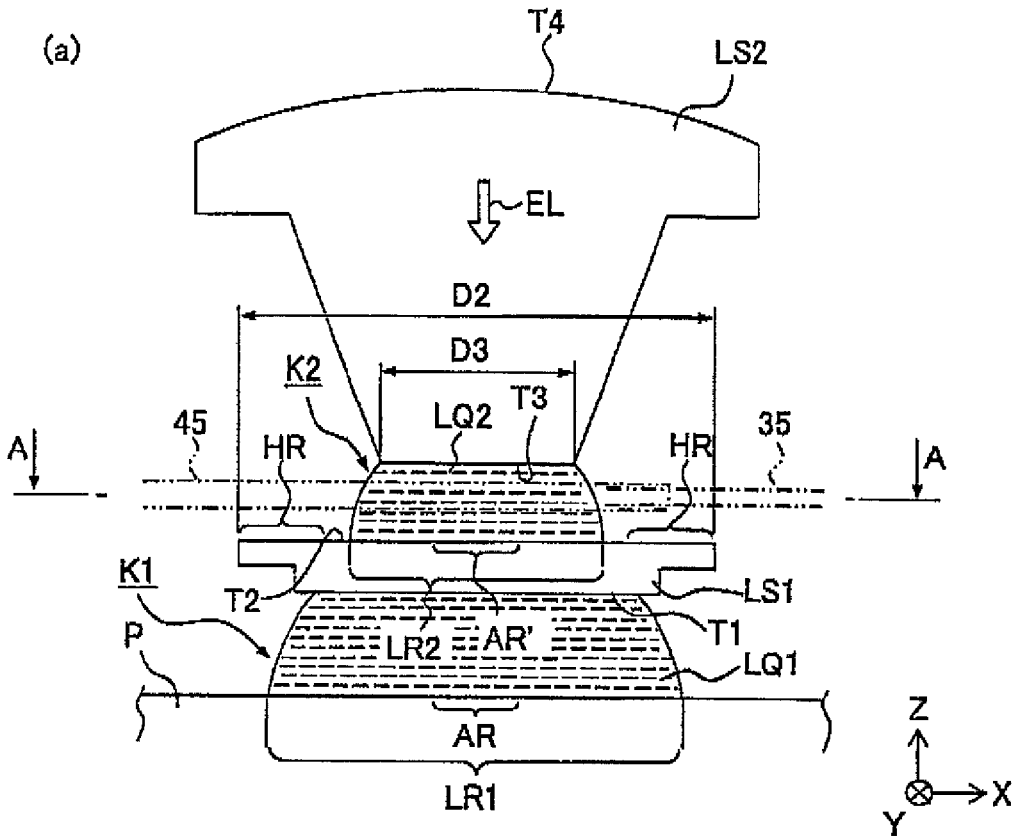
FIGS. 5(a) and 5(b) illustrate a second liquid immersion mechanism.
Figure 5:
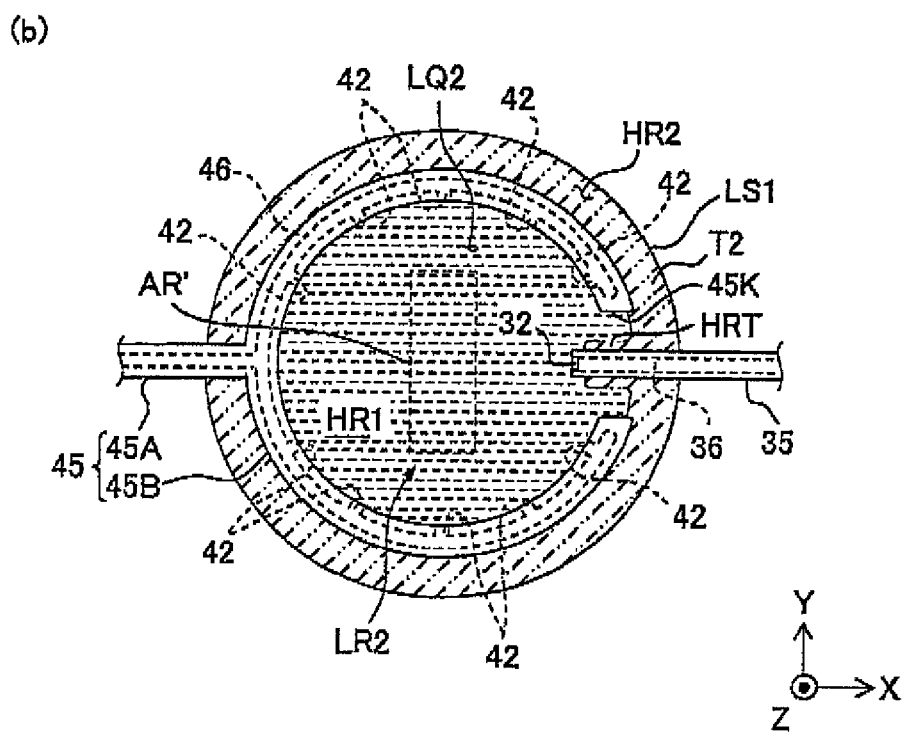

FIG. 5 illustrates the second liquid immersion mechanism 2 for forming the second liquid immersion area LR2, wherein FIG. 5(a) shows a side view, and FIG. 5(b) shows a view taken along a line A-A shown in FIG. 5(a). As shown in FIG. 5, the supply member 35 is constructed of a shaft-shaped member extending in the horizontal direction. In this embodiment, the supply member 35 is arranged on the +X side of the predetermined area AR' of the upper surface T2 of the first optical element LS1 through which exposure light beam EL passes. The supply member 35 is provided to extend in the X axis direction. One end of the supply flow passage 36 formed in the supply member 35 is connected to the other end of the second supply flow passage 34 (see FIG. 4) formed in the barrel PK. The other end of the supply flow passage 36 is connected to the second supply port 32. The second supply port 32 is formed so that the second supply port 32 is directed toward the −X side. The second supply port 32 discharges the second liquid LQ2 substantially in parallel to the upper surface T2 of the first optical element LS1, i.e., substantially in parallel to the XY plane (in the lateral direction). The second supply port 32 of the second liquid immersion mechanism 2 is arranged in the second space K2. Therefore, the second liquid supply section 31 is connected to the second space K2, for example, via the second supply tube 33, the second supply flow passage 34, and the second supply port 32.

Gaps are provided between the supply member 35 and the upper surface T2 of the first optical element LS1 and between the supply member 35 and the lower surface T3 of the second optical element LS2 respectively. That is, the supply member 35 is supported by the barrel PK or a predetermined support mechanism so that the supply member 35 is in a non-contact state with respect to the first optical element LS1 and the second optical element LS2 respectively. Accordingly, the vibration, which is generated in the supply member 35, is prevented from being directly transmitted to the first and second optical elements LS1, LS2. When the supply member 35 is allowed to be in the non-contact state with respect to the first optical element LS1 and the second optical element LS2 respectively, it is possible to suppress the change of the shape of each of the first optical element LS1 and the second optical element LS2. Thus, it is possible to maintain the high image formation performance of the projection optical system PL.

The supply member 35 is provided at the position at which the radiation of the exposure light beam EL is not disturbed, i.e., outside the predetermined area AR' of the upper surface T2 of the first optical element LS1 through which the exposure light beam EL passes. The second supply port 32 is arranged at the predetermined position between the predetermined area AR' and the edge portion of the upper surface T2 of the first optical element LS1 in the second space K2.

When the control unit CONT is operated to feed the second liquid LQ2 from the second liquid supply section 31 of the second liquid supply mechanism 30 in order to form the second liquid immersion area LR2, then the second liquid LQ2, which is fed from the second liquid supply section 31, flows through the second supply tube 33, and then the second liquid LQ2 flows into one end of the second supply flow passage 34 formed in the barrel PK. The liquid LQ2, which has flown into one end of the second supply flow passage 34, flows through the second supply flow passage 34, and then the liquid LQ2 flows into one end of the supply flow passage 36 of the supply member 35 connected to the other end thereof. The second liquid LQ2, which has flown into one end of the supply flow passage 36, flows through the supply flow passage 36, and then the second liquid LQ2 is supplied to the second space K2 via the second supply port 32. The second liquid LQ2, which has been supplied from the second supply port 32, locally forms the second liquid immersion area LR2 in only a partial area of the upper surface T2 of the first optical element LS1, the partial area being smaller than the upper surface T2 and the partial area being greater than the predetermined area AR' through which the exposure light beam EL passes. The second liquid LQ2, which has been supplied to the space between the first optical element LS1 and the second optical element LS2, is retained by the surface tension between the upper surface T2 of the first optical element LS1 and the lower surface T3 of the second optical element LS2. The second liquid LQ2 in the second liquid immersion area LR2 makes contact with the partial area of the upper surface T2 of the first optical element LS1, and the second liquid LQ2 makes contact with the substantially entire surface of the lower surface T3 of the second optical element LS2. As described above, the outer diameter D3 of the lower surface T3 of the second optical element LS2 is smaller than the outer diameter D2 of the upper surface T2 of the first optical element LS1. Therefore, the second liquid LQ2, with which the space between the first optical element LS1 and the second optical element LS2 is filled, can form the second liquid immersion area LR2 which is smaller than the upper surface T2 of the first optical element LS1, below the lower surface T3 of the second optical element LS2 (above the upper surface T2 of the first optical element LS1).

In this embodiment, the distance between the upper surface T2 of the first optical element LS1 and the lower surface T3 of the second optical element LS2, i.e., the thickness of the liquid LQ2 in the optical path for the exposure light beam EL is about 3 mm. However, the distance between the upper surface T2 of the first optical element LS1 and the lower surface T3 of the second optical element LS2 is not limited to 3 mm as described above, and can be set within a range of 0.5 to 5 mm considering the absorption of the exposure light beam EL by the liquid LQ2 and the flow of the liquid LQ2 in the second space K2.

Figure 6:
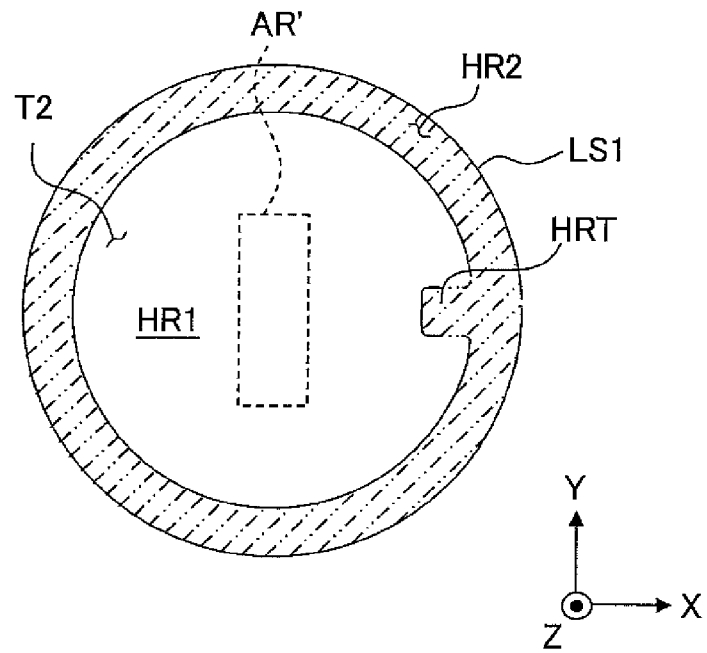
FIG. 6 shows a plan view illustrating a second surface of a first element.

As shown in FIG. 6, the surface of the first area HR1, which is the partial area to serve as the second liquid immersion area LR2 and which is included in the upper surface T2 of the first optical element LS1 facing the second space K2, has the affinity for the second liquid LQ2, the affinity being higher than the affinity for the second liquid LQ2 of the surface of the second area HR2 as the area around the first area HR1. That is, the contact angle of the surface of the first area HR1 with respect to the second liquid LQ2 is smaller than the contact angle of the surface of the second area HR2 with respect to the second liquid LQ2. Specifically, the surface of the second area HR2 is liquid-repellent with respect to the second liquid LQ2. Accordingly, when the second liquid immersion area LR2 of the second liquid LQ2 is formed in the partial area (first area HR1) of the upper surface T2 of the first optical element LS1, it is possible to avoid the inconvenience which would be otherwise caused such that the second liquid LQ2 outflows to the outside of the upper surface T2. The first area HR1 includes the predetermined area AR' through which the exposure light beam EL passes. When the surface of the first area HR1 including the predetermined area AR' is liquid-attractive, the second liquid LQ2 can be allowed to make tight contact with the surface of the first area HR1 satisfactorily.

In this embodiment, the liquid-repelling property is applied to the surface of the second area HR2 by performing the liquid-repelling treatment to the surface of the second area HR2. The liquid-repelling treatment, which is adopted in order to allow the surface of the second area HR2 to be liquid-repellent, includes, for example, a treatment to coat a liquid-repelling material including, for example, fluorine-based materials such as polytetrafluoroethylene, acrylic resin materials, and silicon-based resin materials, and a treatment to stuck a thin film formed of the liquid-repelling material as described above. In this embodiment, the surface of the second area HR2 is coated with "CYTOP" produced by Asahi Glass Co., Ltd.

In this embodiment, at least the first and second optical elements LS1, LS2, which make contact with the first and second liquids LQ1, LQ2 and which are included in the plurality of optical elements LS1 to LS7, are formed of silica glass. Silica glass has the high affinity for the first and second liquids LQ1, LQ2 as water. Accordingly, it is possible to allow the first and second liquids LQ1, LQ2 to make tight contact with the substantially entire regions of the first area HR1 of the upper surface T2 and the lower surface T1 as the liquid contact surfaces of the first optical element LS1 and the lower surface T3 as the liquid contact surface of the second optical element LS2. Therefore, it is possible to allow the first and second liquids LQ1, LQ2 to make tight contact with the liquid contact surfaces of the first and second optical elements LS1, LS2 to reliably fill the optical path between the second optical element LS2 and the first optical element LS1 with the second liquid LQ2 and reliably fill the optical path between the first optical element LS1 and the substrate P with the first liquid LQ1.

Silica glass is a material having the large refractive index. Therefore, for example, the size of the second optical element LS2 can be decreased. It is possible to realize compact sizes of the entire projection optical system PL and the entire exposure apparatus EX. Further, silica glass is water-resistant. Therefore, an advantage is obtained, for example, such that it is unnecessary to provide any protective film for the liquid contact surface.

At least one of the first and second optical elements LS1, LS2 may be calcium fluorite having the high affinity for water. For example, the optical elements LS3 to LS7 may be formed of calcium fluorite, and the optical elements LS1, LS2 may be formed of silica glass. All of the optical elements LS1 to LS7 may be formed of silica glass (or calcium fluorite).

The water-attracting (liquid-attracting) treatment, in which a liquid-attracting material such as $MgF_2$, $Al_2O_3$, and $SiO_2$ is adhered, may be performed to the liquid contact surfaces of the first and second optical elements LS1, LS2 including the first area HR1 of the upper surface T2 of the first optical element LS1 to further enhance the affinity for the first and second liquids LQ1, LQ2. Alternatively, as for the liquid-attracting treatment (water-attracting treatment), the hydrophilic property can be also applied to the liquid contact surfaces of the optical elements LS1, LS2, for example, by forming a thin film with a substance such as alcohol having a molecular structure with large polarity, because the first and second liquids LQ1, LQ2 are water having large polarity in this embodiment.

In this arrangement, the second area HR2, which is disposed around the first area HR1 including the predetermined area AR' of the upper surface T2 of the first optical element LS1 through which the exposure light beam EL passes, is liquid-repellent. However, it is also allowable that an area, which is disposed around a partial area including a predetermined area of the lower surface T3 of the second optical element LS2 through which the exposure light beam EL passes, may be liquid-repellent.

With reference to FIG. 5(b) again, the recovery member 45 includes a shaft portion 45A, and an annular portion 45B which is connected to the shaft portion 45A. The shaft portion 45A is provided to extend in the horizontal direction. In this embodiment, the shaft portion 45A is arranged on the −X side in relation to the predetermined area AR', and the shaft portion 45A is provided to extend in the X axis direction. The annular portion 45E is formed to be smaller than the edge portion of the upper surface T2 of the first optical element LS1, and a part of the annular portion 45B on the −X side is connected to the shaft portion 45A. On the other hand, a part of the annular portion 45E on the +X side is open or discontinuous, and the supply member 35 is arranged at an opening 45K.

The recovery flow passage 46, which corresponds to the shape of the recovery member 45, is formed in the recovery member 45. One end of the recovery flow passage 46, which is formed in the shaft portion 45A of the recovery member 45, is connected to the other end of the second recovery flow passage 44 (see FIG. 4) formed in the barrel PK. The annular recovery flow passage 46 is formed in the annular portion 45B of the recovery member 45 to surround the predetermined area AR'. The other end of the recovery flow passage 46 formed in the shaft portion 45A is connected to a part of the annular recovery flow passage 46 formed in the annular portion 45B.

The second recovery ports 42 are formed on the inner side surface of the annular portion 45B directed to the predetermined area AR'. The second recovery ports 42 are provided to recover the second liquid LQ2 from the second space K2. The plurality of second recovery ports 42 are provided on the inner side surface of the annular portion 45B to surround the second liquid immersion area LR2 formed on the upper surface T2 of the first optical element LS1. The plurality of second recovery ports 42, which are provided on the inner side surface of the annular portion 45B, are connected to the recovery flow passage 46 formed in the annular portion 45B. The second recovery ports 42 of the second liquid immersion mechanism 2 are arranged in the second space K2. Therefore, in this arrangement, the second liquid recovery section 41 is connected to the second space K2, via the second recovery tube 43, the second recovery flow passage 44, and the second recovery ports 42 or the like.

The recovery member 45 (annular portion 45B) is provided outside the predetermined area AR' at the position at which the radiation of the exposure light beam EL is not disturbed, i.e., at the position to surround the predetermined area AR' of the upper surface T2 of the first optical element LS1 through which the exposure light beam EL passes. The second recovery ports 42 are arranged at the predetermined positions between the predetermined area AR' and the edge portion of the upper surface T2 in the second space K2.

Gaps are provided between the recovery member 45 and the upper surface T2 of the first optical element LS1 and between the recovery member 45 and the lower surface T3 of the second optical element LS2 respectively. That is, the recovery member 45 is supported by the barrel PK or a predetermined support mechanism so that the recovery member 45 is in the non-contact state with respect to the first optical element LS1 and the second optical element LS2 respectively. Accordingly, the vibration, which is generated in the recovery member 45, is prevented from being directly transmitted to the first and second optical elements LS1, LS2.

When the second liquid LQ2 of the second liquid immersion area LR2 is recovered, the control unit CONT drives the second liquid recovery section 41 of the second liquid recovery mechanism 40. When the second liquid recovery section 41 having the vacuum system is driven, the second liquid LQ2 of the second liquid immersion area LR2 flows into the recovery flow passage 46 formed in the annular portion 45B of the recovery member 45 via the second recovery ports 42. The second recovery ports 42 are arranged to surround the second liquid immersion area LR2. Therefore, the second liquid LQ2 of the second liquid immersion area LR2 is recovered from the surrounding thereof via the second recovery ports 42. It is desirable that a porous member is also arranged for the second recovery ports 42 to suppress the vibration generated when the second liquid LQ2 is recovered.

Figure 7:
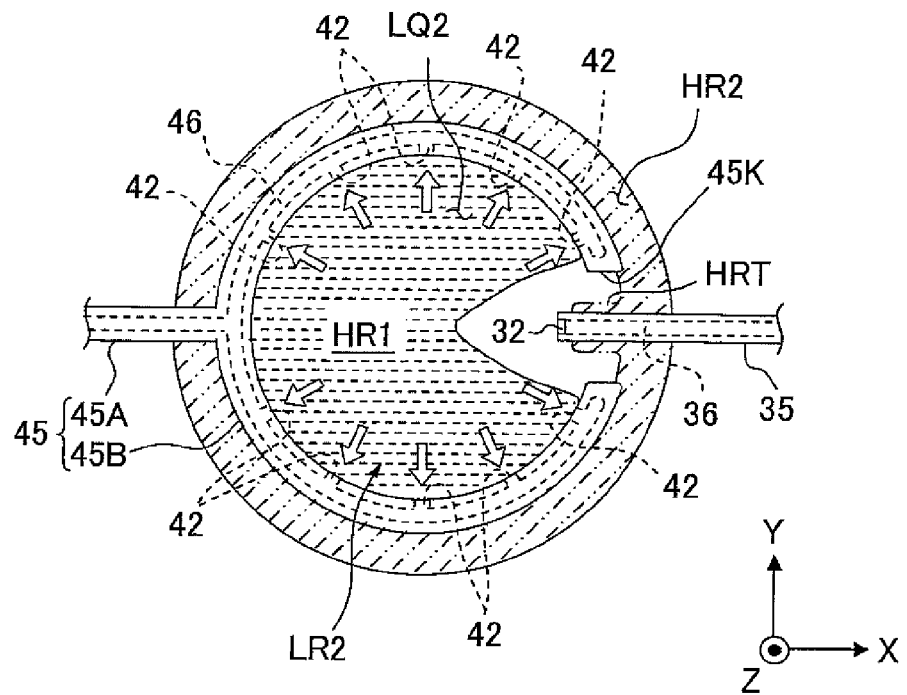
FIG. 7 illustrates the operation for recovering the second liquid by the second liquid immersion mechanism.

As shown in FIG. 6, a protruding area HRT, which protrudes inwardly (toward the predetermined area AR'), is provided for the second area HR2 having the liquid-repelling property of the upper surface T2 of the first optical element LS1. In this embodiment, the protruding area HRT is provided at the position corresponding to the opening 45K of the annular portion 45B of the recovery member 45. Accordingly, when the second liquid LQ2 is recovered via the second recovery ports 42 from the surrounding of the second liquid immersion area LR2 in a state in which the supply of the second liquid LQ2 from the second supply port 32 is stopped, the second liquid LQ2 of the second liquid immersion area LR2 is recovered via the second recovery ports 42 arranged around the second liquid immersion area LR2 so that the second liquid LQ2 is divided at the protruding area HRT as a base point, as schematically shown in FIG. 7. In this way, it is possible to avoid the inconvenience which would be otherwise caused, for example, such that the second liquid LQ2 is unsuccessfully recovered and the second liquid LQ2 remains, for example, at a central portion of the first area HR1. Therefore, it is possible to avoid the occurrence of the inconvenience resulting from the remaining second liquid LQ2, which would be otherwise caused, for example, such that the remaining second liquid LQ2 is vaporized, and any adhesion trace (so-called water mark) is formed on the upper surface T2.

In this embodiment, the protruding area HRT is provided at the position corresponding to the opening 45K of the annular portion 45B of the recovery member 45. However, the protruding area HRT may be provided at any position other than the position corresponding to the opening 45K. The protruding area HRT shown in the drawing is substantially rectangular as viewed in a plan view. However, it is possible to adopt any arbitrary shape including, for example, triangular and semicircular shapes.

The second liquid LQ2, which has flown into the recovery flow passage 46 formed in the annular portion 45B, is collected in the recovery flow passage 46 formed in the shaft portion 45A, and then the second liquid LQ2 flows into the second recovery flow passage 44 formed in the barrel PK. The second liquid LQ2, which has flown through the second recovery flow passage 44, is sucked and recovered by the second liquid recovery section 41 via the second recovery tube 43.

Next, an explanation will be made about a method for exposing the substrate P with the image of the pattern of the mask M by using the exposure apparatus EX constructed as described above.

When the exposure is performed for the substrate P, the control unit CONT supplies the second liquid LQ2 from the second liquid supply mechanism 30 to the second space K2. When the second liquid supply mechanism 30 supplies the second liquid LQ2, the space between the second optical element LS2 and the upper surface T2 of the first optical element LS1 is filled with the second liquid LQ2 so that only the partial area of the upper surface T2 of the first optical element LS1, which includes the predetermined area AR' through which the exposure light beam EL passes, becomes the second liquid immersion area LR2. The second liquid LQ2, which is supplied from the second liquid supply mechanism 30, locally forms the second liquid immersion area LR2 which is greater than the predetermined area AR' and which is smaller than the upper surface T2, on a part of the upper surface T2 including the predetermined area AR'. After the second liquid immersion area LR2 is formed, the control unit CONT stops the supply of the second liquid LQ2 by the second liquid supply mechanism 30. The second liquid LQ2 between the first optical element LS1 and the second optical element LS2 is retained by the surface tension, and the second liquid immersion area LR2 is maintained.

After the substrate P is loaded on the substrate stage PST at a load position, the substrate stage PST, which holds the substrate P, is moved by the control unit CONT to the position under the projection optical system PL, i.e., the exposure position. The control unit CONT supplies and recovers the first liquid LQ1 by using the first liquid supply mechanism 10 and the first liquid recovery mechanism 20 while optimally controlling the supply amount of the first liquid LQ1 per unit time brought about by the first liquid supply mechanism 10 and the recovery amount of the first liquid LQ1 per unit time brought about by the first liquid recovery mechanism 20 in the state in which the substrate stage PST is opposed to the first optical element LS1 of the projection optical system PL. And the control unit CONT forms the first liquid immersion area LR1 of the first liquid LQ1 on at least the optical path for the exposure light beam EL included in the first space K1, and fills the optical path for the exposure light beam EL with the first liquid LQ1.

In this arrangement, reference members (measuring members), which are provided with reference marks to be measured, for example, by a substrate alignment system as disclosed in Japanese Patent Application Laid-open No. 4-65603 and a mask alignment system as disclosed in Japanese Patent Application Laid-open No. 7-176468, are provided at predetermined positions on the substrate stage PST. Further, for example, an uneven illuminance sensor as disclosed, for example, in Japanese Patent Application Laid-open No. 57-117238, a spatial image-measuring sensor as disclosed, for example, in Japanese Patent Application Laid-open No. 2002-14005, and a radiation amount sensor (illuminance sensor) as disclosed, for example, in Japanese Patent Application Laid-open No. 11-16816 are provided as optical measuring sections at predetermined positions on the substrate stage PST. Before the exposure process is performed for the substrate P, the control unit CONT performs the measurement of the marks on the reference members and/or various types of measuring operations by using the optical measuring sections. The control unit CONT performs the alignment process for the substrate P and the process for adjusting (calibrating) the image formation characteristic of the projection optical system PL on the basis of the measurement results. For example, when the measuring operation by using the optical measuring section is performed, the control unit CONT moves the substrate stage PST relative to the first liquid immersion area LR1 of the first liquid LQ1 by moving the substrate stage PST in the XY directions to arrange the first liquid immersion area LR1 of the first liquid LQ1 on the optical measuring section so that the measuring operation is performed in this state via the first liquid LQ1 and the second liquid LQ2. The measurement of the reference mark measured by the mask alignment system and/or the various types of the calibration processes using the optical measuring sections may be performed before the substrate P as the exposure objective is placed on the substrate stage PST.

After the alignment process and the calibration process are performed as described above, the control unit CONT projects the image of the pattern of the mask M onto the substrate P to expose the substrate P therewith by radiating the exposure light beam EL onto the substrate P via the projection optical system PL, the second liquid LQ2 of the second liquid immersion area LR2 formed on the side of the upper surface T2 of the first optical element LS1, and the first liquid LQ1 of the first liquid immersion area LR1 formed on the side of the lower surface T1 of the first optical element LS1, while moving, in the X axis direction (scanning direction), the substrate stage PST which supports the substrate P, and while performing the recovery of the first liquid LQ1 from the surface of the substrate P by using the first liquid recovery mechanism 20 concurrently with the supply of the first liquid LQ1 onto the substrate P by using the first liquid supply mechanism 10. The first liquid LQ1, which is supplied from the first liquid supply mechanism 10, locally forms the first liquid immersion area LR1 which is greater than the projection area AR and which is smaller than the substrate P, on the part of the substrate P including the projection area AR. The second liquid LQ2, which is supplied from the second liquid supply mechanism 30, locally forms the second liquid immersion area LR2 which is greater than the predetermined area AR' and which is smaller than the upper surface T2, on the part of the upper surface T2 including the predetermined area AR' of the upper surface T2 of the first optical element LS1.

During the exposure of the substrate P, the operation for supplying the first liquid LQ1 and the operation for recovering the first liquid LQ1 are continued by the first liquid immersion mechanism 1. The optical path for the exposure light beam EL between the first element and the substrate P is filled with the first liquid LQ1, while maintaining the size and the shape of the first liquid immersion area LR1 to be in a desired state. On the other hand, during the exposure of the substrate P, the operation for supplying the second liquid LQ2 and the operation for recovering the second liquid LQ2 are not performed by the second liquid immersion mechanism 2. That is, the exposure is performed through the second liquid LQ2 in the pooled state (retained state by the surface tension) in the second space K2. When the supply and the recovery of the second liquid LQ2 are not performed during the exposure of the substrate P, no vibration is generated by the supply and/or the recovery of the second liquid LQ2 during the exposure of the substrate P. Therefore, it is possible to avoid the deterioration of the exposure accuracy which would be otherwise caused by the vibration.

The second liquid LQ2 locally forms the second liquid immersion area LR2 in only the partial area including the predetermined area AR' through which the exposure light beam EL passes, of the upper surface T2 of the first optical element LS1. Accordingly, it is possible to avoid the leakage of the second liquid LQ2 to the outside of the upper surface T2 of the first optical element LS1. Therefore, it is possible to avoid the inflow and the adhesion of the second liquid LQ2 with respect to the barrel PK (first support section 91) for supporting the first optical element LS1. It is possible to avoid the deterioration of the barrel PK (first support section 91). Further, it is possible to avoid the deterioration of any mechanical part and any electric part disposed around the first optical element LS1, which would be otherwise caused by the leaked second liquid LQ2.

The second liquid LQ2 makes no contact, for example, with the barrel PK and/or the first support section 91, because the second liquid LQ2 locally forms the second liquid immersion area LR2 on the upper surface T2 of the first optical element LS1. Therefore, it is possible to avoid the inconvenience such as the mixing of any impurity including the metal ion or the like generated, for example, from the barrel PK and the first support section 91 with respect to the second liquid LQ2 for forming the second liquid immersion area LR2. Therefore, the exposure process and the measurement process can be satisfactorily performed in the state in which the cleanness of the second liquid LQ2 is maintained.

The exposure apparatus EX of this embodiment performs the projection exposure onto the substrate P with the image of the pattern of the mask M while moving the mask M and the substrate P in the X axis direction (scanning direction). During the scanning exposure, a part of the image of the pattern of the mask M is projected into the projection area AR via the projection optical system PL and the first and second liquids LQ1, LQ2 of the first and second liquid immersion areas LR1, LR2. The mask M is moved at the velocity V in the −X direction (or in the +X direction), in synchronization with which the substrate P is moved at the velocity $\beta \cdot V$ ($\beta$ represents the projection magnification) in the +X direction (or in the −X direction) with respect to the projection area AR. A plurality of shot areas are set on the substrate P. After the exposure is completed for one shot area, the next shot area is moved to the scanning start position in accordance with the stepping movement of the substrate P. The scanning exposure process is successively performed thereafter for the respective shot areas while moving the substrate P in the step-and-scan manner.

In this embodiment, the first optical element LS1, which is formed of the parallel flat plate, is arranged under the second optical element LS2 having the lens function. However, the first space K1 disposed on the side of the lower surface T1 of the first optical element LS1 and the second space K2 of the first optical element LS1 disposed on the side of the upper surface T2 are filled with the first liquid LQ1 and the second liquid LQ2 respectively. Accordingly, the reflection loss is reduced on the lower surface T3 of the second optical element LS2 and the upper surface T2 of the first optical element LS1. The substrate P can be exposed satisfactorily in the state in which the large image side numerical aperture of the projection optical system PL is secured.

Figure 8:
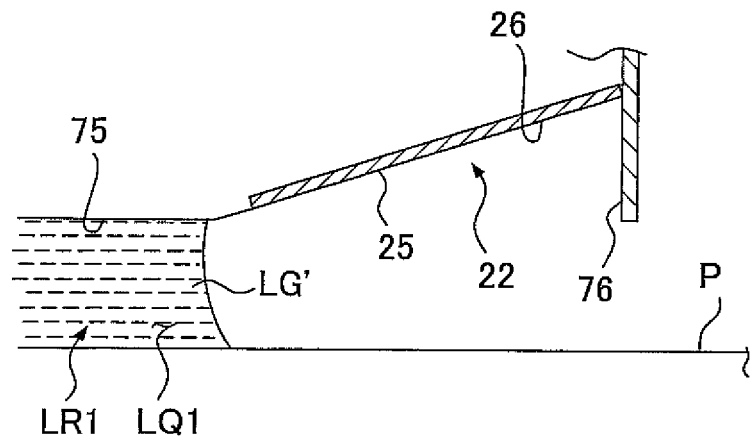
FIGS. 8(a) and 8(b) schematically illustrate the operation for recovering the liquid by a first liquid immersion mechanism according to the present invention.
Figure 8:
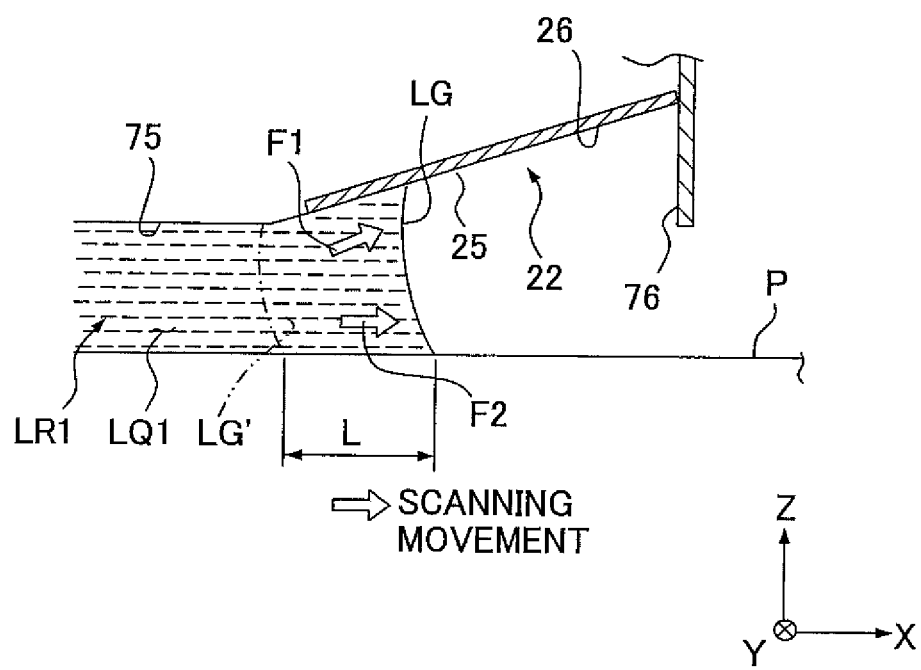

In this embodiment, the porous member 25 is inclined with respect to the surface of the substrate P. In this arrangement, the first liquid LQ1 is recovered via the inclined surface 26 of the porous member 25 arranged in the first recovery port 22. In this arrangement, the first liquid LQ1 is recovered via the first recovery port 22 including the inclined surface 26. Further, the land surface 75 and the inclined surface 26 are formed continuously. In such a situation, when the substrate P is subjected to the scanning movement at a predetermined velocity by a predetermined distance in the +X direction with respect to the first liquid immersion area LR1 from the initial state shown in FIG. 8(a) (the state in which the first liquid immersion area LR1 of the first liquid LQ1 is formed between the land surface 75 and the substrate P), the state as shown in FIG. 8(b) is obtained. The component F1 to move obliquely in the upward direction along the inclined surface 26 and the component F2 to move in the horizontal direction are generated in the first liquid LQ1 of the first liquid immersion area LR1 in the predetermined state after the scanning movement as shown in FIG. 8(b). In this situation, the shape of the interface (gas/liquid interface) LG between the first liquid LQ1 of the first liquid immersion area LR1 and the space disposed outside is maintained. Even when the substrate P is moved at a high velocity with respect to the first liquid immersion area LR1, it is possible to suppress any great change of the shape of the interface LG.

The distance between the inclined surface 26 and the substrate P is greater than the distance between the land surface 75 and the substrate P. That is, the space between the inclined surface 26 and the substrate P is greater than the space between the land surface 75 and the substrate P. Therefore, when the substrate P is moved with respect to the first liquid immersion area LR1, it is possible to make a distance L between an interface LG' and the interface LG to be relatively small, the interface LG' being brought about in the initial state shown in FIG. 8(a) and the interface LG being brought about in the predetermined state after the scanning movement shown in FIG. 8(b). Therefore, it is possible to decrease the size of the first liquid immersion area LR1.

Figure 9:
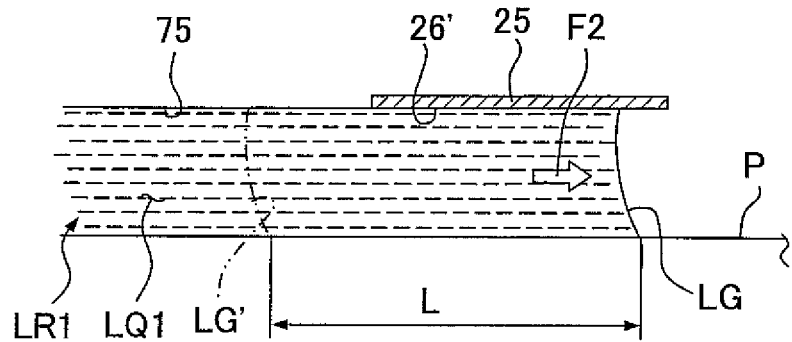
FIGS. 9(a) and 9(b) schematically show a comparative example of the operation for recovering the liquid.
Figure 9:
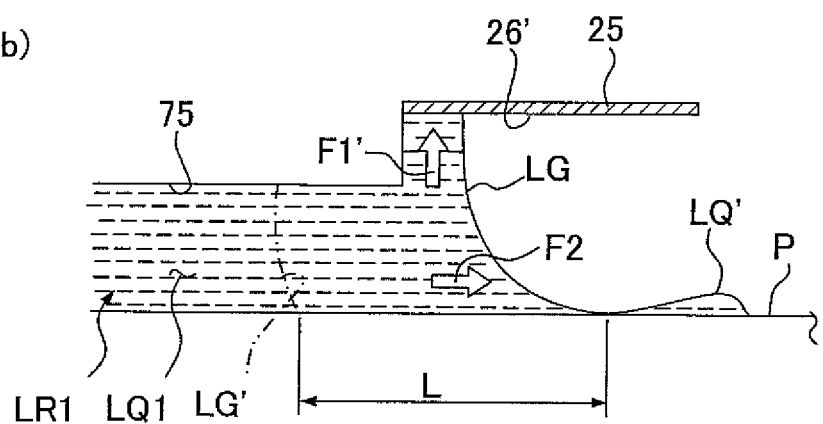
Figure 9:
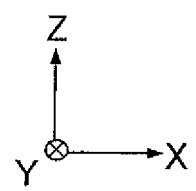

For example, as shown in FIG. 9(a), even if the land surface 75 and a lower surface 26' of the porous member 25 arranged in the first recovery port 22 are formed continuously, the lower surface 26' of the porous member 25 is not inclined with respect to the substrate P, and the lower surface 26' of the porous member 25 is substantially in parallel to the surface of the substrate P, in other words, even if the first recovery port 22 including the lower surface 26' is not inclined, then the shape of the interface LG is maintained when the substrate P is moved with respect to the first liquid immersion area LR1. However, only the component F2 to move in the horizontal direction is generated in the first liquid LQ1, and the component (F1) to move in the upward direction is hardly generated, because the lower surface 26' is not inclined. In such a situation, the interface LG is moved by approximately the same distance as the movement amount of the substrate P. Therefore, the distance L between the interface LG' in the initial state and the interface LG in the predetermined state after the scanning movement has a relatively great value. Accordingly, the first liquid immersion area LR1 is increased in size as well. On this assumption, it is necessary that the nozzle member 70 should be large-sized as well corresponding to the large first liquid immersion area LR1. Further, it is also required to increase the movement stroke of the substrate stage PST and the size of the substrate stage PST itself according to the size of the first liquid immersion area LR1. Consequently, the entire exposure apparatus EX becomes huge in size. The tendency to increase the size of the first liquid immersion area LR1 is conspicuous as the scanning velocity of the substrate P with respect to the first liquid immersion area LR1 is highly increased.

As shown in FIG. 9(b), when the distance between the lower surface 26' and the substrate P is made greater than the distance between the land surface 75 and the substrate P by providing the difference in height between the land surface 75 and the first recovery port 22 (lower surface 26' of the porous member 25), in other words, when the space between the lower surface 26' and the substrate P is made greater than the space between the land surface 75 and the substrate P, then the component F1' to move in the upward direction is generated in the first liquid LQ1. Therefore, it is possible to make the distance L to have a relatively small value, and it is possible to suppress the large size of the first liquid immersion area LR1. However, the shape of the interface LG tends to be collapsed, because the difference in height is provided between the land surface 75 and the lower surface 26', and the land surface 75 and the lower surface 26' are not formed continuously. When the shape of the interface LG is collapsed, there is such a high possibility that any inconvenience may be caused, in which the gas is mixed into the first liquid LQ1 of the first liquid immersion area LR1, and any bubble is generated in the first liquid LQ1. For example, when the substrate P is scanned at a high velocity in the +X direction, then the presence of the difference in height causes the collapse of the shape of the interface LG, and the component F1' to move in the upward direction is further increased. As a result, the thickness is thinned for the first liquid LQ1 in the area disposed at the position most deviated toward the +X side of the first liquid immersion area LR1. When the substrate P is moved in the −X direction (subjected to the reverse scanning) in this state, there is such a high possibility that a phenomenon arises to break the first liquid LQ1 into portions. If the broken liquid (see the symbol LQ' in FIG. 9(b)) remains, for example, on the substrate P, an inconvenience arises such that any adhesion trace (so-called water mark) is formed on the substrate P due to the vaporization of the liquid LQ'. When the shape of the interface LG is collapsed, then the first liquid LQ1 outflows to the outside of the substrate P, and there is such a high possibility to cause any inconvenience including, for example, the rust and/or the electric leakage in relation to the peripheral members and the equipment PL as well. The possibility of the occurrence of the inconvenience as described above is increased as the scanning velocity is highly increased for the substrate P with respect to the first liquid immersion area LR1.

In this embodiment, the first recovery port 22 of the first liquid immersion mechanism 1 (first liquid recovery mechanism 20) is formed on the inclined surface 26 opposed to the surface of the substrate P. Therefore, even when the substrate P and the first liquid immersion area LR1 formed on the image plane side of the projection optical system PL are relatively moved, then it is possible to maintain the shape of the interface LG between the first liquid LQ1 of the first liquid immersion area LR1 and the space disposed outside, and it is possible to maintain the desired state for the shape of the first liquid immersion area LR1. Therefore, it is possible to avoid the inconvenience which would be otherwise caused, for example, such that any bubble is generated in the first liquid LQ1, the liquid cannot be recovered sufficiently, and the liquid outflows. When the first recovery port 22 is provided on the inclined surface 26, it is possible to suppress the movement amount of the interface LG. Accordingly, it is possible to decrease the size of the first liquid immersion area LR1. Therefore, it is also possible to realize the compact size of the entire exposure apparatus EX.

When the substrate P is scanned at a high velocity, there is such a high possibility that the first liquid LQ1 of the first liquid immersion area LR1 outflows to the outside and/or the first liquid LQ1 of the first liquid immersion area LR1 is scattered to the surroundings. However, it is possible to suppress the leakage of the first liquid LQ1, because the wall portion 76 is provided at the circumferential edge of the inclined surface 26. That is, when the wall portion 76 is provided at the circumferential edge of the porous member 25, the buffer space is formed inside the wall portion 76. Therefore, even when the liquid LQ arrives at the inner side surface of the wall portion 76, the liquid LQ, which forms the liquid immersion area AR2, is expanded in the buffer space disposed inside the wall portion 76. Accordingly, it is possible to more reliably avoid the leakage of the liquid LQ to the outside of the wall portion 76.

The part of the land surface 75 (lower surface of the bottom plate portion 72D) is arranged under the end surface T1 of the projection optical system PL to surround the projection area AR1. Therefore, the small gap, which is formed between the part of the land surface 75 (lower surface of the bottom plate portion 72D) and the surface of the substrate P, is formed in the vicinity of the projection area to surround the projection area. Accordingly, it is possible to continuously maintain the small liquid immersion area which is necessary and sufficient to cover the projection area AR1. Therefore, it is possible to realize the compact size of the entire exposure apparatus EX, while suppressing the inconvenience including, for example, the outflow of the liquid LQ and the mixing of the gas into the liquid LQ of the liquid immersion area AR2, even when the substrate P is moved (scanned) at a high velocity. Further, the liquid supply port 12 is arranged outside the part of the land surface 75 (lower surface of the bottom plate portion 72D). Therefore, it is possible to prevent the gas (bubble) from mixing into the liquid LQ which forms the liquid immersion area AR2. Even when the substrate P is moved at a high velocity, it is possible to continuously fill the optical path for the exposure light beam EL with the liquid.

In the embodiment described above, the inclined surface 26 is formed by attaching the thin plate-shaped porous member 25 obliquely with respect to the substrate P. Alternatively, an inclined surface may be provided on the lower surface of the nozzle member 70 so that the spacing distance with respect to the surface of the substrate P is increased at positions separated farther from the optical axis AX of the exposure light beam EL, and the liquid recovery port 22 may be formed at a predetermined position (in a predetermined area) of the inclined surface. The porous member 25 may be provided for the liquid recovery port 22.

In this embodiment, the porous member 25 is arranged in the first recovery port 22. However, it is also allowable that the porous member 25 is absent or omitted. Also in this case, for example, an inclined surface may be provided on the lower surface of the nozzle member 70 so that the spacing distance with respect to the surface of the substrate P is increased at positions separated farther from the optical axis AX of the exposure light beam EL, and the liquid recovery port may be provided at a predetermined position of the inclined surface. Accordingly, it is possible to maintain the shape of the interface LG, and it is possible to avoid the inconvenience which would be otherwise caused, for example, such that any bubble is generated in the first liquid LQ1 of the first liquid immersion area LR1. Further, it is also possible to decrease the size of the first liquid immersion area LR1.

When the exposure for the substrate P is completed, then the control unit CONT stops the supply of the first liquid LQ1 having been performed by the first liquid supply mechanism 10, and the first liquid LQ1 in the first liquid immersion area LR1 (first liquid LQ1 in the first space K1) is recovered by using, for example, the first liquid recovery mechanism 20. Further, the control unit CONT recovers the first liquid LQ1 remaining on the substrate P and on the substrate stage PST, by using, for example, the first recovery port 22 of the first liquid recovery mechanism 20.

As explained with reference to FIG. 7, the control unit CONT recovers, via the second recovery ports 42, the second liquid LQ2 in the second liquid immersion area LR2 formed in the second space K2 after the completion of the exposure for the substrate P.

After the first liquid LQ1 on the substrate P and the second liquid LQ2 on the upper surface T2 of the first optical element LS1 are recovered, the substrate stage PST, which supports the substrate P, is moved to an unload position by the control unit CONT to unload the substrate P.

The substrate P, which is next to be subjected to the exposure process, is loaded on the substrate stage PST. The control unit CONT supplies the second liquid LQ2 to the second space K2 in order to expose the substrate P loaded on the substrate stage PST. The substrate P is exposed in accordance with the same sequence as that described above.

This embodiment is constructed such that the second liquid LQ2 in the second space K2 is exchanged for every substrate P to be exposed. However, the second liquid LQ2 in the second space K2 may be exchanged at every predetermined time interval, every predetermined number of substrates to be processed, or every lot, for example, provided that the deterioration of the cleanness and the temperature change of the liquid LQ2 in the second space K2 are in such an extent that the exposure accuracy is not affected thereby.

The supply and the recovery of the second liquid LQ2 may be performed continuously during the exposure of the substrate P or before or after the exposure as well. When the supply and the recovery of the second liquid LQ2 are performed continuously, the second space K2 can be always filled with the temperature-managed and clean second liquid LQ2. On the other hand, when the exposure is performed in the state in which the second liquid LQ2 is pooled in the second space K2, and the second liquid LQ2 is exchanged intermittently for the second space K2 as in this embodiment, the vibration is not caused by the supply and the recovery of the second liquid LQ2 during the exposure of the substrate P as described above. In the case of the procedure in which the supply and the recovery of the second liquid LQ2 are continuously performed during the exposure of the substrate P, for example, if the supply amount and the recovery amount of the second liquid LQ2 per unit time are unstable, the following possibility arises. That is, the second liquid immersion area LR2 is enormously expanded, the second liquid LQ2 is subjected to the outflow or the scattering at the inside of the barrel PK, and the damage is increased. If the supply amount and the recovery amount of the second liquid LQ2 per unit time are unstable, any inconvenience arises such that the second liquid immersion area LR2 is exhausted, and the exposure accuracy is deteriorated. Therefore, when the second liquid LQ2 is exchanged intermittently for the second space K2, then it is possible to form the second liquid immersion area LR2 in a desired state, and it is possible to avoid the occurrence of the inconvenience as described above.

There is such a possibility that the first liquid LQ1 may be polluted by being contaminated, for example, with any impurity generated from the substrate P, including, for example, any foreign matter resulting, for example, from the photosensitive agent (photoresist), mixing into the first liquid LQ1 of the first liquid immersion area LR1 (first space K1). There is such a possibility that the lower surface T1 of the first optical element LS1 may be polluted with the contaminated first liquid LQ1, because the first liquid LQ1 in the first liquid immersion area LR1 also makes contact with the lower surface T1 of the first optical element LS1. Further, there is also such a possibility that any impurity floating in the air may adhere to the lower surface T1 of the first optical element LS1 exposed on the image plane side of the projection optical system PL.

In this embodiment, the first optical element LS1 can be easily attached and detached (exchangeable) with respect to the barrel PK. Therefore, the deterioration of the exposure accuracy and the measurement accuracy via the projection optical system PL, which would be otherwise caused by the pollution of the optical element, can be avoided by exchanging only the polluted first optical element LS1 with the clean first optical element LS1. On the other hand, the second liquid LQ2 in the second space K2 does not make any contact with the substrate P. Further, the second space K2 is the substantially closed space surrounded by the first optical element LS1, the second optical element LS2, and the barrel PK.

Therefore, the impurity floating in the air is hardly mixed into the second liquid LQ2 in the second space K2, and the impurity hardly adheres to the lower surface T3 of the second optical element LS2 and the upper surface T2 of the first optical element LS1. Therefore, the cleanness is maintained for the lower surface T3 of the second optical element LS2 and the upper surface T2 of the first optical element LS1. Therefore, when only the first optical element LS1 is exchanged, then it is possible to avoid, for example, the deterioration of the transmittance of the projection optical system PL, and it is possible maintain the exposure accuracy and the measurement accuracy.

An arrangement is also conceived, in which the liquid of the first liquid immersion area LR1 is allowed to make contact with the second optical element LS2 without providing the first optical element LS1 formed of the parallel flat plate. However, if it is intended to increase the image side numerical aperture of the projection optical system PL, then it is necessary to increase the effective diameter of the optical element, and it is inevitable that the optical element LS2 has a large size. The nozzle member 70 as described above and the various types of the measuring units such as the alignment system (although not shown) are arranged around the optical element LS2. Therefore, if such a large-sized optical element LS2 is exchanged, then the operability is lowered, and the operation is difficult to be performed. Further, the optical element LS2 has the refractive power (lens function). Therefore, it is necessary that the optical element LS2 should be attached to the barrel PK with the high positioning accuracy in order to maintain the optical characteristic (image formation characteristic) of the entire projection optical system PL. Therefore, it is not preferable to frequently attach and detach (exchange) the optical element LS2 as described above with respect to the barrel PK in view of the maintenance of the optical characteristic of the projection optical system PL (positioning accuracy of the optical element LS2) as well. This embodiment is constructed such that the relatively small-sized parallel flat plate is provided as the first optical element LS1, and the first optical element LS1 is exchanged. Therefore, the operability is satisfactory, and the exchange operation can be performed with ease. It is also possible to maintain the optical characteristic of the projection optical system PL. Further, the exposure apparatus EX is provided with the first and second liquid immersion mechanisms 1, 2 which are capable of independently supplying and recovering the first and second liquid LQ1, LQ2 with respect to the first space K1 disposed on the side of the lower surface T1 of the first optical element LS1 and the second space K2 disposed on the side of the upper surface T2 of the first optical element LS1 respectively. Accordingly, the exposure light beam EL, which is radiated from the illumination optical system IL, is successfully allowed to satisfactorily arrive at the substrate P arranged on the image plane side of the projection optical system PL while maintaining the cleanness of the first and second liquid LQ1, LQ2.

As explained above, the space between the substrate P and the lower surface T1 of the first optical element LS1 is filled with the first liquid LQ1, and the space between the second optical element LS2 and the upper surface T2 of the first optical element LS1 is filled with the second liquid LQ2. Accordingly, the exposure light beam EL, which has passed through the mask M, can be allowed to satisfactorily arrive at the substrate P, and the substrate P can be exposed satisfactorily. The second liquid immersion area LR2 of the second liquid LQ2 is locally formed on the side of the upper surface T2 of the first optical element LS1. Therefore, it is possible to avoid the inconvenience which would be otherwise caused, for example, such that the second liquid LQ2 of the second liquid immersion area LR2 is polluted due to the contact of the second liquid LQ2, for example, with the barrel PK, and the barrel PK including the first support section 91 is deteriorated by the second liquid LQ2. When the second liquid immersion area LR2 is formed locally, it is possible to avoid the inconvenience which would be otherwise caused such that the second liquid LQ2 leaks to the outside of the barrel PK. Therefore, when any seal mechanism is provided in order to avoid the leakage of the second liquid LQ2, the seal mechanism can be constructed simply and conveniently. Alternatively, the seal mechanism may be omitted.

The outer diameter D3 of the lower surface T3 of the second optical element LS2 opposed to the first optical element LS1 is smaller than the outer diameter D2 of the upper surface T2 of the first optical element LS1. Therefore, the second liquid immersion area LR2, which has the size corresponding to the lower surface T3 of the second optical element LS2, can be formed locally and satisfactorily on the upper surface T2 of the first optical element LS1. It is possible to further reliably avoid the leakage of the second liquid LQ2 from the circumference of the upper surface T2 of the first optical element LS1.

Figure 10:
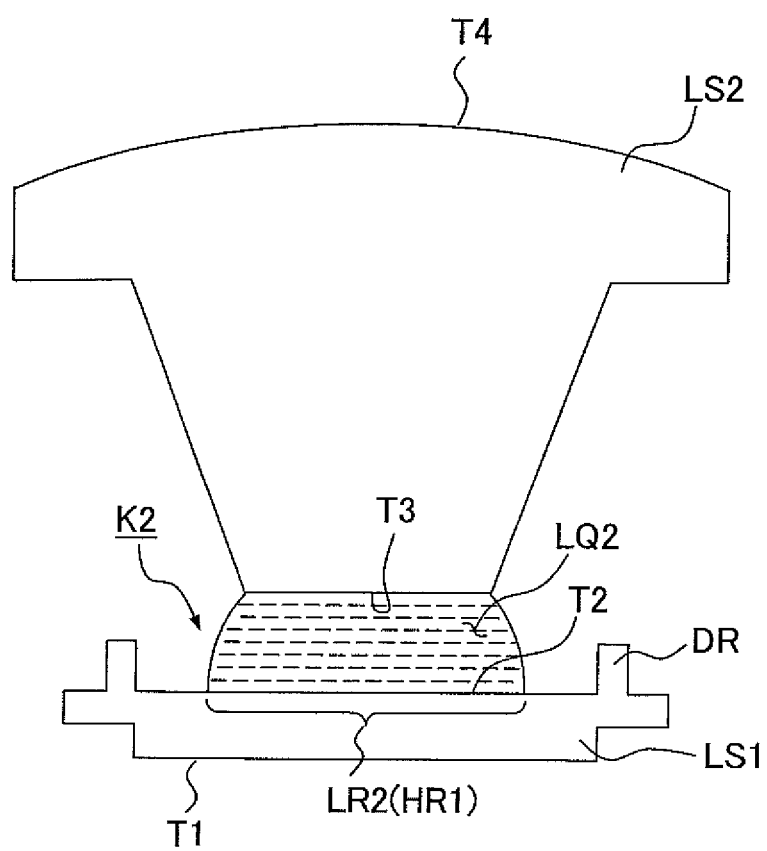
FIG. 10 schematically shows a modified embodiment of a first element.

In the embodiment described above, the upper surface T2 of the first optical element LS1 is provided with the second area HR2 having the liquid repellence in order to avoid, for example, the leakage of the second liquid LQ2. However, as schematically shown in FIG. 10, a bank portion DR may be provided to surround the first area HR1 on the upper surface T2 of the first optical element LS1. Also in this way, it is possible to avoid the leakage of the second liquid LQ2 of the second liquid immersion area LR2 formed in the first area HR1. In this arrangement, the optical path for the exposure light beam EL in the second space K2 may be filled with the second liquid LQ2 by storing a predetermined amount of the second liquid LQ2 in the bank portion DR. The second liquid LQ2, which has overflowed from the bank portion DR or which is likely to overflow, may be recovered.

In the embodiment described above, the liquid recovery port is provided on the inclined surface of the lower surface of the nozzle member 70 (lower surface of the porous member). However, when the leakage of the liquid LQ is successfully suppressed, the liquid recovery port may be provided on the surface which is substantially parallel to (flush with) the land surface 75, without forming the inclined surface on the lower surface of the nozzle member 70. That is, the first liquid recovery port 22 may be provided as shown in FIGS. 9(a) and 9(b) provided that the liquid LQ1 can be recovered without causing any leakage even when the movement velocity of the substrate P is increased, for example, when the contact angle of the liquid LQ1 with respect to the substrate P is large, or when the ability to recover the liquid LQ1 from the first recovery port 22 by the first recovery mechanism 20 is excellent.

In the embodiment described above, the wall portion 76 is provided at the circumferential edge of the inclined surface (lower surface of the porous member) formed on the lower surface of the nozzle member 70. However, when the leakage of the liquid LQ is successfully suppressed, it is also possible to omit the wall portion 76.

In the embodiment described above, the part of the land surface (flat portion) 75 of the nozzle member 70 is formed between the projection optical system PL and the substrate P, and the inclined surface (lower surface of the porous member) is formed at the outside thereof. However, the part of the land surface may be arranged outside (around) the end surface T1 of the projection optical system PL with respect to the optical axis of the projection optical system PL, instead of being arranged under the projection optical system PL. In this arrangement, the land surface 75 may be substantially flush with the end surface T1 of the projection optical system PL. Alternatively, the position of the land surface 75 in the Z axis direction may be separated in the +Z direction or in the −Z direction from the end surface T1 of the projection optical system PL.

In the embodiment described above, the liquid supply port 12 is formed to be annular slit-shaped to surround the projection area AR1. However, a plurality of supply ports, which are separated from each other, may be provided. In this arrangement, the positions of the supply ports are not specifically limited. The supply ports may be provided one by one on the both sides of the projection area AR1 (on the both sides in the X axis direction or on the both sides in the Y axis direction). Alternatively, the supply ports may be provided one by one (four in total) on the both sides of the projection area AR1 in the X axis direction and the Y axis direction. It is also allowable that only one supply port may be provided at a position separated in a predetermined direction with respect to the projection area AR1 provided that the desired liquid immersion area AR2 can be formed. In the embodiment described above, the first supply port 12 is provided at the position opposed to the substrate P. However, there is no limitation thereto. For example, the first liquid LQ1 may be supplied from the space between the first optical element LS1 and the bottom plate portion 72D. Also in this arrangement, the supply port may be provided to surround the optical path for the exposure light beam EL. Alternatively, the supply ports may be provided one by one on the both sides of the optical path for the exposure light beam EL. When the liquid LQ is supplied from a plurality of supply ports, the amounts of the liquid LQ to be supplied from the respective supply ports may be adjustable so that the liquid may be supplied in different amounts from the respective supply ports.

Figure 11:
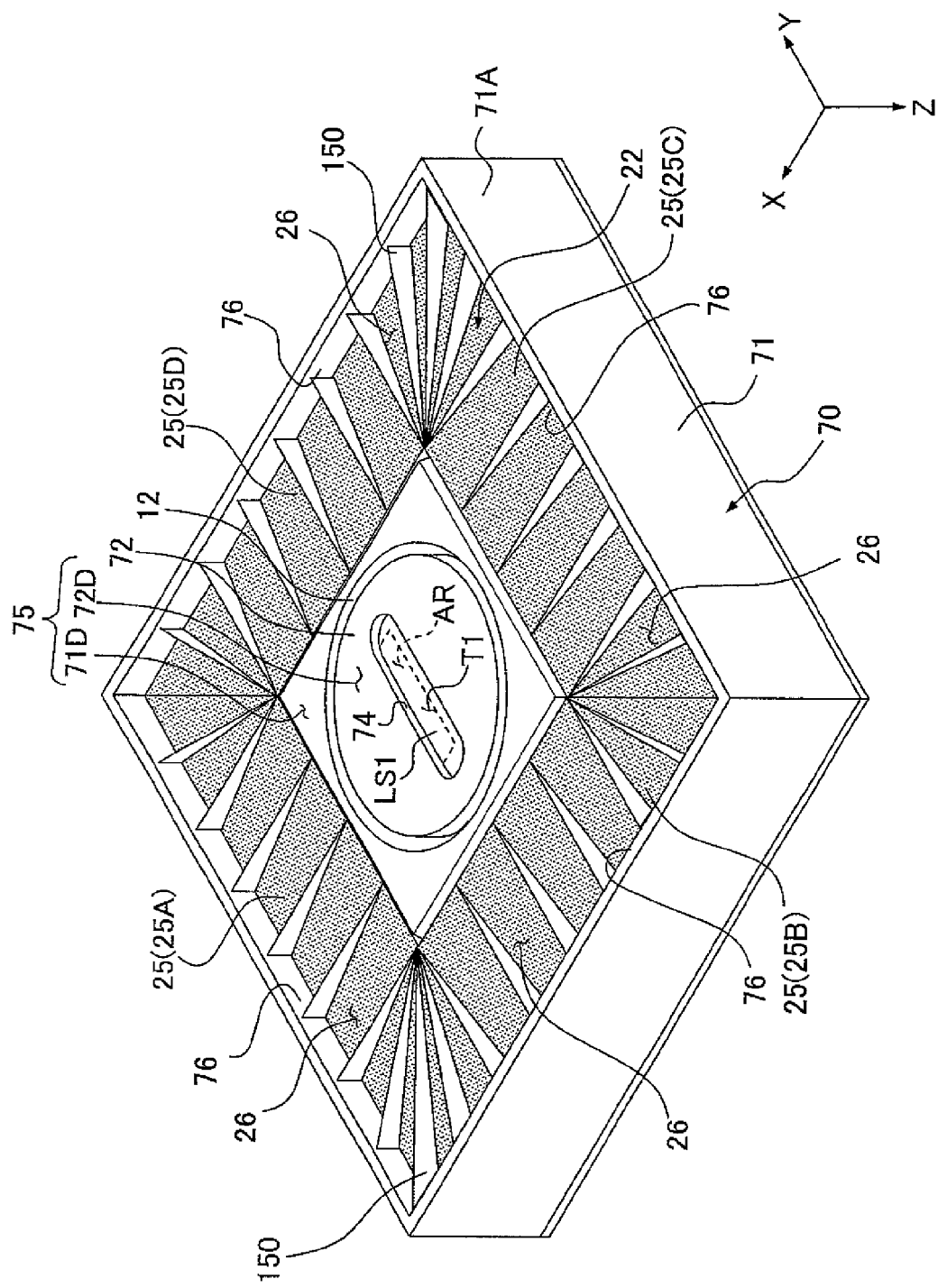
FIG. 11 shows a perspective view illustrating a modified embodiment of the nozzle member as viewed from a lower position.

As shown in FIG. 11, a plurality of fin members 150 may be formed on the inclined surface formed on the lower surface of the nozzle member 70 (lower surface of the porous member 25). The fin member 150 is substantially triangular as viewed in a side view. As shown in the side sectional view in FIG. 11, the fin members 150 are arranged in the buffer space formed on the inner side of the wall portion 76 and on the lower surface of the porous member 25. The fin member 150 is attached to the inner side surface of the wall portion 76 radially so that the longitudinal direction thereof is directed outwardly. In this arrangement, the plurality of fin members 150 are separated from each other, and the spaces are formed between the respective fin members 150. When the plurality of fin members 150 are arranged as described above, it is possible to increase the liquid contact area on the inclined surface (lower surface of the porous member 25) formed on the lower surface of the nozzle member 70. Therefore, it is possible to improve the performance to retain the liquid LQ on the lower surface of the nozzle member 70. The plurality of fin members 150 may be provided at equal intervals. Alternatively, the plurality of fin members 150 may be provided at unequal intervals. For example, the intervals of the fin members 150 arranged on the both sides in the X axis direction with respect to the projection area AR1 may be set to be smaller than the intervals of the fin members 150 arranged on the both sides in the Y axis direction with respect to the projection area AR1. It is preferable that the surface of the fin member 150 is liquid-attractive with respect to the liquid LQ. The fin member 150 may be formed by applying the "GOLDEP" treatment or the "GOLDEP WHITE" treatment to stainless steel (for example, SUS 316). Alternatively, the fin member 150 can be formed of, for example, glass (silica glass) as well.

Next, another embodiment will be explained with reference to FIG. 12. In the following description, the same or equivalent constitutive portions as those of the embodiment described above are designated by the same reference numerals, any explanation of which will be simplified or omitted.

Also in this embodiment, each of the first optical element LS1 and the second optical element LS2 is supported in the substantially stationary state by the barrel PK with respect to the optical path for the exposure light beam EL.

Figure 12:
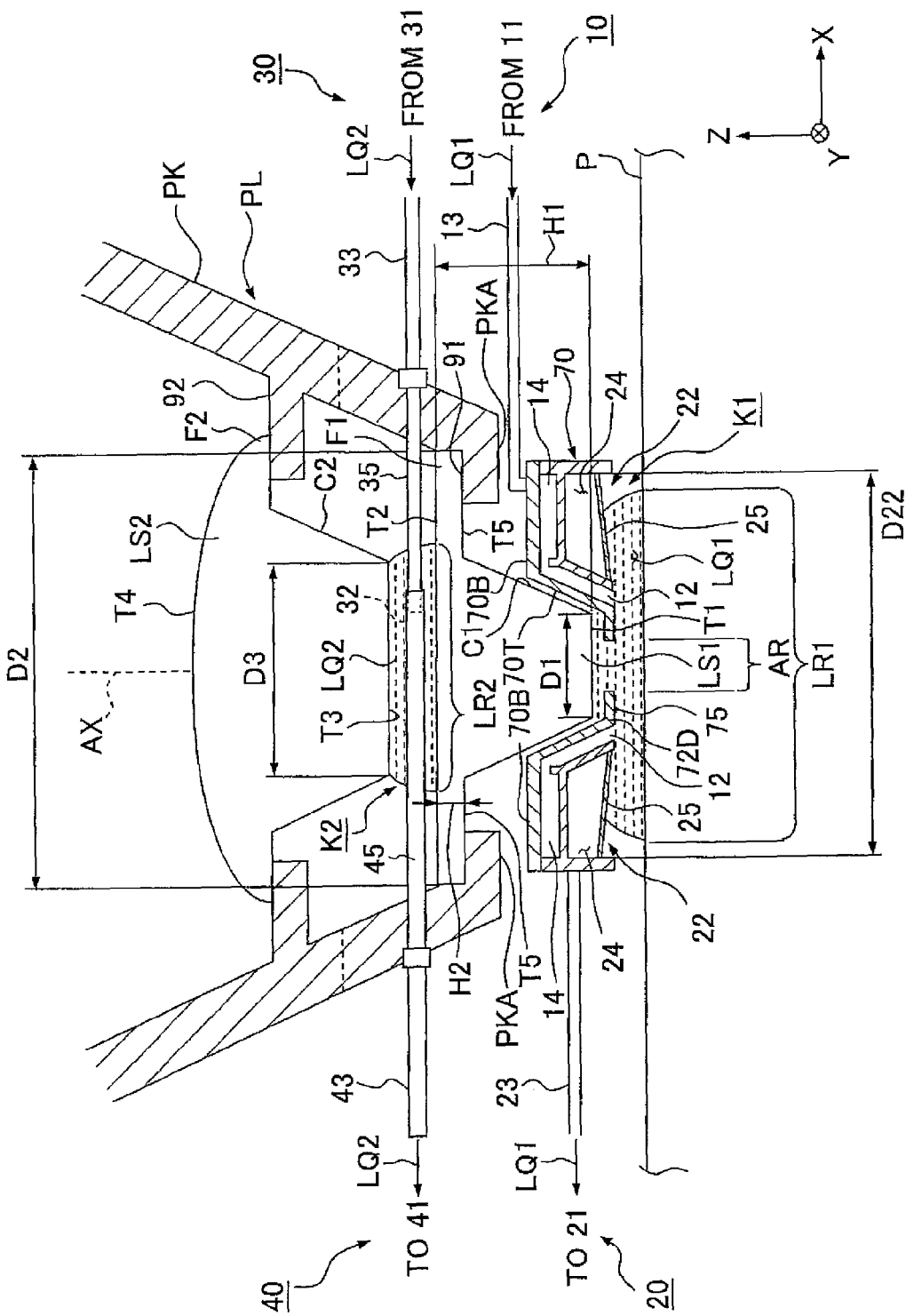
FIG. 12 shows a sectional view illustrating major parts to depict another embodiment of the present invention.

With reference to FIG. 12, the first optical element LS1 is a parallel flat plate in which the lower surface T1 and the upper surface T2 are in parallel to each other. The lower surface 71 and the upper surface T2 are substantially parallel to the XY plane. The first optical element LS1 is supported by a first support section 91 provided at the lower end of the barrel PK. A flange portion F1, which serves as a support objective portion, is provided at an upper portion of the first optical element LS1. The first support section 91 supports the first optical element LS1 by supporting the lower surface T5 of the flange portion F1. In this arrangement, the lower surface T5 of the flange portion F1 is also substantially parallel to the XY plane, and the lower surface T5 of the flange portion F1 is formed around the lower surface T1 of the first optical element LS1.

The distance (thickness) H1 between the lower surface T1 and the upper surface T2 of the first optical element LS1 on the optical axis AX of the projection optical system PL is not less than 15 mm. As also clarified from FIG. 12, the distance H1 between the lower surface T1 and the upper surface T2 of the first optical element LS1 on the optical axis AX is greater than the distance between the substrate P and the lower surface T1 of the first optical element LS1. That is, the thickness of the first optical element LS1 on the optical axis AX is formed to be thicker than the liquid LQ1. Also in this embodiment, the thickness of the liquid LQ1 is about 3 mm. The distance between the land surface 75 and the substrate P is about 1 mm. In this embodiment, the thickness H1 of the first optical element LS1 is about 15 mm. However, there is no limitation thereto. The thickness H1 can be set within a range of about 15 mm to 20 mm.

The second optical element LS2 is supported by a second support section 92 which is provided over the first support section 91 in the barrel PK. A flange portion F2, which serves as a support objective portion, is provided at an upper portion of the second optical element LS2. The second support section 92 supports the second optical element LS2 by supporting the flange portion F2. The lower surface T3 of the second optical element LS2 is formed to be flat or planar. The lower surface T3 of the second optical element LS2 supported by the second support section 92 is substantially parallel to the upper surface T2 of the first optical element LS1 supported by the first support section 91. On the other hand, the upper surface T4 of the second optical element LS2 is formed to be convex toward the object plane (toward the mask M), and has a positive refractive power.

The first optical element LS1 can be easily attached and detached with respect to the first support section 91 of the barrel PK. That is, the first optical element LS1 is provided exchangeably. The second optical element LS2, which has the refractive power (lens function), is supported by the second support section 92 of the barrel PK in a state of being satisfactorily positioned.

The upper surface T2 of the first optical element LS1 having the flange portion F1 is formed to be sufficiently greater than the lower surface T3 of the second optical element LS2. The outer diameter D3 of the lower surface T3 of the second optical element LS2 opposed to the first optical element LS1 is smaller than the outer diameter D2 of the upper surface T2 of the first optical element LS1. The second liquid immersion area LR2 is locally formed by the second liquid LQ2 on the upper surface T2 of the first optical element LS1.

The distance H1 between the lower surface T1 and the upper surface T2 of the first optical element LS1 is longer than the distance H2 between the upper surface T2 of the first optical element LS1 and the lower surface T5 of the flange portion. F1. In this embodiment, the outer diameter D2 of the upper surface T2 of the first optical element LS1 having the flange portion F1 is set to be not less than twice the outer diameter D1 of the lower surface T1 of the first optical element LS1. The first optical element LS1, which has the lower surface T5 of the flange portion F1 supported by the first support section 91, has the lower portion which is exposed (which protrudes) downwardly from the lower surface PKA of the barrel PK.

At least a part of the nozzle member 70 is arranged in the space formed between the substrate P and the flange portion F1 of the first optical element LS1 and the first support section 91 for supporting the flange portion F1. In other words, the flange portion (support objective portion) F1 of the first optical element LS1 and the first support section 91 for supporting the flange portion F1 are provided over (above) the nozzle member 70. The upper surface 70B of the nozzle member 70 is opposed to the lower surface T5 of the flange portion F1 of the first optical element LS1 and the lower surface PKA of the barrel PK. An inner side surface 70T of the nozzle member 70 is opposed to a side surface C1 of the first optical element LS1.

The nozzle member 70, which is arranged under the flange portion F1, is arranged closely to the side surface C1 of the first optical element LS1. The first supply port 12, which is provided for the nozzle member 70, is provided closely to the projection area AR. The first recovery port 22, which is formed to surround the projection area AR, is also provided closely to the projection area AR. The outer diameter D22 of the first recovery port 22 is provided to be smaller than the outer diameter D2 of the upper surface T2 of the first optical element LS1.

The bottom plate portion 72D, which forms the land surface 75, is arranged to creep into the space under the lower surface T1 of the first optical element LS1.

As explained above, the outer diameter D2 of the upper surface T2 of the first optical element LS1 is greater than the outer diameter D1 of the lower surface T1. More specifically, the outer diameter D2 of the upper surface T2 is not less than twice the outer diameter D1 of the lower surface T1. Therefore, when the first optical element LS1 is supported by the first support section 91, the first support section for supporting the first optical element LS1 can be provided at the position separated far from the optical axis AX of the first optical element LS1 in relation to the horizontal direction, by allowing the first support section 91 to support the end portion of the upper surface T2 (flange portion F1). Therefore, it is possible to secure the space between the first support section 91 and the side surface C1 of the first optical element LS1 (space around the first optical element LS1). The nozzle member 70, which is provided for the first liquid LQ1, can be arranged in the space. This arrangement is not directed to only the nozzle member 70. It is also possible to improve the degree of freedom of the arrangement, for example, when various measuring units such as the alignment system are arranged. It is also possible to improve the degree of freedom of the design of the measuring unit or the like to be arranged in the space, because the space is sufficiently secured. The outer diameter D2 of the upper surface T2 of the first optical element LS1 is not less than twice the outer diameter D1 of the lower surface T1, and the outer diameter D1 of the lower surface T1 of the first optical element LS1 is sufficiently smaller than the upper surface T2. Therefore, the first liquid LQ1 of the first liquid immersion area LR1 formed by the first liquid immersion mechanism 1 is made to have a contact with the lower surface T1, and thus the size of the first liquid immersion area LR1 can be decreased depending on the lower surface T1. Therefore, it is possible to avoid the inconvenience of the enormous increase in size of the entire exposure apparatus EX which would be otherwise caused by the enormous increase in size of the first liquid immersion area LR1. The size (position) of the first recovery port 22 is regarded as one of the factors to determine the size of the first liquid immersion area LR1. However, the outer diameter D22 of the first recovery port 22 is smaller than the outer diameter D2 of the upper surface T2 of the first optical element LS1. Therefore, it is possible to decrease the size of the first liquid immersion area LR1.

The distance H1 between the lower surface T1 and the upper surface T2 of the first optical element LS1 is greater than the distance between the first optical element LS1 and the substrate P. More specifically, the distance H1 is not less than 15 mm, and the first optical element LS1 is thick. Accordingly, when the first optical element LS1 is supported by the first support section 91, the first support section 91, which supports the first optical element LS1, can be provided at the position separated far from the lower surface T1 of the first optical element LS1 in relation to the vertical direction, by allowing the first support section 91 to support the portion disposed in the vicinity of the upper surface T2 of the first optical element LS1, i.e., the flange portion F1 for forming the upper surface T2 in this embodiment. Therefore, it is possible to secure the space between the substrate P and the lower surface T5 of the flange portion F1 of the first optical element LS1 (space around the first optical element LS1). The nozzle member 70 can be arranged in the space. This arrangement is not directed to only the nozzle member 70. It is also possible to improve the degree of freedom of the arrangement, for example, when various measuring units such as the alignment system are arranged. It is also possible to improve the degree of freedom of the design. The nozzle member 70 can be arranged closely to the side surface C1 of the first optical element LS1. Accordingly, it is possible to realize the compact size of the nozzle member 70, and it is possible to decrease the size of the first liquid immersion area LR1 of the first liquid LQ1. Therefore, it is possible to avoid the inconvenience of the enormous increase in size of the entire exposure apparatus EX which would be otherwise caused by the enormous expansion of the first liquid immersion area LR1.

The thickness (distance H1) of the first optical element LS1 is thicker than that of the first liquid LQ1 disposed between the first optical element LS1 and the substrate P. More specifically, the distance H1 is not less than 15 mm. Accordingly, it is possible to suppress the change of the shape of the first optical element LS1 which would be otherwise caused by the force received from the liquid. Therefore, it is possible to maintain the high image formation performance of the projection optical system PL.

In the embodiment explained with reference to FIG. 12, the first optical element LS1 satisfies both of the condition in which the distance (thickness) H1 is not less than 15 mm and the condition in which the outer diameter D2 of the upper surface T2 is not less than twice the outer diameter D1 of the lower surface T1. However, the first optical element LS1 may be constructed under a condition in which any one of the foregoing conditions is satisfied. Even in the case of the arrangement in which any one of the conditions is satisfied, it is possible to realize the compact size of the nozzle member 70, and it is possible to avoid the enormous expansion of the first liquid immersion area LR1.

In the embodiment explained with reference to FIG. 12, the first optical element LS1 has the conical side surface in which the outer diameter is decreased at positions separated farther from the flange portion F1 toward the lower surface T1. However, the shape of the first optical element LS1 is not limited to this shape. For example, a columnar first optical element LS1 may also be adopted, in which the side surface has the outer diameter D1 while maintaining the flange portion F1. In another viewpoint, the diameter of the exposure light beam EL in the scanning direction (X direction) is smaller than the diameter in the non-scanning direction (Y direction) in the first optical element LS1. Therefore, a first optical element may also be adopted, wherein the cross section, which is taken along the XY plane, is an ellipse having a small diameter in the X direction, wherein the first optical element has a side surface such that the outer diameter is decreased at positions separated farther from the flange portion F1 toward the lower surface T1. The shape and the arrangement of the nozzle member can be changed in conformity therewith.

Also in this embodiment, the distance between the substrate P and the lower surface T1 of the first optical element LS1 is about 3 mm, the distance between the land surface 75 and the substrate P is about 1 mm, and the distance between the upper surface T2 of the first optical element LS1 and the lower surface T3 of the second optical element LS2 is about 3 mm. However, the distance between the substrate P and the lower surface T1 of the first optical element LS1 can be set within a range of 1 to 5 mm, considering the absorption of the exposure light beam EL by the liquid LQ1 and the flow of the liquid LQ1 in the first space K1, in the same manner as in the embodiment described above. The distance between the land surface 75 and the substrate P can be also set within a range of 0.5 to 1 mm. The distance between the upper surface T2 of the first optical element LS1 and the lower surface T3 of the second optical element LS2 can be also set within a range of 0.5 to 5 mm considering the flow of the liquid LQ2.

In this embodiment, the barrel PK is constructed by combining a plurality of divided barrels (sub-barrels). The sub-barrel, which includes the first support section 91 for supporting the first optical element LS1, can be attached and detached with respect to the partial barrel for supporting the other optical elements L2 to L7. The first optical element LS1 having the flange portion F1 is exchangeable by being detached from the partial barrel together with the sub-barrel.

Figure 13:
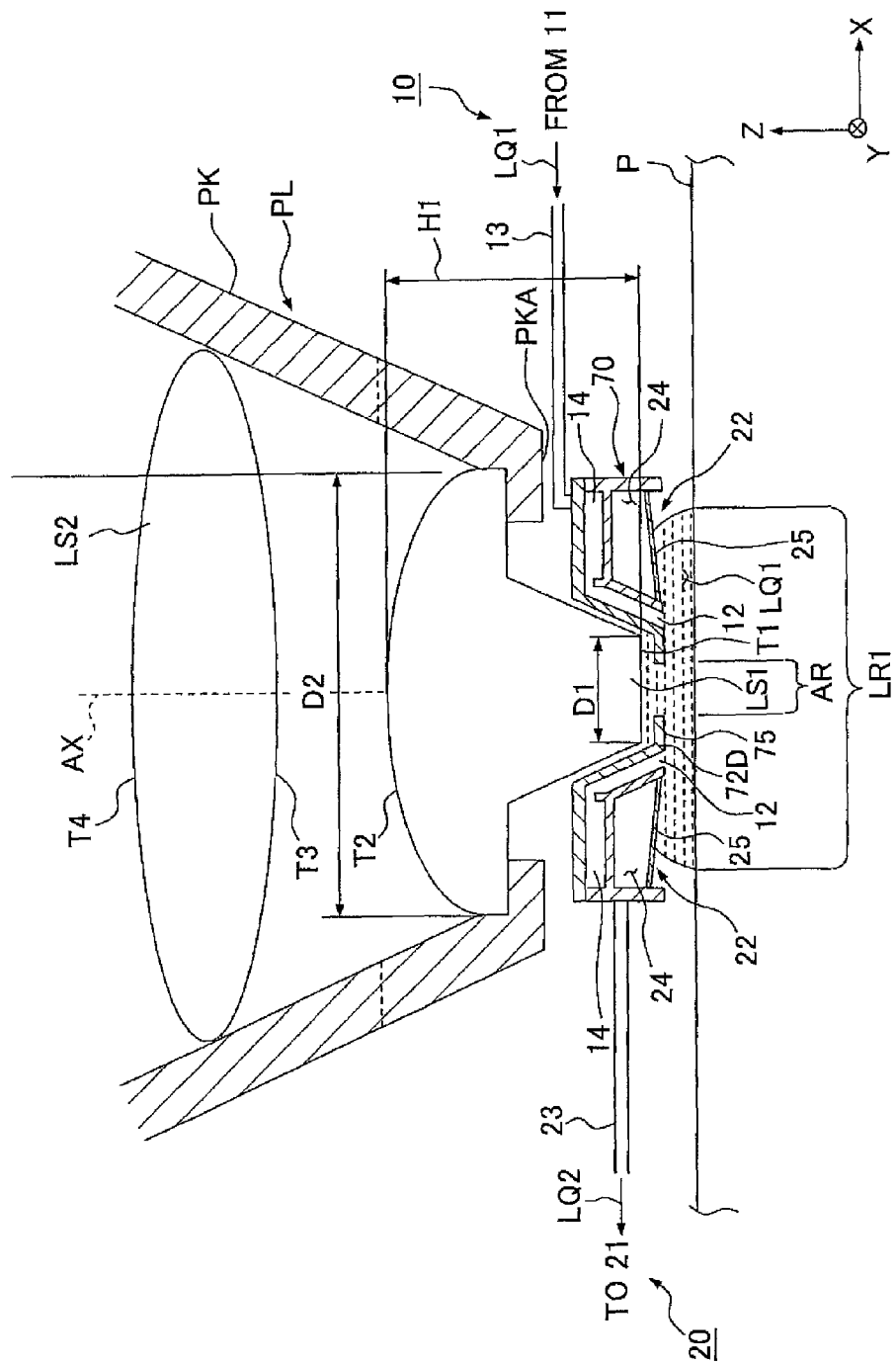
FIG. 13 shows a sectional view illustrating major parts to depict another embodiment of the present invention.

When the first optical element LS1 of the embodiment of the present invention is used, it is also allowable to adopt an arrangement in which no second liquid immersion area LR2 is formed as shown in FIG. 13. The first optical element LS1 shown in FIG. 13 is the optical element which is closest to the image plane of the projection optical system PL. The upper surface T2 of the first optical element LS1 is formed to be convex toward the object plane, which has a positive refractive index. The first liquid LQ1 of the first liquid immersion area LR1 makes contact with the first optical element LS1. In such a situation, when the first optical element LS1 satisfies at least any one of the condition in which the distance H1 between the lower surface T1 and the upper surface T2 on the optical axis AX is not less than 15 mm and the condition in which the outer diameter D2 of the upper surface T2 is not less than twice the outer diameter D1 of the lower surface T1, then it is possible to realize the compact size of the nozzle member 70, and it is possible to avoid the enormous expansion of the first liquid immersion area LR1.

In the respective embodiments described above, the second liquid immersion area LR2 of the second liquid LQ2 is locally formed on the upper surface T2 of the first optical element LS1. However, as shown in FIG. 14, an arrangement is also adoptable, in which the second liquid LQ2 of the second liquid immersion area LR2 is arranged in the substantially entire region of the upper surface T2.

Figure 14:
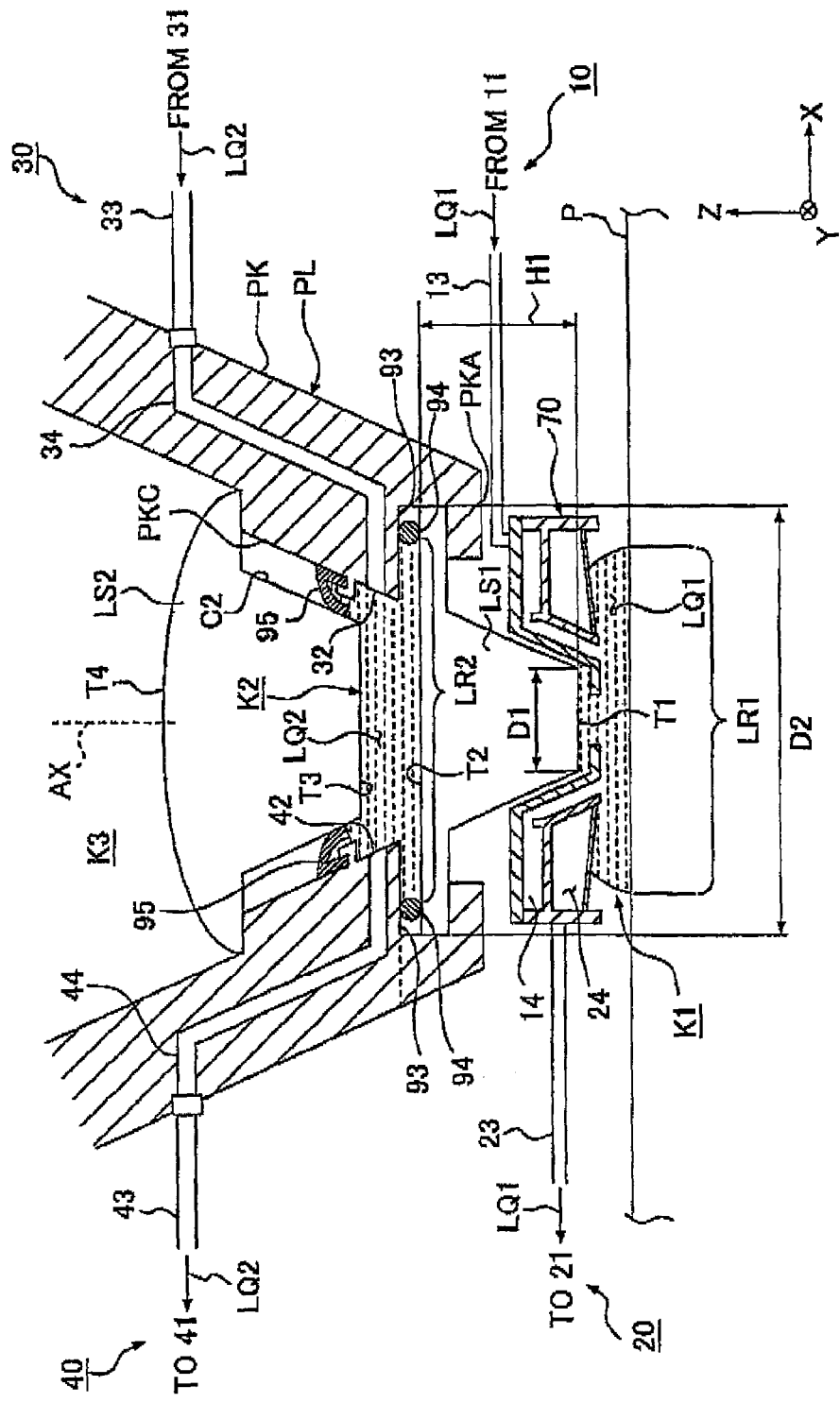
FIG. 14 shows a sectional view illustrating major parts to depict another embodiment of the present invention.

Also in the embodiment shown in FIG. 14, the first optical element LS1 satisfies at least any one of the condition in which the distance H1 between the lower surface T1 and the upper surface T2 on the optical axis AX is not less than 15 mm and the condition in which the outer diameter D2 of the upper surface T2 is not less than twice the outer diameter D1 of the lower surface T1. In the same manner as the embodiment explained, for example, with reference to FIG. 12, the first optical element LS1 is exposed (allowed to protrude) downwardly from the barrel PK, and the nozzle member 70 is arranged closely to the first optical element LS1.

A second supply port 32, which constructs a part of the second liquid supply mechanism 30, is provided on the inner side surface PKC of the barrel PK. The second supply port 32 is formed at the position in the vicinity of the second space K2 on the inner side surface PKC of the barrel PK. The second supply port 32 is provided on the +X side with respect to the optical axis AX of the projection optical system PL. The second liquid LQ2, which is fed from the second liquid supply section 31, is discharged by the second supply port 32 substantially in parallel to the upper surface T2 of the first optical element LS1, i.e., substantially in parallel to the XY plane (in the lateral direction). The force, which is exerted by the supplied second liquid LQ2, for example, on the first and second optical elements LS1, LS2, can be reduced, because the second supply port 32 discharges the second liquid LQ2 substantially in parallel to the upper surface T2 of the first optical element LS1. Therefore, it is possible to avoid the occurrence of the inconvenience which would be otherwise caused, for example, such that the first and second optical elements LS1, LS2 or the like are deformed or displaced due to the supplied second liquid LQ2.

A second recovery port 42, which constructs a part of the second liquid recovery mechanism 40, is provided at a predetermined position with respect to the second supply port 32 on the inner side surface PKC of the barrel PK. The second recovery port 42 is formed at the position in the vicinity of the second space K2 on the inner side surface PKC of the barrel PK. The second recovery port 42 is provided on the −X side with respect to the optical axis AX of the projection optical system PL. That is, the second supply port 32 and the second recovery port 42 are opposed to each other. In this embodiment, the second supply port 32 and the second recovery port 42 are formed to be slit-shaped respectively. The second supply port 32 and the second recovery port 42 may be formed to have arbitrary shapes including, for example, substantially circular, elliptical, and rectangular shapes. In this embodiment, the second supply port 32 and the second recovery port 42 mutually have approximately the same size. However, the second supply port 32 and the second recovery port 42 may have sizes different from each other.

The other end of the second supply tube 33 is connected to one end of the second supply flow passage 34 formed in the barrel PK. On the other hand, the other end of the second supply flow passage 34 of the barrel PK is connected to the second supply port 32 formed on the inner side surface PKC of the barrel PK. The second liquid LQ2, which is fed from the second liquid supply section 31 of the second liquid supply mechanism 30, flows through the second supply tube 33, and then the second liquid LQ2 flows into one end of the second supply flow passage 34 formed in the barrel PK. The second liquid LQ2, which has flown into one end of the second supply flow passage 34, is supplied to the second space K2 between the second optical element LS2 and the first optical element LS1 from the second supply port 32 formed on the inner side surface PKC of the barrel PK.

The other end of the second recovery tube 43 is connected to one end of the second recovery flow passage 44 formed in the barrel PK. On the other hand, the other end of the second recovery flow passage 44 is connected to the second recovery port 42 formed on the inner side surface PKC of the barrel PK. When the second liquid recovery section 41 of the second liquid recovery mechanism 40 is driven, the second liquid LQ2 in the second space K2 flows into the second recovery flow passage 44 via the second recovery port 42. After that, the second liquid LQ2 is sucked and recovered by the second liquid recovery section 41 via the second recovery tube 43.

The barrel PK is provided with an opposing surface 93 which is opposed to the circumferential edge area of the upper surface T2 of the first optical element LS1 supported by the first support section 91. A first seal member 94 is provided between the opposing surface 93 and the circumferential edge area of the upper surface T2. The first seal member 94 is formed of, for example, a C-ring or an O-ring (for example, "Kalrez" produced by DuPont Dow). The first seal member 94 avoids the leakage of the second liquid LQ2 arranged on the upper surface T2 to the outside of the upper surface T2, and consequently the leakage to the outside of the barrel PK. A second seal member 95 is provided between the side surface C2 of the second optical element LS2 and the inner side surface PKC of the barrel PK. The second seal member 95 is formed of, for example, a V-ring. The second seal member 95 regulates the flow of the fluid (including the gas, the second liquid LQ2, and the humid gas generated from the second liquid LQ2) between the second space K2 and a third space K3 disposed upwardly from the second optical element LS2 in the barrel PK. Accordingly, it is possible to maintain the environment (for example, the temperature and the humidity) in the internal space of the barrel PK including the third space K3. Further, it is possible to prevent the gas (bubble), from the third space K3, from entering into the second liquid LQ2 of the second liquid immersion area LR2.

The distance between the side surface C2 of the second optical element LS2 and the inner side surface PKC of the barrel PK may be narrowed, for example, to about 1 to 5 μm without providing the second seal member 95. Also in this way, it is possible to prohibit the flow of the fluid between the second space K2 and the third space K3 via the gap between the side surface C2 of the second optical element LS2 and the inner side surface PKC of the barrel PK.

When the substrate P is exposed, the control unit CONT supplies and recovers the second liquid LQ2 by using the second liquid supply mechanism 30 and the second liquid recovery mechanism 40 while optimally controlling the supply amount of the second liquid LQ2 per unit time brought about by the second liquid supply mechanism 30 and the recovery amount of the second liquid LQ2 per unit time brought about by the second liquid recovery mechanism 40. And the control unit CONT fills at least the optical path for the exposure light beam EL in the second space K2 with the second liquid LQ2. In this embodiment, the second liquid supply mechanism 30 supplies the second liquid LQ2 to the second space K2 at a flow rate of 0.1 cc/min to 100 cc/min.

In this embodiment, the supply operation and the recovery operation for the second liquid LQ2 are continuously performed by the second liquid supply mechanism 30 and the second liquid recovery mechanism 40 during the exposure of the substrate P as well. Further, the supply operation and the recovery operation for the second liquid LQ2 are continuously performed by the second liquid supply mechanism 30 and the second liquid recovery mechanism 40 before and after the exposure of the substrate P as well. When the supply and the recovery of the second liquid LQ2 are continuously performed by the second liquid supply mechanism 30 and the second liquid recovery mechanism 40, the second liquid LQ2 in the second space K2 is always exchanged with the clean and temperature-managed second liquid LQ2. The second space K2 is filled with the clean and temperature-managed second liquid LQ2. When the supply operation and the recovery operation for the second liquid LQ2 are also continued with respect to the second space K2 before and after the exposure of the substrate P, it is possible to avoid the occurrence of the inconvenience which would be otherwise caused, for example, such that any adhesion trace (so-called water mark) is formed, for example, on the upper surface T2 of the first optical element LS1 and the lower surface T3 of the second optical element LS2 resulting from the vaporization (drying) of the second liquid LQ2.

Also in the embodiment shown in FIG. 14, the supply and the recovery of the second liquid LQ2 by the second liquid immersion mechanism 2 may be performed intermittently. For example, the supply operation and/or the recovery operation for the liquid by the second liquid immersion mechanism 2 may be stopped during the exposure of the substrate P. Accordingly, any vibration, which is to be caused by the supply and/or the recovery of the second liquid LQ2, is not generated during the exposure of the substrate P. It is possible to avoid the deterioration of the exposure accuracy which would be otherwise caused by the vibration.

Next, an explanation will be made about another embodiment of the recovery method with the first liquid recovery mechanism 20 in relation to the embodiments described above. In this embodiment, only the liquid LQ is recovered from the first recovery port 22. Accordingly, the occurrence of vibration caused by the liquid recovery is suppressed.

The principle of the liquid recovery operation with the first liquid recovery mechanism 20 of this embodiment will be explained below with reference to a schematic view shown in FIG. 16. For example, a thin plate-shaped mesh member, which is formed with a large number of pores, can be used as a porous member 25 for the first recovery port 22 of the first liquid recovery mechanism 20. In this embodiment, the porous member (mesh member) is formed of titanium. In this embodiment, only the liquid LQ is recovered from the pores of the porous member 25 by controlling the pressure difference between the upper surface and the lower surface of the porous member 25 so that a predetermined condition is satisfied as described later on, in a state in which the porous member 25 is wet. The parameters concerning the predetermined condition include, for example, the pore size of the porous member 25, the contact angle (affinity) of the porous member 25 with respect to the liquid LQ, and the suction force of the first liquid recovery section 21 (pressure at the upper surface of the porous member 25).

Figure 16:
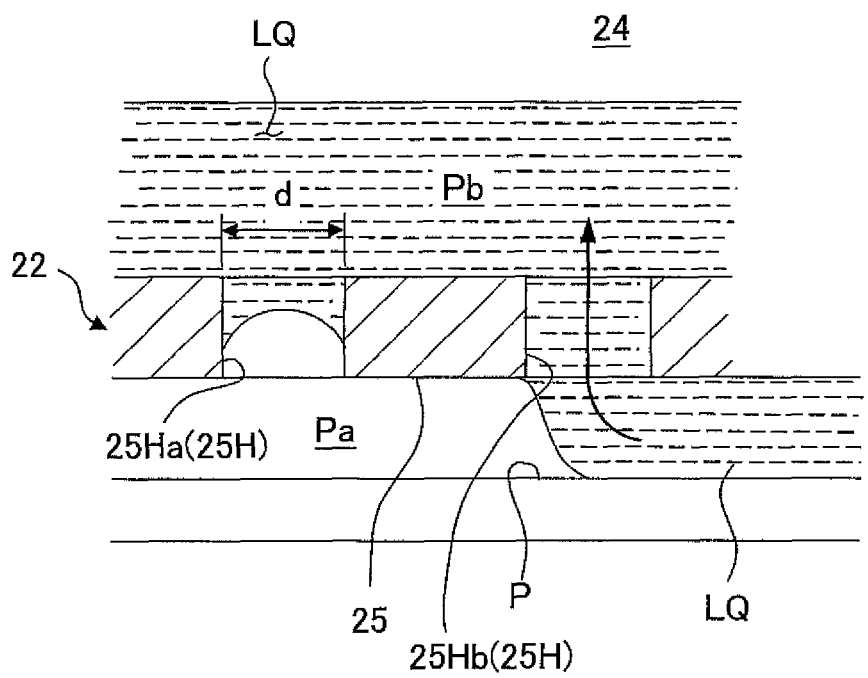
FIG. 16 illustrates the operation for recovering the liquid by a first liquid recovery mechanism in another embodiment of the present invention.

FIG. 16 shows a magnified view illustrating a partial cross section of the porous member 25, and depicts a specified example of the liquid recovery to be performed by the aid of the porous member 25. The substrate P is arranged under the porous member 25. The gas space and the liquid space are formed between the porous member 25 and the substrate P. More specifically, the gas space is formed between the substrate P and the first pore 25Ha of the porous member 25, and the liquid space is formed between the substrate P and the second pore 25Hb of the porous member 25. Such a situation arises, for example, at the end of the liquid immersion area LR1 shown in FIG. 4, or such a situation arises by the generation of the gas in the liquid immersion area LR1 due to any cause. A flow passage space, which forms a part of the first recovery flow passage 24, is formed over the porous member 25.

With reference to FIG. 16, when the following condition holds:

$$(4 \times \gamma \times \cos \theta)/d \geq (Pa - Pb) \quad (3)$$

wherein Pa represents the pressure of the space between the first pore 25Ha of the porous member 25 and the substrate P (pressure at the lower surface of the porous member 25), Pb represents the pressure of the flow passage space over the porous member 25 (pressure at the upper surface of the porous member 25), d represents the pore size (diameter) of each of the pores 25Ha, 25Hb, θ represents the contact angle of the porous member 25 (inside of the pore 25H) with respect to the liquid LQ, and γ represents the surface tension of the liquid LQ, then, as shown in FIG. 16, even when the gas space is formed on the lower side of the first pore 25Ha of the porous member 25 (on the side of the substrate P), the gas, which is disposed in the space on the lower side of the porous member 25, can be prevented from any movement to (entering into) the space disposed on the upper side of the porous member 25 via the pore 25Ha. That is, the interface between the liquid LQ and the gas is maintained in the pore 25Ha of the porous member 25 by optimizing the contact angle θ, the pore size d, the surface tension γ of the liquid LQ, and the pressures Pa, Pb to satisfy the condition represented by the expression (3). Thus, it is possible to suppress the inflow of the gas from the first pore 25Ha. On the other hand, the liquid space is formed on the lower side of the second pore 25Hb of the porous member 25 (on the side of the substrate P). Therefore, it is possible to recover only the liquid LQ via the second pore 25Hb.

In the case of the condition represented by the expression (3) described above, the hydrostatic pressure of the liquid LQ on the porous member 25 is not considered in order to simplify the explanation.

In this embodiment, the first liquid recovery mechanism 20 controls the suction force of the first liquid recovery section 21 to adjust the pressure of the flow passage space over the porous member 25 so that the expression (3) described above is satisfied, assuming that the pressure Pa of the space under the porous member 25, the diameter d of the pore 25H, the contact angle θ of the porous member 25 (inner side surface of the pore 25H) with respect to the liquid LQ, and the surface tension γ of the liquid (pure water) LQ are constant. However, with reference to the expression (3), as (Pa−Pb) is greater, i.e., as (4×γ×cos θ)/d is greater, the pressure Pb is more easily controlled to satisfy the expression (3). Therefore, it is desirable that the diameter d of the pore 25Ha, 25Hb and the contact angle θ of the porous member 25 with respect to the liquid LQ (0°<θ<90°) are made as small as possible.

In the embodiments described above, the projection optical system PL is provided with the element as the first optical element LS1 in which the outer diameter of the upper surface T2 is wider than that of the lower surface T3 of the second optical element LS2. However, in order to achieve the formation of the liquid immersion area in only the partial area of the upper surface (second surface) of the first optical element (first element) as in the first embodiment of the present invention, it is also allowable that the outer diameter of the lower surface T3 of the second optical element LS2 is wider than that of the upper surface T2 of the first optical element LS1. In this arrangement, for example, the outer edge portion of the lower surface T3 of the second optical element LS2 can be treated to be liquid-repellent, and only the central portion for forming the liquid immersion area can be treated to be liquid-attractive. Alternatively, a bank DR as shown in FIG. 10 may be provided at the outer edge portion of the lower surface T3 of the second optical element LS2.

In the embodiments shown in FIGS. 1 to 14 and FIG. 16, it is not necessarily indispensable that the supply operation and the recovery operation for the second liquid LQ2 performed by the second liquid supply mechanism 30 and the second liquid recovery mechanism 40 are the same as the supply operation and the recovery operation for the first liquid LQ1 performed by the first liquid supply mechanism 10 and the first liquid recovery mechanism 20. It is also allowable that the supply amount and the recovery amount of each of the liquids and/or the flow rate of each of the liquids is different from each other. For example, the supply amount and the recovery amount of the liquid LQ2 in the second space K2 may be smaller than the supply amount and the recovery amount of the first liquid LQ1 in the first space, and the flow rate of the liquid LQ2 in the second space K2 may be slower than the flow rate of the liquid LQ1 in the first space K1.

In the embodiment described above, the liquid (pure water), which is supplied from the first liquid supply mechanism 10 to the first space K1, is the same as the liquid (pure water) which is supplied from the second liquid supply mechanism 30 to the second space K2 (temperature is the same as well). However, even when the type of the liquid is identical, the quality (for example, the temperature, the temperature uniformity, and the temperature stability) may differ. For example, when pure water is used as in the embodiment described above, the specific resistance value, the total organic carbon (TOC) value, and the dissolved gas concentration (dissolved oxygen concentration, dissolved nitrogen concentration), the refractive index, and the transmittance may differ, for example, in addition to the temperature, the temperature uniformity, and the temperature stability.

As described above, pure water is used as the liquid LQ1, LQ2 in the embodiment of the present invention. Pure water is advantageous in that pure water is available in a large amount with ease, for example, in the semiconductor production factory, and pure water exerts no harmful influence, for example, on the optical element (lens) and the photoresist on the substrate P. Further, pure water exerts no harmful influence on the environment, and the content of impurity is extremely low. Therefore, it is also expected to obtain the function to wash (clean) the surface of the substrate P and the surface of the optical element provided at the end surface of the projection optical system PL. When the purity of pure water supplied from the factory or the like is low, the exposure apparatus may posses an ultrapure water-producing unit.

It is approved that the refractive index n of pure water (water) with respect to the exposure light beam EL having a wavelength of about 193 nm is approximately in an extent of 1.44. When the ArF excimer laser beam (wavelength: 193 nm) is used as the light source of the exposure light beam EL, then the wavelength is shortened on the substrate P by 1/n, i.e., to about 134 nm, and a high resolution is obtained. Further, the depth of focus is magnified about n times, i.e., about 1.44 times as compared with the value obtained in the air. Therefore, when it is enough to secure an approximately equivalent depth of focus as compared with the case of the use in the air, it is possible to further increase the numerical aperture of the projection optical system PL. Also in this viewpoint, the resolution is improved.

In the embodiment described above, the first and second liquid supply mechanisms 10, 30 supply pure water as the liquids LQ1, LQ2. However, mutually different types of liquids may be supplied so that the first liquid LQ1, with which the first space K1 is filled, may be of the type different from that of the second liquid LQ2 with which the second space K2 is filled. In this case, it is also allowable that the refractive index and/or the transmittance with respect to the exposure light beam EL differs between the first liquid and the second liquid. For example, the second space K2 may be filled with a predetermined liquid other than pure water, which is represented by fluorine-based oil. The oil is such a liquid that the probability of proliferation of microbes such as bacterial is low. Therefore, it is possible to maintain the cleanness of the second space K2 and the flow passage through which the second liquid LQ2 (fluorine-based oil) flows.

Both of the first and second liquids LQ1, LQ2 may be liquids other than water. For example, when the light source of the exposure light beam EL is the $F_2$ laser, the $F_2$ laser beam is not transmitted through water. Therefore, it is preferable to use a fluorine-based liquid including, for example, perfluoropolyether (PFPE) and fluorine-based oil through which the $F_2$ laser beam is transmissive, as the first and second liquid LQ1, LQ2. In this case, the portion, which makes contact with the first and second liquid LQ1, LQ2, is subjected to the liquid-attracting treatment, for example, by forming a thin film with a substance having a molecular structure with small polarity including fluorine. Alternatively, other than the above, it is also possible to use, as the first and second liquid LQ1, LQ2, liquids (for example, cedar oil) which have the transmittance with respect to the exposure light beam EL, which have the refractive index as high as possible, and which are stable against the photoresist coated on the surface of the substrate P and the projection optical system PL. Also in this case, the surface treatment is performed depending on the polarity of the first and second liquid LQ1, LQ2 to be used. It is also possible to use various types of fluids having desired refractive indexes, including, for example, supercritical fluids and gases having high refractive indexes, in place of pure water for the liquids LQ1, LQ2.

In the embodiment described above, the projection optical system PL, which includes the first optical element LS1 as the parallel flat plate having no refractive power, is adjusted to have the predetermined image formation characteristic. However, when the first optical element LS1 exerts no influence on the image formation characteristic at all, it is also allowable to make the adjustment so that the image formation characteristic of the projection optical system PL is the predetermined image formation characteristic except for the first optical element LS1.

In the embodiment described above, both of the first optical element LS1 and the second optical element LS2 are supported by the barrel PK. However, the first optical element LS1 and the second optical element LS2 may be supported by different support members respectively.

In the embodiment described above, both of the first optical element LS1 and the second optical element LS2 are supported by the barrel PK in the substantially stationary state. However, the first optical element LS1 and the second optical element LS2 may be supported finely movably in order to adjust the position and the posture of at least one of the first optical element LS1 and the second optical element LS2.

In the embodiment described above, the first optical element LS1 is the parallel flat plate having no refractive power in which the lower surface T1 and the upper surface T2 are the flat surfaces respectively, and the lower surface T1 and the upper surface T2 are in parallel to each other. However, for example, the upper surface T2 of the first optical element LS1 may have a slight curvature. That is, the first optical element LS1 may be an optical element having any lens function. In this case, it is preferable that the curvature of the upper surface T2 of the first optical element LS1 is smaller than the curvatures of the upper surface T4 and the lower surface T3 of the second optical element LS2.

In the embodiment described above, it is also allowable that the second liquid immersion mechanism 2 for performing the supply and the recovery of the second liquid LQ2 is absent. In this case, the exposure is performed without exchanging the second liquid LQ2 in the second space K2 in the state in which the space between the first optical element LS1 and the second optical element LS2 is filled with the second liquid LQ2. In such a situation, there is such a possibility that the temperature of the second liquid LQ2 in the second liquid immersion area LR2 may be varied by the radiation of the exposure light beam EL. Therefore, a temperature-adjusting unit, which adjusts the temperature of the second liquid LQ2 in the second liquid immersion area LR2, may be provided, for example, between the first optical element LS1 and the second optical element LS2 to successfully adjust the temperature of the second liquid LQ2 by using the temperature-adjusting unit. The respective embodiments described above are principally illustrative of the case in which the projection optical system PL and the substrate P are opposed to one another. However, even when the projection optical system PL is opposed to another member (for example, the upper surface 91 of the substrate stage PST), the space between the projection optical system PL and the another member can be filled with the first liquid LQ1. In this arrangement, the space on the image plane side of the projection optical system PL may be continuously filled with the first liquid LQ1 by using the another member when the substrate stage PST is separated from the projection optical system PL, for example, during the operation for exchanging the substrate.

In the case of the liquid immersion method as described above, the numerical aperture NA of the projection optical system is 0.9 to 1.3 in some cases. When the numerical aperture NA of the projection optical system is large as described above, it is desirable to use the polarized illumination, because the image formation performance is deteriorated due to the polarization effect in some cases with the random polarized light which has been hitherto used as the exposure light beam. In this case, it is appropriate that the linear polarized illumination, which is adjusted to the longitudinal direction of the line pattern of the line-and-space pattern of the mask (reticle), is effected so that the diffracted light of the S-polarized light component (TE-polarized light component), i.e., the component in the polarization direction along with the longitudinal direction of the line pattern is dominantly allowed to outgo from the pattern of the mask (reticle). When the space between the projection optical system PL and the resist coated on the surface of the substrate P is filled with the liquid, the diffracted light of the S-polarized light component (TE-polarized light component), which contributes to the improvement in the contrast, has the high transmittance on the resist surface, as compared with the case in which the space between the projection optical system PL and the resist coated on the surface of the substrate P is filled with the air (gas). Therefore, it is possible to obtain the high image formation performance even when the numerical aperture NA of the projection optical system exceeds 1.0. Further, it is more effective to appropriately combine, for example, the phase shift mask and the oblique incidence illumination method (especially the dipole illumination method) adjusted to the longitudinal direction of the line pattern as disclosed in Japanese Patent Application Laid-open No. 6-188169. In particular, the combination of the linear polarized illumination method and the dipole illumination method is effective when the direction of the cycle of the line-and-space pattern is limited to a predetermined certain direction and/or when the hole pattern is clustered in a predetermined certain direction. For example, when a phase shift mask of the half tone type having a transmittance of 6% (pattern of a half pitch of about 45 nm) is illuminated by using the linear polarized illumination method and the dipole illumination method in combination, the depth of focus (DOF) can be increased by about 150 nm as compared with a case in which the random polarized light beam is used, provided that the illumination σ, which is defined by the circumscribed circle of the two light fluxes for forming the dipole at the pupil plane of the illumination system, is 0.95, the radius of each light flux at the pupil plane is 0.125σ, and the numerical aperture of the projection optical system PL is NA=1.2.

For example, when the ArF excimer laser is used as the exposure light beam, and the substrate P is exposed with a fine line-and-space pattern (for example, line-and-space of about 25 to 50 nm) by using the projection optical system PL having a reduction magnification of about ¼, then the mask M acts as a polarizing plate due to the Wave guide effect depending on the structure of the mask M (for example, the pattern fineness and the thickness of chromium), and the diffracted light of the S-polarized light component (TE-polarized light component) outgoes from the mask M in an amount greater than that of the diffracted light of the P-polarized light component (TM-polarized light component) which lowers the contrast. In this case, it is desirable to use the linear polarized illumination as described above. However, even when the mask M is illuminated with the random polarized light, it is possible to obtain the high resolution performance even when the numerical aperture NA of the projection optical system PL is large, for example, 0.9 to 1.3.

When the substrate P is exposed with an extremely fine line-and-space pattern on the mask M, there is such a possibility that the P-polarized light component (TM-polarized light component) is greater than the S-polarized light component (TE-polarized light component) due to the Wire Grid effect. However, for example, when the ArF excimer laser is used as the exposure light beam, and the substrate P is exposed with a line-and-space pattern greater than 25 nm by using the projection optical system PL having a reduction magnification of about ¼, then the diffracted light of the S-polarized light component (TE-polarized light component) outgoes from the mask M in an amount greater than that of the diffracted light of the P-polarized light component (TM-polarized light component). Therefore, it is possible to obtain the high resolution performance even when the numerical aperture NA of the projection optical system PL is large, for example, 0.9 to 1.3.

Further, it is also effective to use the combination of the oblique incidence illumination method and the polarized illumination method in which the linear polarization is effected in the tangential (circumferential) direction of the circle having the center of the optical axis as disclosed in Japanese Patent Application Laid-open No. 6-53120, without being limited only to the linear polarized illumination (S-polarized illumination) adjusted to the longitudinal direction of the line pattern of the mask (reticle). In particular, when the pattern of the mask (reticle) includes not only the line pattern extending in one predetermined direction, but the pattern also includes the line patterns extending in a plurality of different directions in a mixed manner (line-and-space patterns having different directions of the cycle are present in a mixed manner), then it is possible to obtain the high image formation performance even when the numerical aperture NA of the projection optical system is large, by using, in combination, the zonal illumination method and the polarized illumination method in which the light is linearly polarized in the tangential direction of the circle having the center of the optical axis, as disclosed in Japanese Patent Application Laid-open No. 6-53120 as well. For example, when a phase shift mask of the half tone type having a transmittance of 6% (pattern of a half pitch of about 63 nm) is illuminated by using, in combination, the zonal illumination method (zonal ratio: 3/4) and the polarized illumination method in which the light is linearly polarized in the tangential direction of the circle having the center of the optical axis, the depth of focus (DOF) can be increased by about 250 nm as compared with a case in which the random polarized light beam is used, provided that the illumination σ is 0.95, and the numerical aperture of the projection optical system PL is NA=1.00. In the case of a pattern having a half pitch of about 55 nm with a numerical aperture NA=1.2 of the projection optical system, the depth of focus can be increased by about 100 nm.

The substrate P, which is usable in the respective embodiments described above, is not limited to the semiconductor wafer for producing the semiconductor device. Substrates applicable include, for example, the glass substrate for the display device, the ceramic wafer for the thin film magnetic head, and the master plate (synthetic silica glass, silicon wafer) for the mask or the reticle to be used for the exposure apparatus. In the embodiments described above, the light-transmissive type mask (reticle), in which the predetermined shielding pattern (or the phase pattern or the dimming pattern) is formed on the light-transmissive substrate, is used. However, in place of the reticle, it is also allowable to use an electronic mask for forming a transmissive pattern, a reflective pattern, or a light emission pattern on the basis of the electronic data of the pattern to be subjected to the exposure, as disclosed, for example, in U.S. Pat. No. 6,778,257. The present invention is also applicable to an exposure apparatus (lithography system) in which a line-and-space pattern is formed on a wafer W by forming interference fringes on the wafer W, as disclosed in the pamphlet of International Publication No. 2001/035168.

As for the exposure apparatus EX, the present invention is also applicable to the scanning type exposure apparatus (scanning stepper) based on the step-and-scan system for performing the scanning exposure for the pattern of the mask M by synchronously moving the mask M and the substrate P as well as the projection exposure apparatus (stepper) based on the step-and-repeat system for performing the full field exposure with the pattern of the mask M in a state in which the mask M and the substrate P are allowed to stand still, while successively step-moving the substrate P.

As for the exposure apparatus EX, the present invention is also applicable to the exposure apparatus of the system in which the substrate P is subjected to the full field exposure by using a projection optical system (for example, a dioptric type projection optical system including no catoptric element with a reduction magnification of ⅛) with a reduction image of a first pattern in a state in which the first pattern and the substrate P are allowed to substantially stand still. In this case, the present invention is also applicable to the full field exposure apparatus based on the stitch system in which, subsequent to the exposure operation for the first pattern as described above, the substrate P is subjected to the full field exposure while partially overlaying a reduction image of a second pattern on the first pattern by using the projection optical system in a state in which the second pattern and the substrate P are allowed to substantially stand still thereafter. As for the exposure apparatus based on the stitch system, the present invention is also applicable to the exposure apparatus based on the step-and-stitch system in which at least two patterns are partially overlaid and transferred on the substrate P, and the substrate P is successively moved. The present invention is also applicable to an exposure apparatus provided with a measuring stage which includes members and sensors for the measurement separately from the stage which holds the substrate P. The exposure apparatus provided with the measuring stage is described, for example, in European Patent Publication No. 1,041,357, contents of which are incorporated herein by reference within a range of permission of the domestic laws and ordinances of the state designated or selected in this international application.

The present invention is also applicable to the twin-stage type exposure apparatus. The structure and the exposure operation of the twin-stage type exposure apparatus are disclosed, for example, in Japanese Patent Application Laid-open Nos. 10-163099 and 10-214783 (corresponding to U.S. Pat. Nos. 6,341,007, 6,400,441, 6,549,269, and 6,590,634), Published Japanese Translation of PCT International Publication for Patent Application No. 2000-505958 (corresponding to U.S. Pat. No. 5,969,441), and U.S. Pat. No. 6,208,407, contents of which are incorporated herein by reference within a range of permission of the domestic laws and ordinances of the state designated or selected in this international application.

In the embodiment described above, the exposure apparatus, in which the space between the projection optical system PL and the substrate P is locally filled with the liquid, is adopted. However, the present invention is also applicable to the liquid immersion exposure apparatus in which the entire surface of the substrate as the exposure objective is covered with the liquid. The structure and the exposure operation of the liquid immersion exposure apparatus in which the entire surface of the substrate as the exposure objective is covered with the liquid are described in detail, for example, in Japanese Patent Application Laid-open Nos. 6-124873 and 10-303114 and U.S. Pat. No. 5,825,043, contents of which are incorporated herein by reference within a range of permission of the domestic laws and ordinances of the state designated or selected in this international application.

As for the type of the exposure apparatus EX, the present invention is not limited to the exposure apparatus for the semiconductor device production for exposing the substrate P with the semiconductor device pattern. The present invention is also widely applicable, for example, to the exposure apparatus for producing the liquid crystal display device or for producing the display as well as the exposure apparatus for producing, for example, the thin film magnetic head, the image pickup device (CCD), the reticle, or the mask.

When the linear motor is used for the substrate stage PST and/or the mask stage MST, it is allowable to use any one of those of the air floating type based on the use of the air bearing and those of the magnetic floating type based on the use of the Lorentz's force or the reactance force. Each of the stages PST, MST may be either of the type in which the movement is effected along the guide or of the guideless type in which no guide is provided. An example of the use of the linear motor for the stage is disclosed in U.S. Pat. Nos. 5,623,853 and 5,528,118, contents of which are incorporated herein by reference respectively within a range of permission of the domestic laws and ordinances of the state designated or selected in this international application.

As for the driving mechanism for each of the stages PST, MST, it is also allowable to use a plane motor in which a magnet unit provided with two-dimensionally arranged magnets and an armature unit provided with two-dimensionally arranged coils are opposed to one another, and each of the stages PST, MST is driven by the electromagnetic force. In this arrangement, any one of the magnet unit and the armature unit is connected to the stage PST, MST, and the other of the magnet unit and the armature unit is provided on the side of the movable surface of the stage PST, MST.

The reaction force, which is generated in accordance with the movement of the substrate stage PST, may be mechanically released to the floor (ground) by using a frame member so that the reaction force is not transmitted to the projection optical system PL. The method for handling the reaction force is disclosed in detail, for example, in U.S. Pat. No. 5,528,118 (Japanese Patent Application Laid-open No. 8-166475), contents of which are incorporated herein by reference within a range of permission of the domestic laws and ordinances of the state designated or selected in this international application.

The reaction force, which is generated in accordance with the movement of the mask stage MST, may be mechanically released to the floor (ground) by using a frame member so that the reaction force is not transmitted to the projection optical system PL. The method for handling the reaction force is disclosed in detail, for example, in U.S. Pat. No. 5,874,820 (Japanese Patent Application Laid-open No. 8-330224), contents of which are incorporated herein by reference within a range of permission of the domestic laws and ordinances of the state designated or selected in this international application.

As described above, the exposure apparatus EX according to the embodiment of the present invention is produced by assembling the various subsystems including the respective constitutive elements as defined in claims so that the predetermined mechanical accuracy, the electric accuracy, and the optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which, for example, the temperature and the cleanness are managed.

Figure 15:
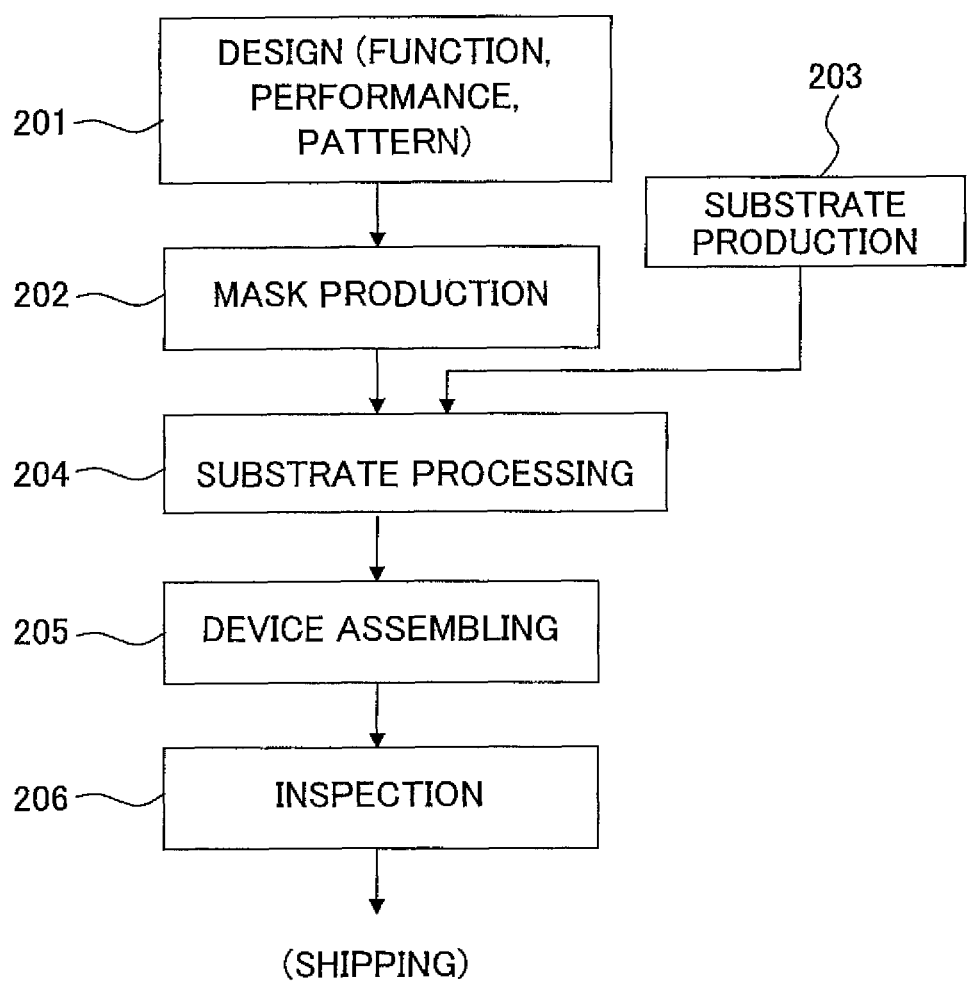
FIG. 15 shows a flow chart illustrating exemplary steps of producing a semiconductor device.

As shown in FIG. 15, the microdevice such as the semiconductor device is produced by performing, for example, a step 201 of designing the function and the performance of the microdevice, a step 202 of manufacturing a mask (reticle) based on the designing step, a step 203 of producing a substrate as a base material for the device, an exposure process step 204 of exposing the substrate with a pattern of the mask by using the exposure apparatus EX of the embodiment described above, a step 205 of assembling the device (including a dicing step, a bonding step, and a packaging step), and an inspection step 206.

INDUSTRIAL APPLICABILITY

According to the present invention, it is possible to avoid the deterioration of the exposure accuracy and the measurement accuracy which would be otherwise caused by the pollution of the element (optical element). Therefore, the exposure process and the measurement process can be performed accurately. Further, according to the present invention, it is possible to realize the compact size of the apparatus itself, because the liquid immersion area can be made small.

The invention claimed is:

1. A liquid immersion exposure apparatus comprising:
a nozzle member having a recovery port and an opening via which an exposure beam passes;
a projection system having a first optical element closest to an image surface and a second optical element which is second closest to the image surface, the first optical element having (i) a first surface facing the image surface, (ii) a second surface facing a lower surface of the second optical element, (iii) an inclined outer surface extending upwardly and radially outwardly from the first surface and facing an inner surface of the nozzle member, and (iv) a flange portion provided above the inclined outer surface, the flange portion being made of an optical material of the first optical element, and a distance between the first surface and the second surface on an optical axis of the first optical element being not less than 15 mm;
a support member by which the flange portion of the first optical element is supported; and
a substrate stage which has a holder for holding a substrate to be exposed and which moves the substrate below and relative to the nozzle member and the projection system,
wherein the substrate held on the holder is exposed by projecting the exposure beam onto the substrate via the opening of the nozzle member through an immersion liquid between the first surface of the first optical element and the substrate.

2. The apparatus according to claim 1, wherein the optical material is calcium fluorite or silica glass.

3. The apparatus according to claim 1, wherein the second optical element is a plano-convex lens having a convex upper surface.

4. The apparatus according to claim 3, wherein the flange portion has a lower surface facing downwardly, and the lower surface of the flange portion is parallel to the first surface.

5. The apparatus according to claim 3, wherein the flange portion has a lower surface facing downwardly, and the support member supports the first optical element with the lower surface of the flange portion.

6. The apparatus according to claim 3, wherein the flange portion has a lower surface facing downwardly, and the lower surface of the flange portion and an upper surface of the nozzle member are opposite to each other.

7. The apparatus according to claim 3, wherein the support member has a lower surface facing downwardly, and the lower surface of the support member and an upper surface of the nozzle member are opposite to each other.

8. The apparatus according to claim 1, wherein the distance between the first surface and the second surface on the optical axis is larger than a distance between the first surface and the image surface on the optical axis.

9. The apparatus according to claim 1, wherein:
each of a plurality of areas of the substrate is exposed while moving the substrate in a scanning direction perpendicular to the optical axis,
the flange portion has a first outer edge on one side of the optical axis and a second outer edge on the other side of the optical axis,
the first outer edge and the second outer edge are away from each other in a direction parallel to the scanning direction, and
a distance between the first outer edge and the second outer edge in the direction perpendicular to the scanning direction is larger than a size of the first surface in a direction parallel to the scanning direction.

10. The apparatus according to claim 9, wherein the distance between the first outer edge and the second outer edge in the direction perpendicular to the scanning direction is not less than twice the size of the first surface in the direction parallel to the scanning direction.

11. The apparatus according to claim 1, wherein the second optical element is supported by the support member.

12. The apparatus according to claim 11, wherein the second optical member has a flange portion which is supported by the support member.

13. The apparatus according to claim 1, wherein:
the recovery port recovers the liquid on an upper surface of the substrate facing the recovery port;
the recovery port surrounds the opening through which the exposure beam passes;
the nozzle member has a supply port between the opening and the recovery port; and
the supply port surrounds the opening.

14. The apparatus according to claim 1, wherein the nozzle member has a liquid repellent surface opposite to the first optical element.

15. A device manufacturing method comprising:
exposing a substrate using the exposure apparatus according to claim 1, and
processing the exposed substrate.

16. A liquid immersion exposure method in which a substrate is exposed by an exposure beam through an immersion liquid between the substrate and a nozzle member having a recovery port and an opening via which the exposure beam passes, the method comprising:
projecting the exposure beam through a projection system having a first optical element closest to an image surface and a second optical element which is second closest to the image surface, the first optical element having (i) a first surface facing the image surface, (ii) a second surface facing a lower surface of the second optical element, (iii) an inclined outer surface extending upwardly and radially outwardly from the first surface and facing an inner surface of the nozzle member, and (iv) a flange portion provided above the inclined outer surface, the flange portion being made of an optical material of the first optical element, and a distance between the first surface and the second surface on an optical axis of the first optical element being not less than 15 mm;
supporting the flange portion of the first optical element by a support member; and
holding the substrate to be exposed by a holder of a substrate stage which moves the substrate below and relative to the nozzle member and the projection system,
wherein the substrate held on the holder is exposed by projecting the exposure beam onto the substrate via the opening of the nozzle member through the immersion liquid between the first surface of the first optical element and the substrate.

17. The method according to claim 16, wherein the optical material is calcium fluorite or silica glass.

18. The method according to claim 16, wherein the second optical element is a plano-convex lens having a convex upper surface.

19. The method according to claim 18, wherein the flange portion has a lower surface facing downwardly, and the lower surface of the flange portion is parallel to the first surface.

20. The method according to claim 18, wherein the flange portion has a lower surface facing downwardly, and the support member supports the first optical element with the lower surface of the flange portion.

21. The method according to claim 18, wherein the flange portion has a lower surface facing downwardly, and the lower surface of the flange portion and an upper surface of the nozzle member are opposite to each other.

22. The method according to claim 18, wherein the support member has a lower surface facing downwardly, and the lower surface of the support member and an upper surface of the nozzle member are opposite to each other.

23. The method according to claim 16, wherein the distance between the first surface and the second surface on the optical axis is larger than a distance between the first surface and the image surface on the optical axis.

24. The method according to claim 16, wherein:
each of a plurality of areas of the substrate is exposed while moving the substrate in a scanning direction perpendicular to the optical axis,
the flange portion has a first outer edge on one side of the optical axis and a second outer edge on the other side of the optical axis,
the first outer edge and the second outer edge are away from each other in a direction parallel to the scanning direction, and
a distance between the first outer edge and the second outer edge in the direction perpendicular to the scanning direction is larger than a size of the first surface in a direction parallel to the scanning direction.

25. The method according to claim 24, wherein the distance between the first outer edge and the second outer edge in the direction perpendicular to the scanning direction is not less than twice the size of the first surface in the direction parallel to the scanning direction.

26. The method according to claim 16, wherein the second optical element is supported by the support member.

27. The method according to claim 26, wherein the second optical member has a flange portion which is supported by the support member.

28. The method according to claim 16, wherein:
the recovery port recovers the liquid on an upper surface of the substrate facing the recovery port;
the recovery port surrounds the opening through which the exposure beam passes;
the nozzle member has a supply port between the opening and the recovery port; and
the supply port surrounds the opening.

29. The method according to claim 16, wherein the nozzle member has a liquid repellent surface opposite to the first optical element.

* * * * *